(12) United States Patent
Chou et al.

(10) Patent No.: US 8,294,189 B2
(45) Date of Patent: Oct. 23, 2012

(54) MEMORY DEVICE AND FABRICATION METHOD THEREOF

(75) Inventors: Hou-Hong Chou, Taoyuan County (TW); Chien-Sung Chu, Taoyuan County (TW)

(73) Assignee: Inotera Memories, Inc., Taoyuan (TW)

( * ) Notice: Subject to any disclaimer, the term of this patent is extended or adjusted under 35 U.S.C. 154(b) by 567 days.

(21) Appl. No.: 12/429,979

(22) Filed: Apr. 24, 2009

(65) Prior Publication Data

US 2010/0117132 A1 May 13, 2010

(30) Foreign Application Priority Data

Nov. 13, 2008 (TW) .............................. 97143827 A

(51) Int. Cl.
*H01L 27/02* (2006.01)
(52) U.S. Cl. .......... 257/301; 257/302; 257/71; 257/296; 257/E27.092; 257/E27.095; 257/E21.65

(58) Field of Classification Search .................. None
See application file for complete search history.

(56) References Cited

U.S. PATENT DOCUMENTS

| | | | | |
|---|---|---|---|---|
| 5,827,765 A | * | 10/1998 | Stengl et al. ................... | 438/243 |
| 6,426,251 B2 | * | 7/2002 | Bronner et al. ................. | 438/242 |
| 2001/0023956 A1 | * | 9/2001 | Collins et al. .................. | 257/301 |
| 2005/0056873 A1 | * | 3/2005 | Sommer et al. ................ | 257/296 |
| 2009/0242954 A1 | * | 10/2009 | Chou ............................. | 257/301 |

* cited by examiner

*Primary Examiner* — Fei Fei Yeung Lopez

(57) ABSTRACT

A memory device is disclosed, comprising a substrate, and a capacitor with a specific shape along an orientation parallel to a surface of the substrate, wherein the specific shape includes a curved outer edge, a curved inner edge having a positive curvature, a first line and a second line connecting the curved outer edge with the curved inner edge. A word line is coupled to the capacitor. In an embodiment of the invention, the capacitor is a deep trench capacitor with a vertical transistor. In another embodiment of the invention, the capacitor is a stacked capacitor.

20 Claims, 65 Drawing Sheets

MEMORY DEVICE AND FABRICATION METHOD THEREOF

CROSS REFERENCE TO RELATED APPLICATIONS

This Application claims priority of Taiwan Patent Application No. 097143827, filed on Nov. 13, 2008, the entirety of which is incorporated by reference herein.

BACKGROUND OF THE INVENTION

1. Field of the Invention

The invention relates to a semiconductor device and fabrication method thereof, and more particularly relates to a memory device and fabrication method thereof.

2. Description of the Related Art

Integrated circuits, including dynamic random access memory (DRAM), are continuously being developed toward higher speeds and miniaturization. Additionally, it is important for memory devices to increase capacity.

FIG. 1 shows a plan view of a conventional deep trench dynamic random access memory. A plurality of oval-shaped deep trench capacitors 102, also referred to as memory elements, are crossly arranged and controlled by word lines 106 extending in a vertical direction and bit lines extending in a horizontal direction. It is noted that this figure does not show the bit lines, but shows the active areas 104 under the bit lines. Because DRAM 100 integrity and density is required to be as high as possible, the memory units and transistors are required to be as small as possible with increased speed. However, the electrode plates of the memory units have insufficient areas to store electric charges in future technology. Specifically, as memory units shrink, fabrication of the oval-shaped deep trench capacitors 102 encounter challenges during the etching process, wherein the edge length surface areas of the oval-shaped deep trench capacitors 102 are not sufficient.

BRIEF SUMMARY OF INVENTION

According to the issues described, the invention provides a memory device, comprising a substrate, a capacitor having a specific pattern at a cross section parallel to a surface of the substrate, wherein the specific pattern includes a curved outer edge, a curved inner edge having a positive curvature, and a first line and a second line connecting the curved outer edge with the curved inner edge, and a word line coupling the capacitor. In an embodiment of the invention, the capacitor is a deep trench capacitor with a vertical transistor. In another embodiment of the invention, the capacitor is a stacked capacitor.

The invention further provides a method for forming a memory device, comprising the steps as follows. A substrate is provided. A capacitor is formed in the substrate or over the substrate, wherein the capacitor has a specific pattern at a cross section parallel to a surface of the substrate, which includes a curved outer edge, a curved inner edge having a positive curvature, and a first line and a second line connecting the curved outer edge with the curved inner edge. A word line is formed over the substrate. In an embodiment of the invention, the capacitor is a deep trench capacitor with a vertical transistor. In another embodiment of the invention, the capacitor is a stacked capacitor.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
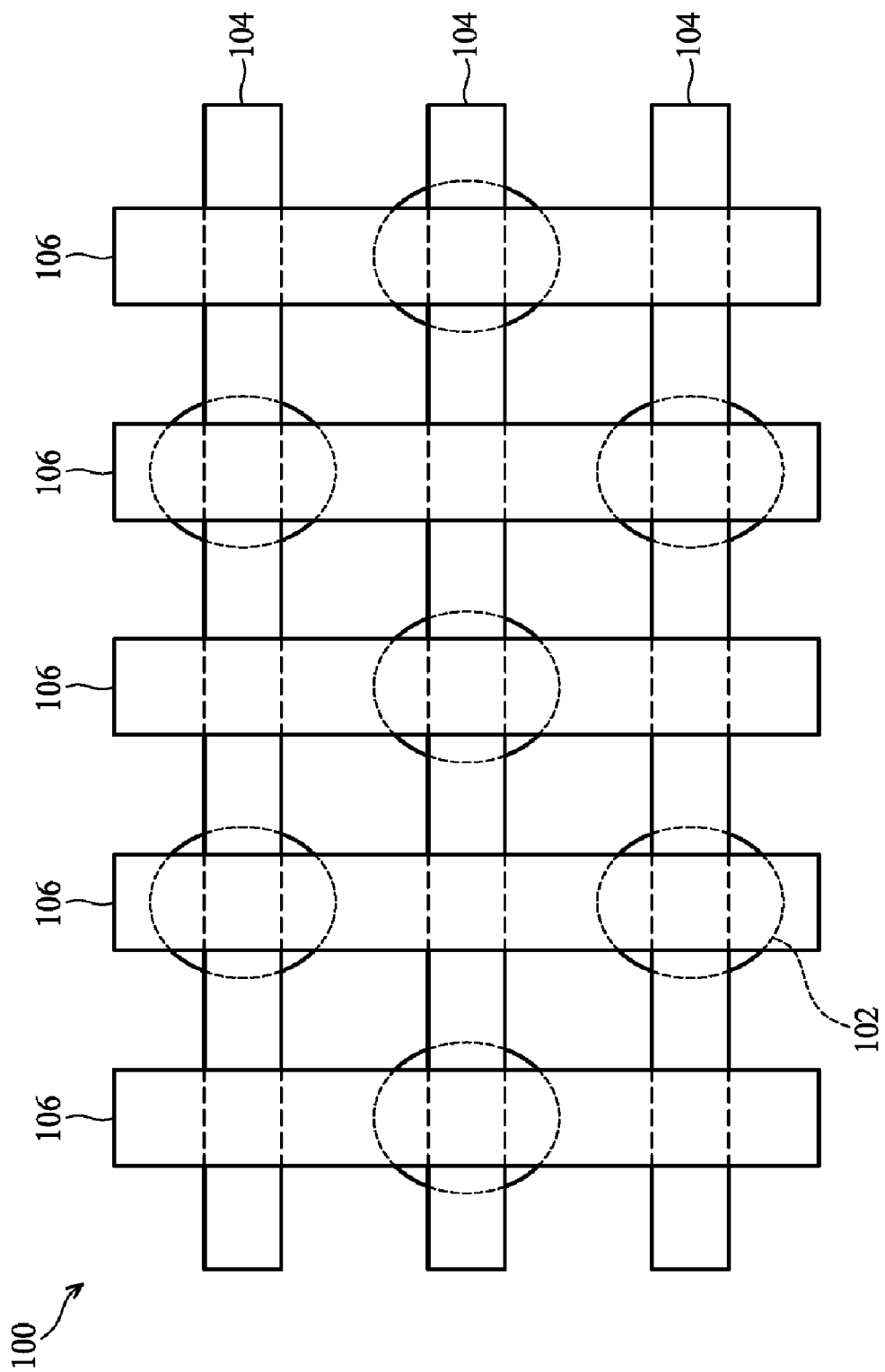
FIG. 1 shows a plan view of a conventional deep trench dynamic random access memory.
Figure 2:
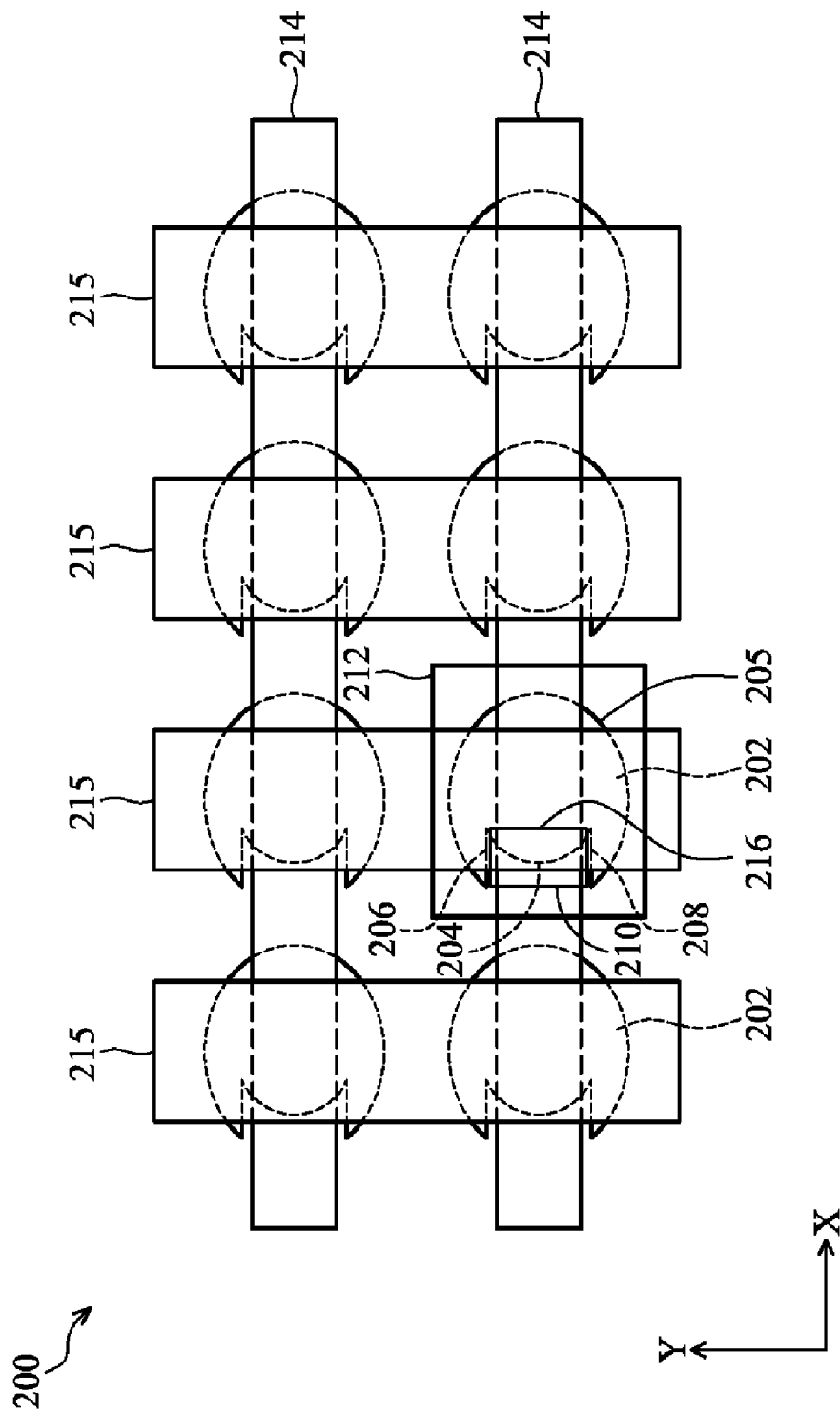
FIG. 2 shows the layout of a memory of an embodiment of the invention.

The memory device of the embodiment is illustrated in accordance with FIG. 2, which shows a plan view of a memory device 200 of an embodiment of the invention. The primary purpose of the embodiment is to form a deep trench capacitor 202 having a specific pattern along the direction parallel to the substrate surface, wherein the specific pattern includes a curved outer edge 205, a curved inner edge 204 having a positive curvature, and a first line 206 and a second line 208 connecting the curved outer edge 205 and the curved inner edge 204. Note that not only does the curved outer edge 205 of the deep trench capacitor 202 of the embodiment provide surface area which can be used for capacitance, but the curved inner edge 204, the first line 206 and the second line 208 of the of the deep trench capacitor 202 also provide surface area which can be used for capacitance. Hence, the deep trench capacitor 202 of the embodiment of the invention has surface area greater than that of conventional oval-shaped or round-shape deep trench capacitors to have an extra area of two straight lines (the first line 206 and the second line 208) multiplied by the depth of the deep trench capacitor.

Referring to FIG. 2, which shows the layout of a memory of an embodiment of the invention, a plurality of deep trench capacitors 202 are disposed in a substrate. A plurality of active areas 214 extend in direction X, and a plurality of word lines 215, also referred to as gate lines, extend in direction Y to intersect the active areas 214, wherein the active areas 214 pass central portions of the positive-curved inner edges 204 of the deep trench capacitors 202. It is noted that the active word line areas 210 are formed under the word lines 215 and in the deep trench capacitors 202 in the embodiment. The lengths of the overlay areas of the vertical gate regions 216 and the silicon substrate of the active areas 214 are the widths of active word line areas 210 of the unit cells formed in subsequent steps. The lengths of the gate oxide layers (not shown) in the vertical gate regions 216 are the lengths of active word line areas 210 of the unit cells.

Although the embodiment in FIG. 2 shows that the widths of the active areas 214 are less than the distances between the first lines 206 and the second lines 208 of the deep trench capacitors 202, the invention is not limited thereto. The widths of the active areas 214 can be greater than the distances between the first lines 206 and the second lines 208 of the deep trench capacitors 202 in other embodiments of the invention. Moreover, as shown in FIG. 2, the embodiment arranges unit cells 212 to have a square profile, and the square-shaped unit cells 212 can increase device integrity.

Figure 3A:
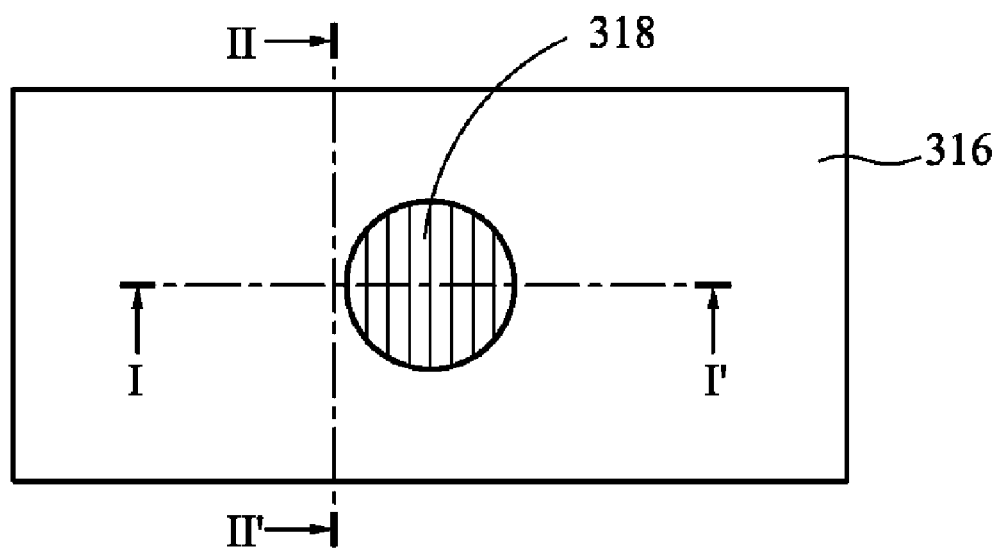
FIG. 3A~FIG. 21C show a method for forming a deep trench memory device of an embodiment of the invention.
Figure 3B:
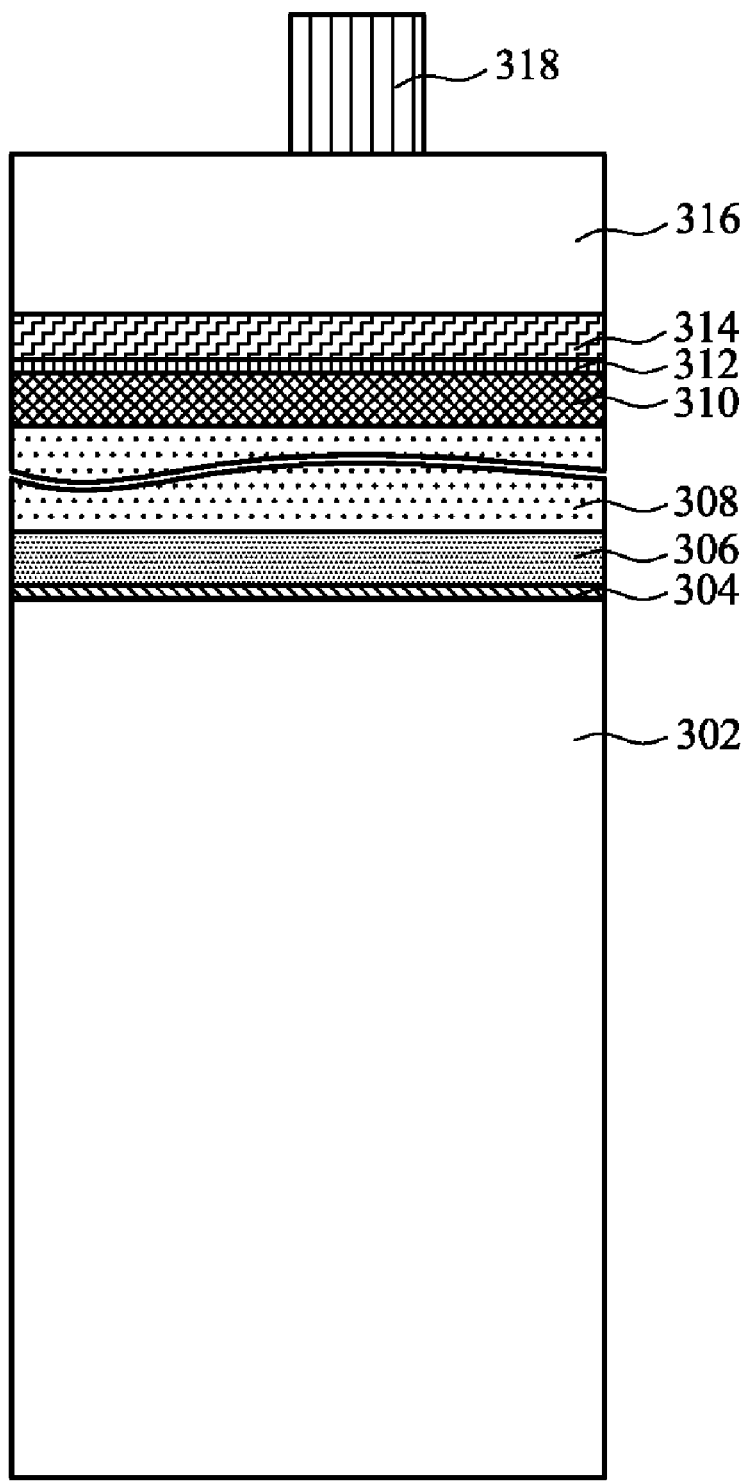
Figure 3C:
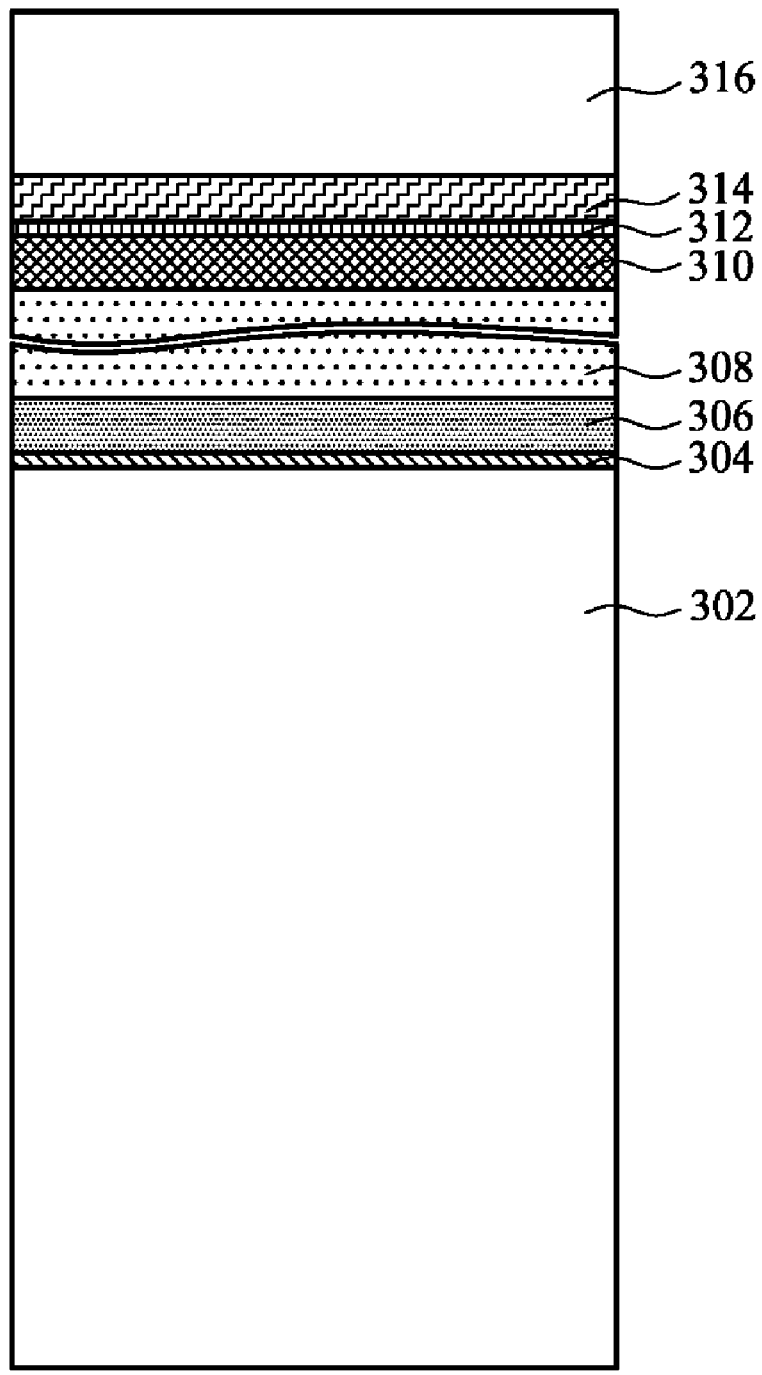

A method for forming a deep trench memory device of an embodiment of the invention is illustrated in accordance with FIG. 3A~FIG. 21C. First, referring to FIG. 3A, FIG. 3B and FIG. 3C, wherein FIG. 3A shows the local plan view of the intermediate process step for forming the deep trench memory device of the embodiment, FIG. 3B shows a cross section along line I-I' of FIG. 3A and FIG. 3C shows a cross section along line II-II' of FIG. 3A, a substrate 302 is provided and a pad oxide layer 304, a pad nitride layer 306, a oxide layer 308, a polysilicon hard mask layer 310, a nitride hard mask layer 312, a carbon hard mask layer 314 and a first sacrificial layer 316 are sequentially formed on the substrate 302. In the embodiment, the substrate 302 can be a silicon substrate, the oxide layer 308 can be $SiO_2$, BSG, PSG or BPSG, and the first sacrificial layer 316 can be silicon nitride. Next, a resist material is coated on the first sacrificial layer 316 and then patterned by lithography to form a resist pattern 318.

Figure 4A:
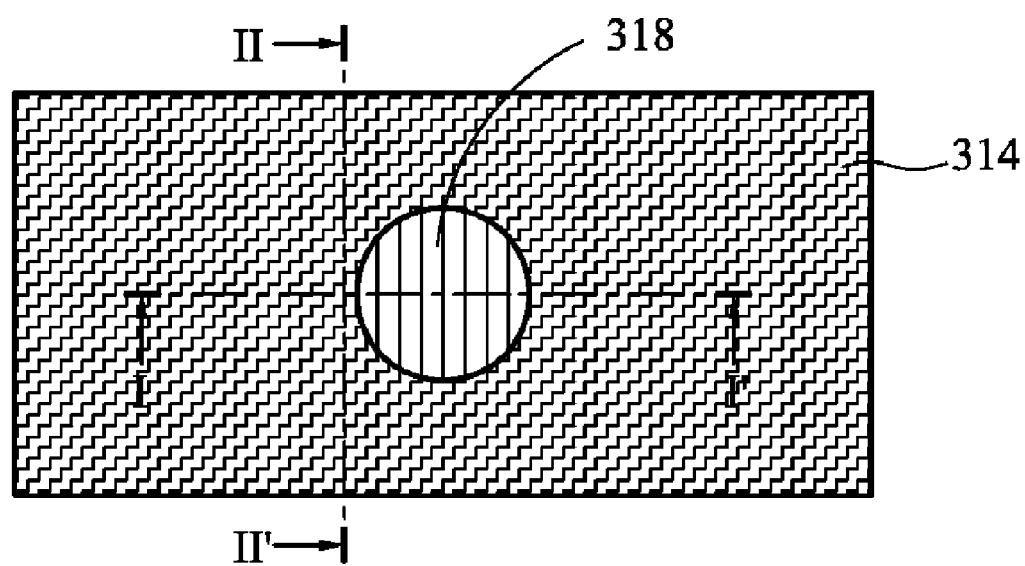
Figure 4B:
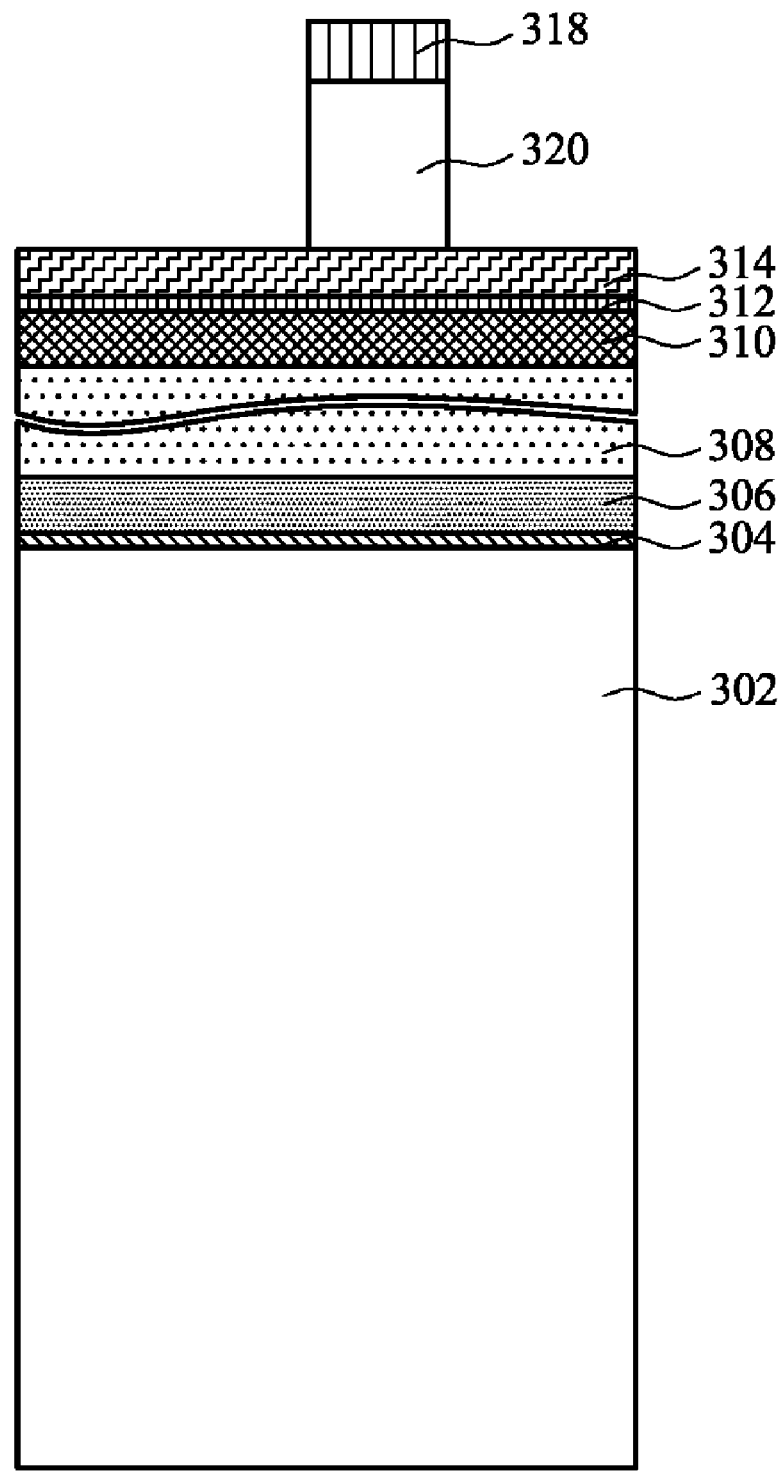
Figure 4C:
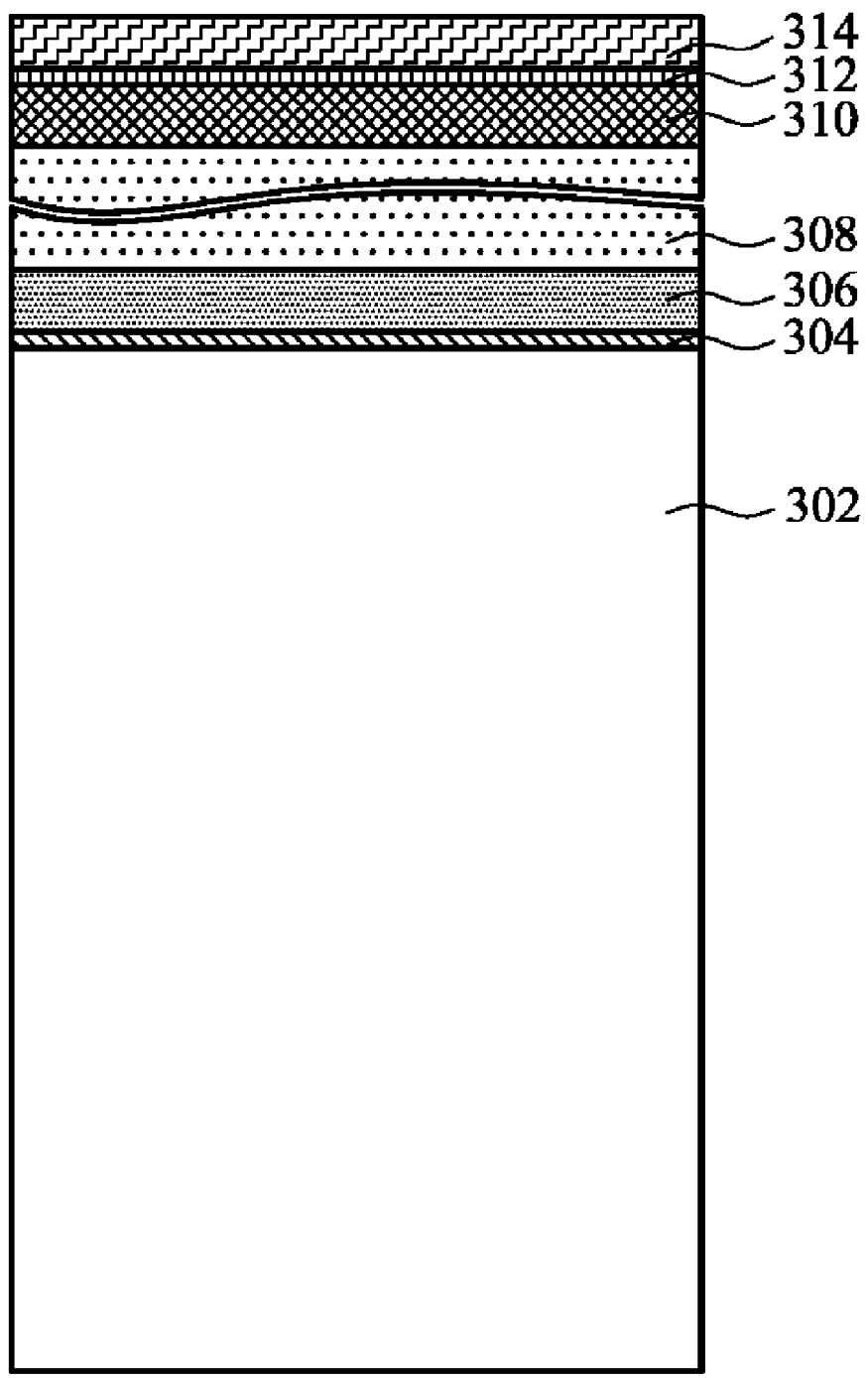
Figure 5A:
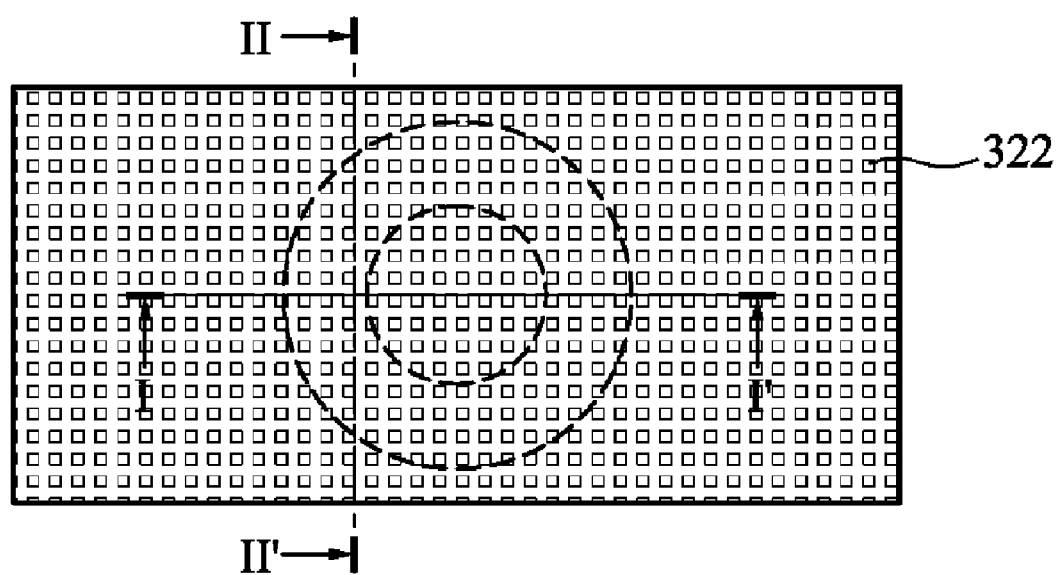
Figure 5B:
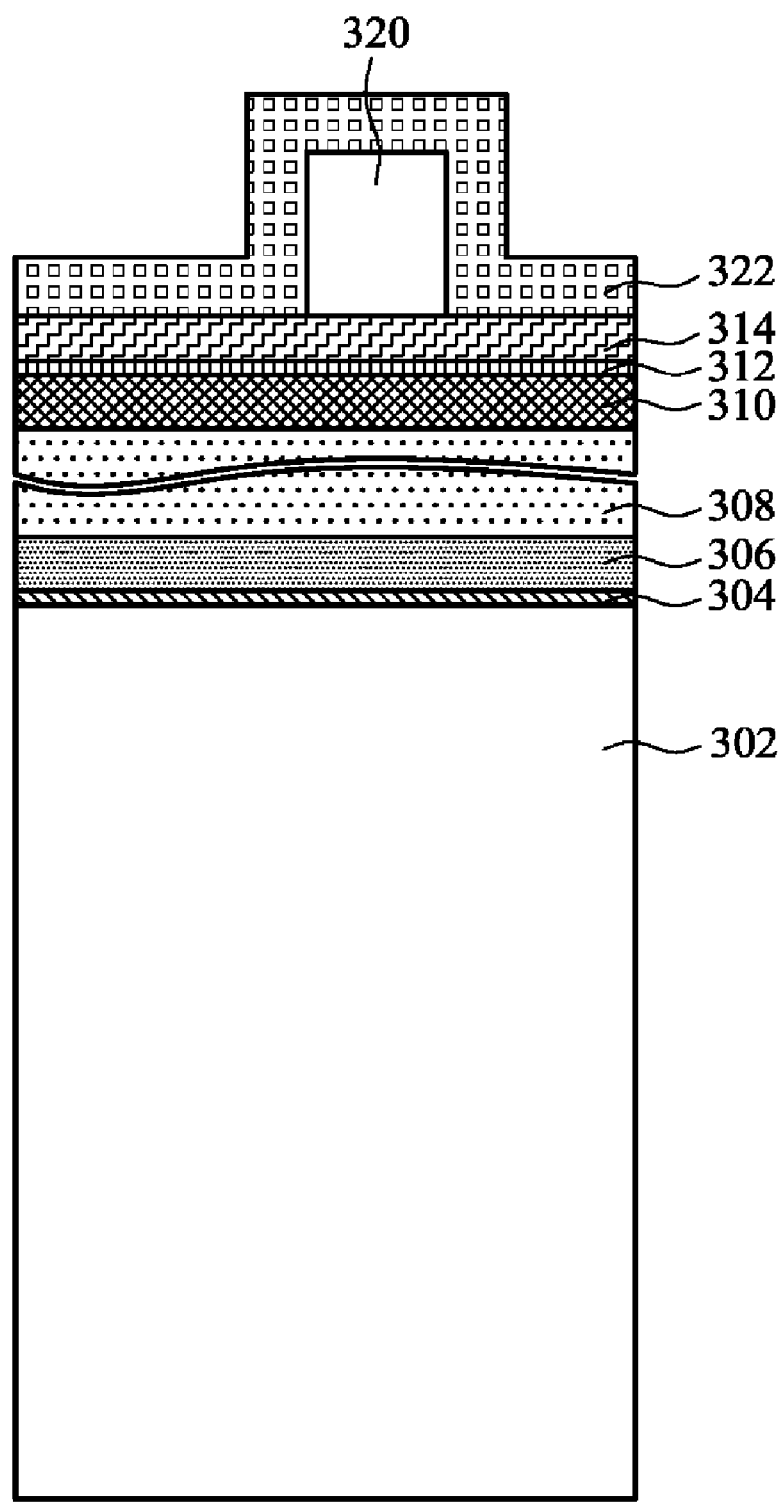
Figure 5C:
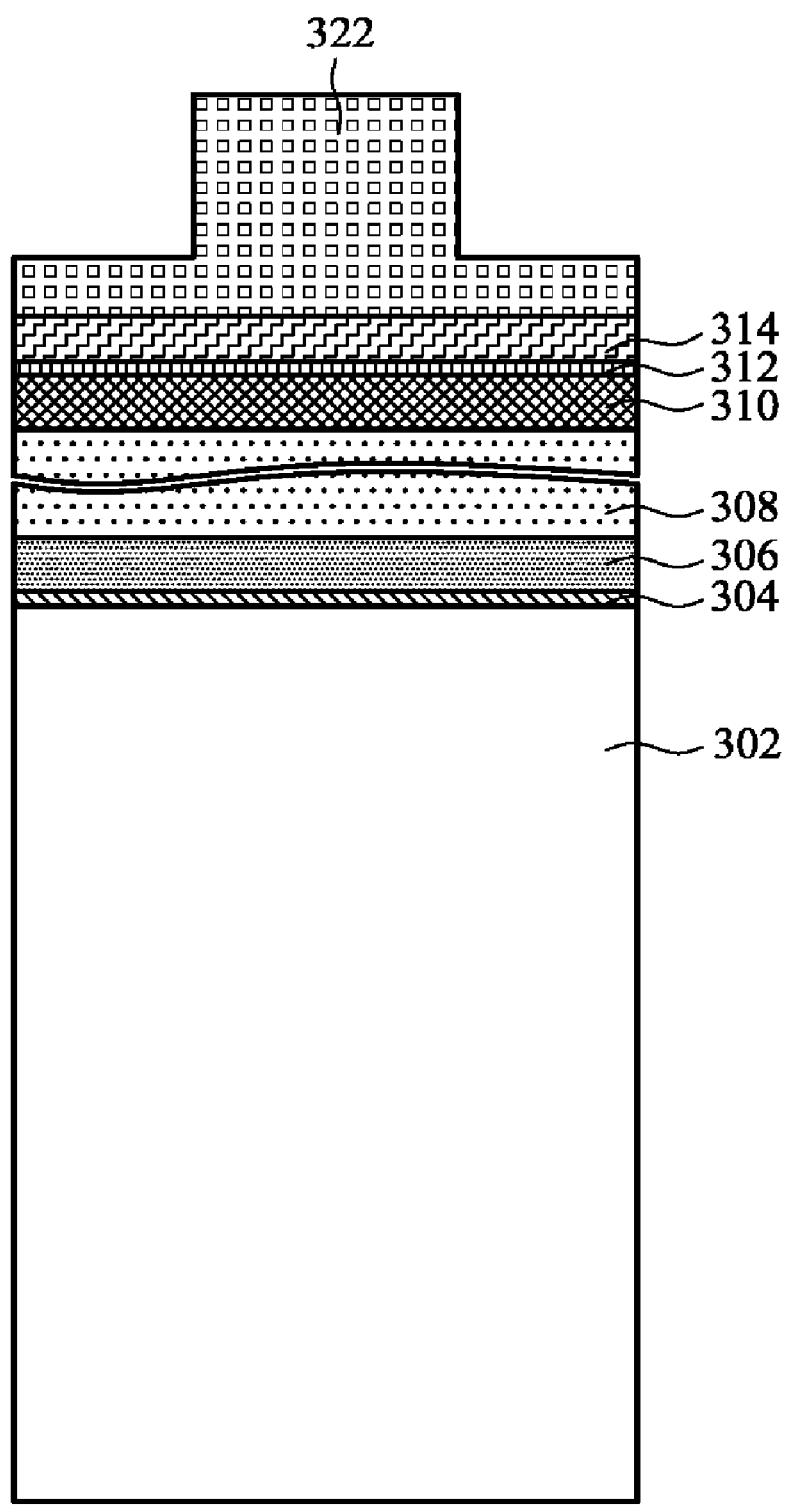

Next, referring to FIG. 4A, FIG. 4B and FIG. 4C, wherein FIG. 4A shows the local plan view of the intermediate process step for forming the deep trench memory device of the embodiment, FIG. 4B shows a cross section along line I-I' of FIG. 4A and FIG. 4C shows a cross section along line II-II' of FIG. 4A, the first sacrificial layer 316 is anisotropically etched using the resist pattern 318 as a mask to form a pillar structure 320. The embodiment can fine tune parameters for the etching process to not etch through the carbon hard mask layer 314. Referring to FIG. 5A, FIG. 5B and FIG. 5C, wherein FIG. 5A shows the local plan view of the intermediate process step for forming the deep trench memory device of the embodiment, FIG. 5B shows a cross section along line I-I' of FIG. 5A and FIG. 5C shows a cross section along line II-II' of FIG. 5A, the resist pattern 318 is removed and an undoped polysilicon layer 322 is conformally deposited on the pillar structure 320 and the carbon hard mask layer 314 by a low pressure chemical vapor deposition (LPCVD) process.

Figure 6A:
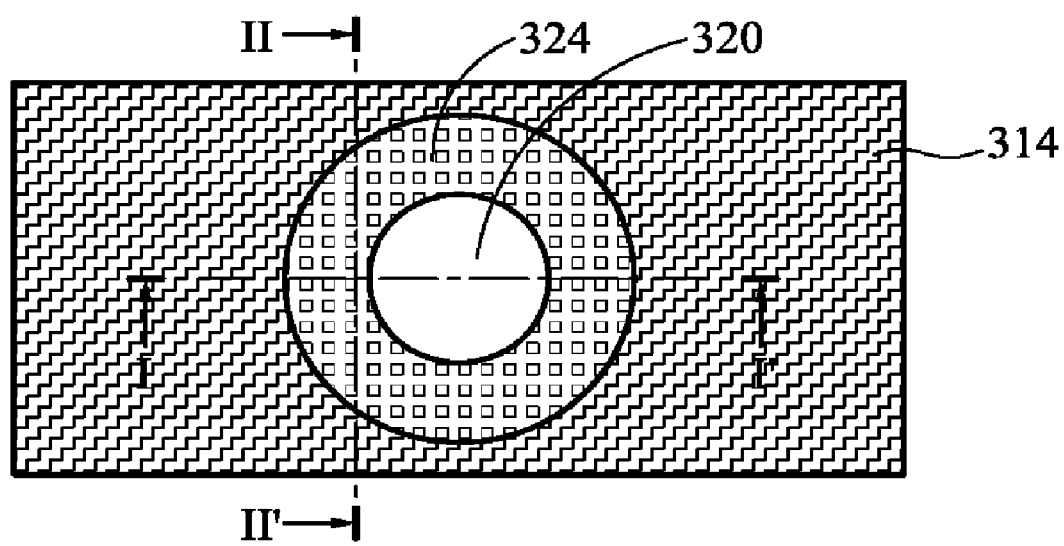
Figure 6B:
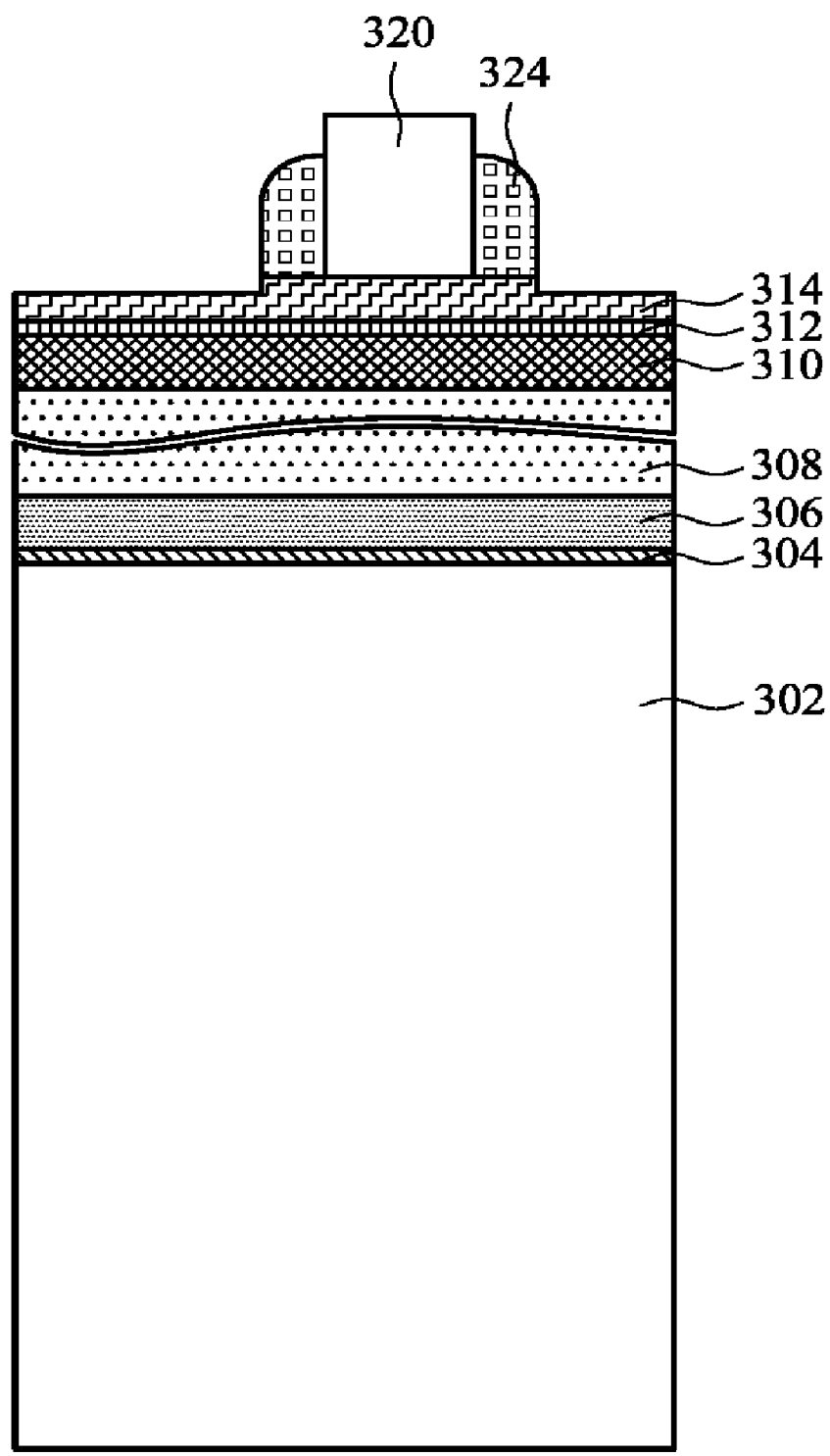
Figure 6C:
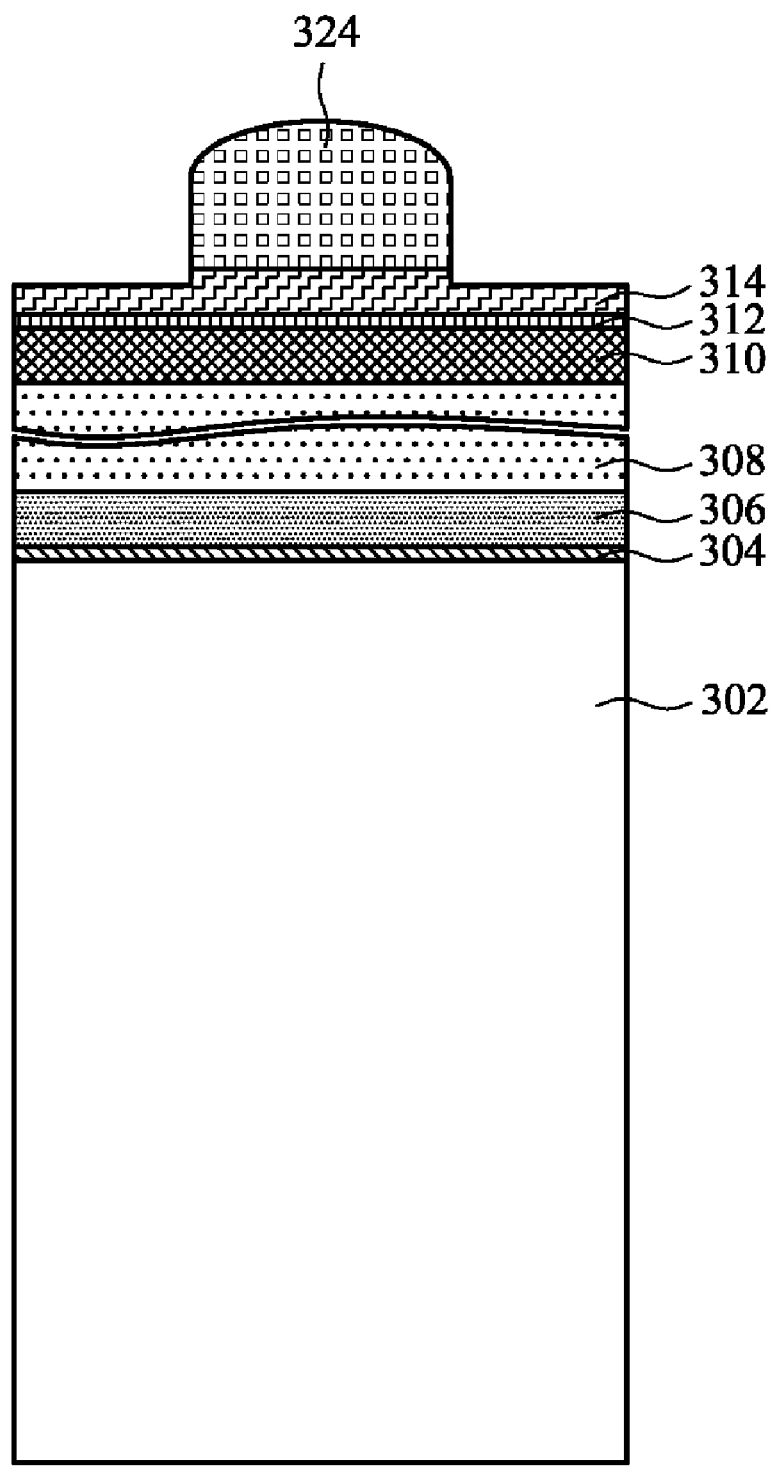
Figure 7A:
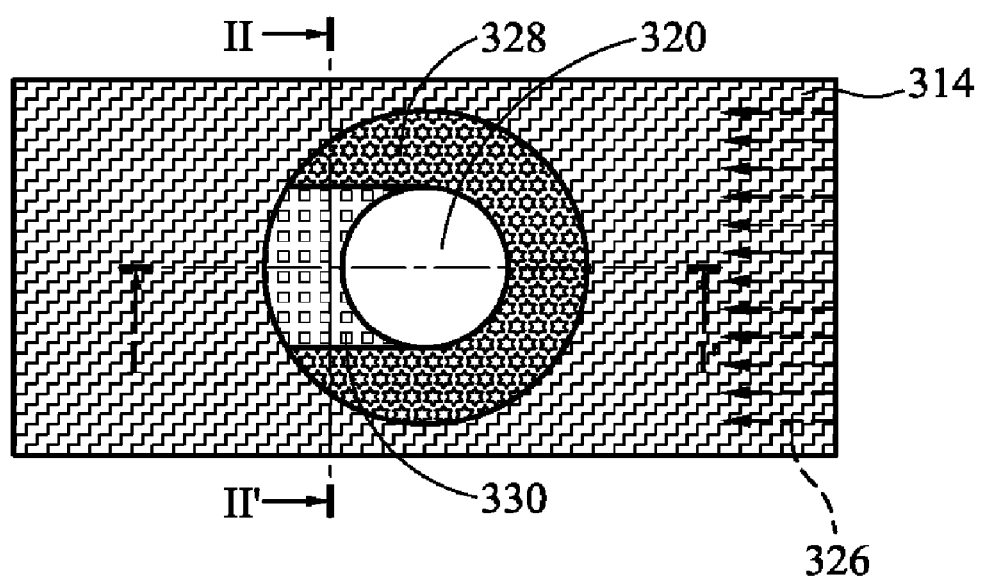
Figure 7B:
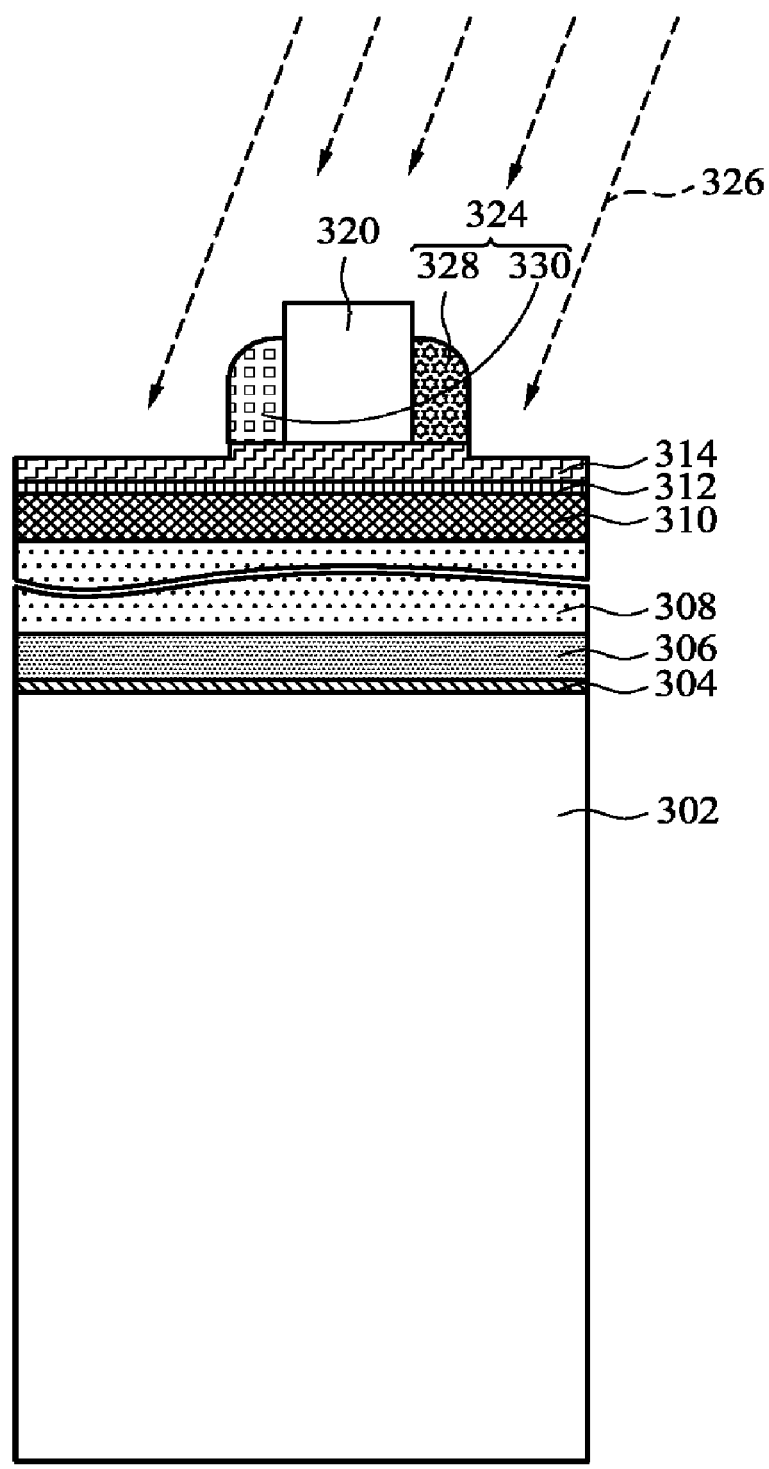
Figure 7C:
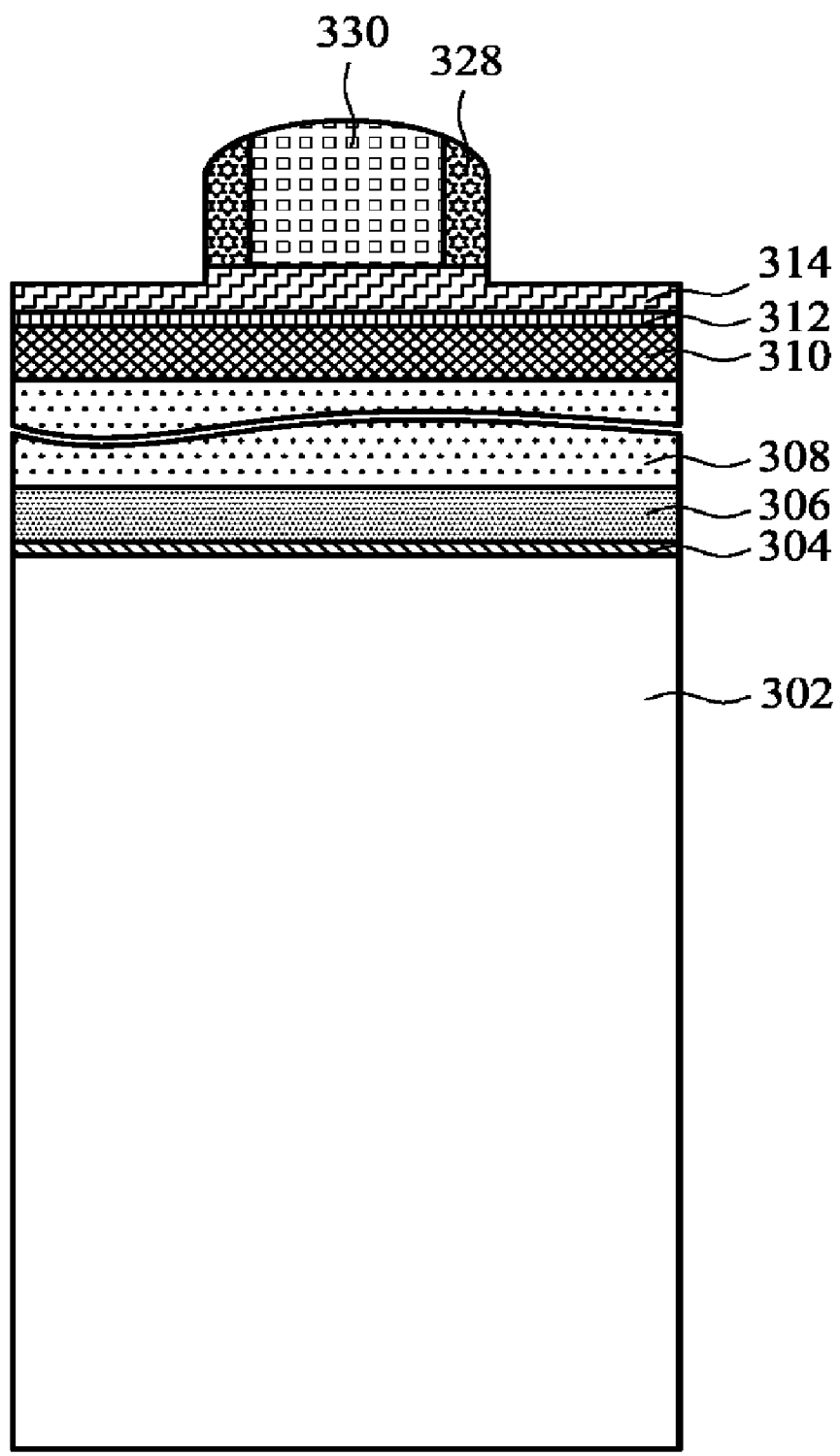

Referring to FIG. 6A, FIG. 6B and FIG. 6C, the undoped polysilicon layer 322 is anisotropically etched to form a ring-shaped spacer 324 surrounding the pillar structure 320. Referring to FIG. 7A, FIG. 7B and FIG. 7C, an implant process 326 with a tilt implanting angle is performed by doping $BF_2$ into the ring-shaped spacer 324, wherein a portion of the ring-shaped spacer 324 is not doped because some dopants are interrupted by the pillar structure 320. Therefore, the ring-shaped spacer 324 comprises a C-shaped doped portion 328 and an undoped portion 330.

Figure 8A:
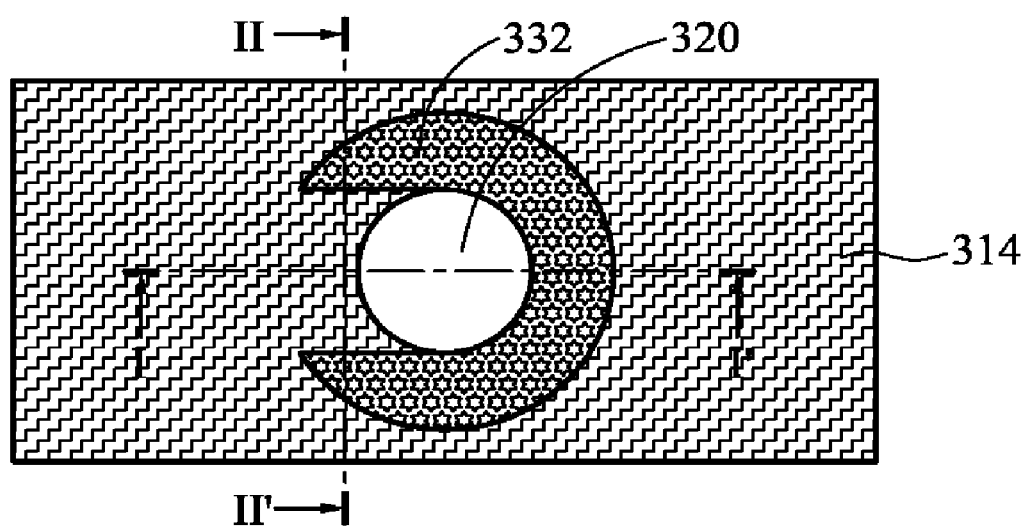
Figure 8B:
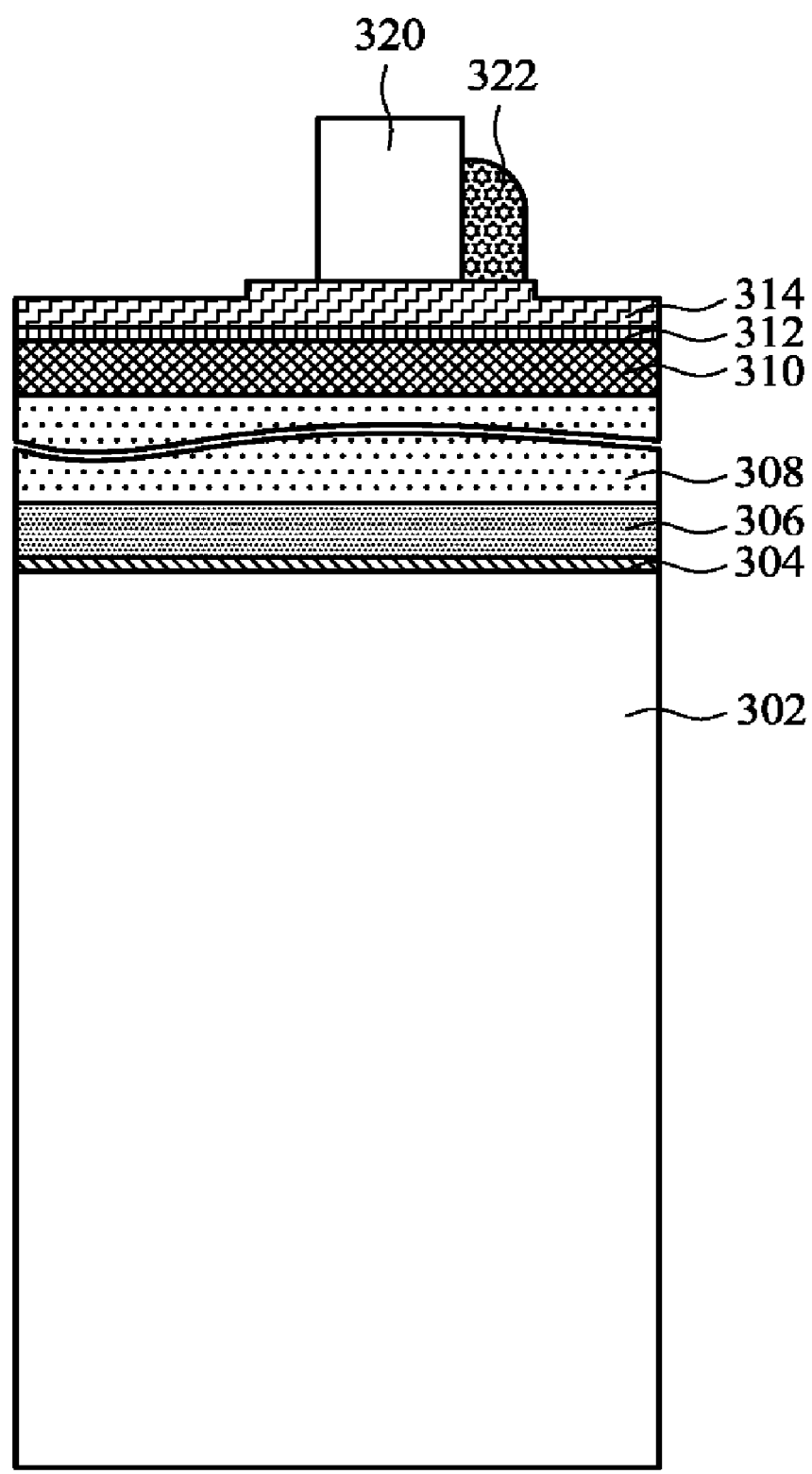
Figure 8C:
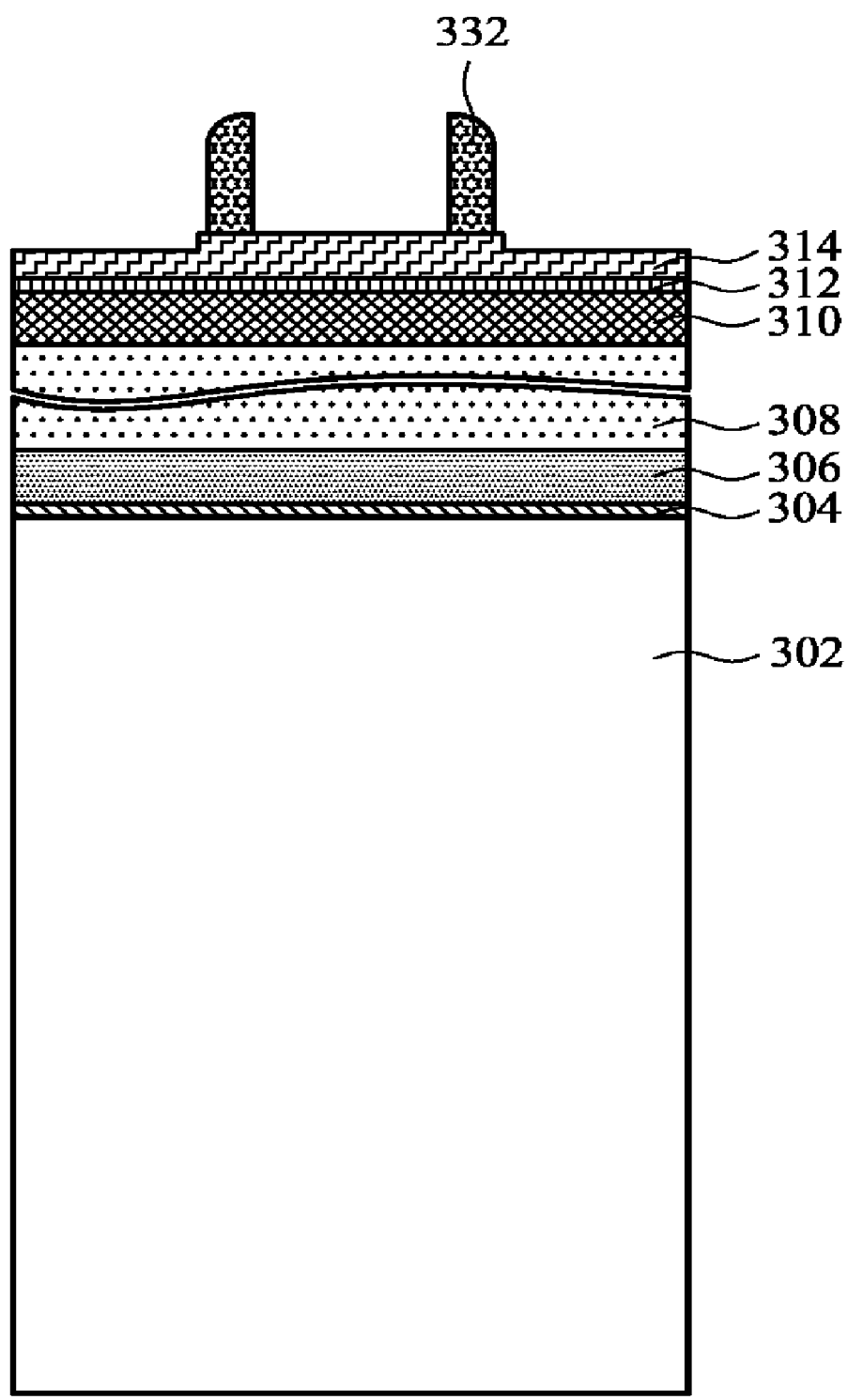
Figure 9A:
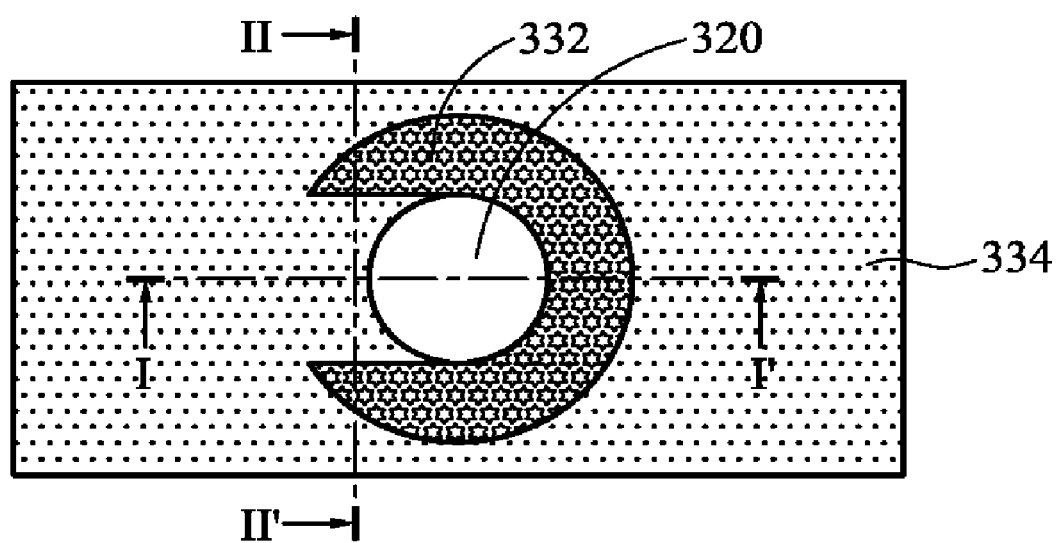
Figure 9B:
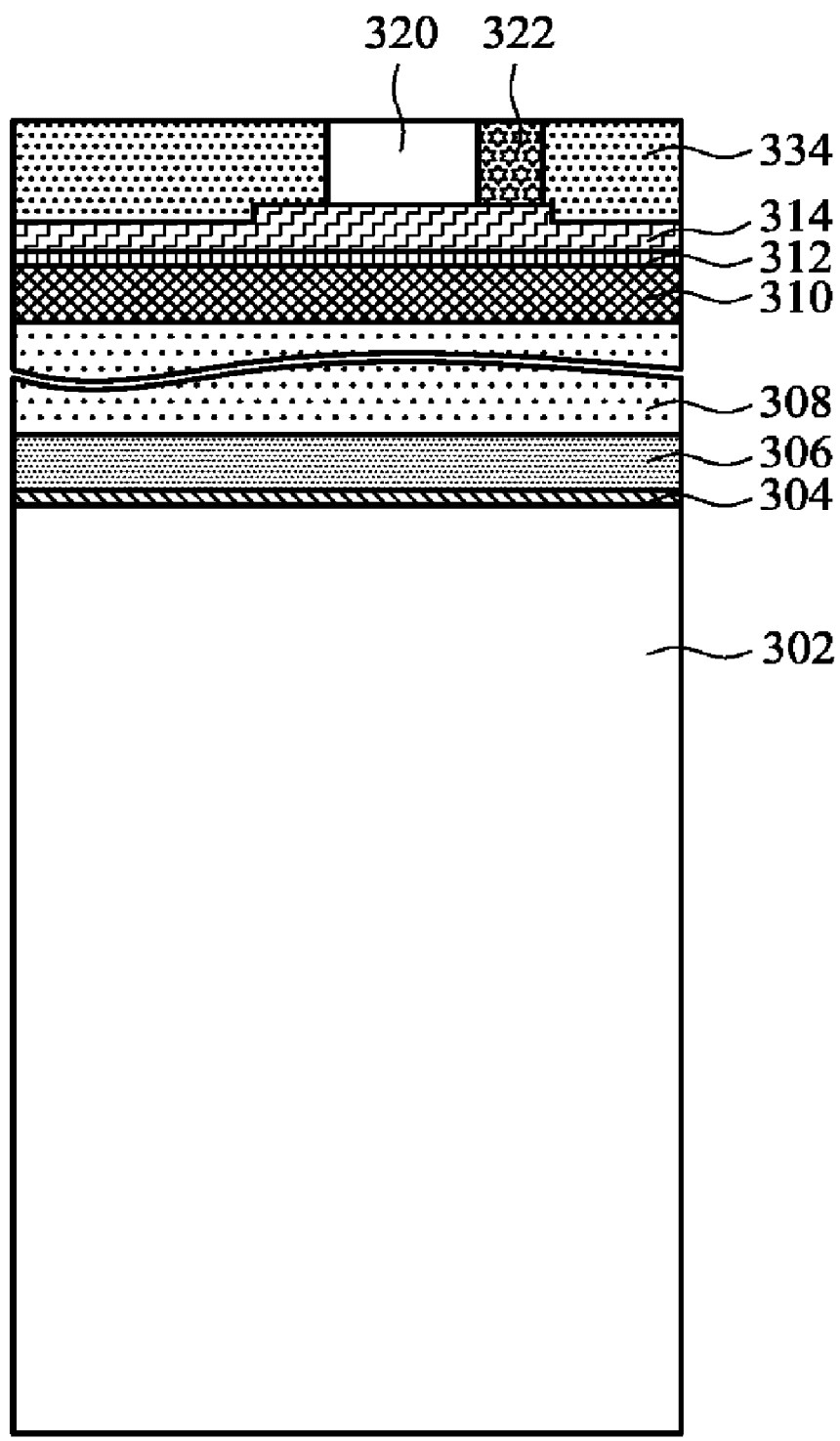
Figure 9C:
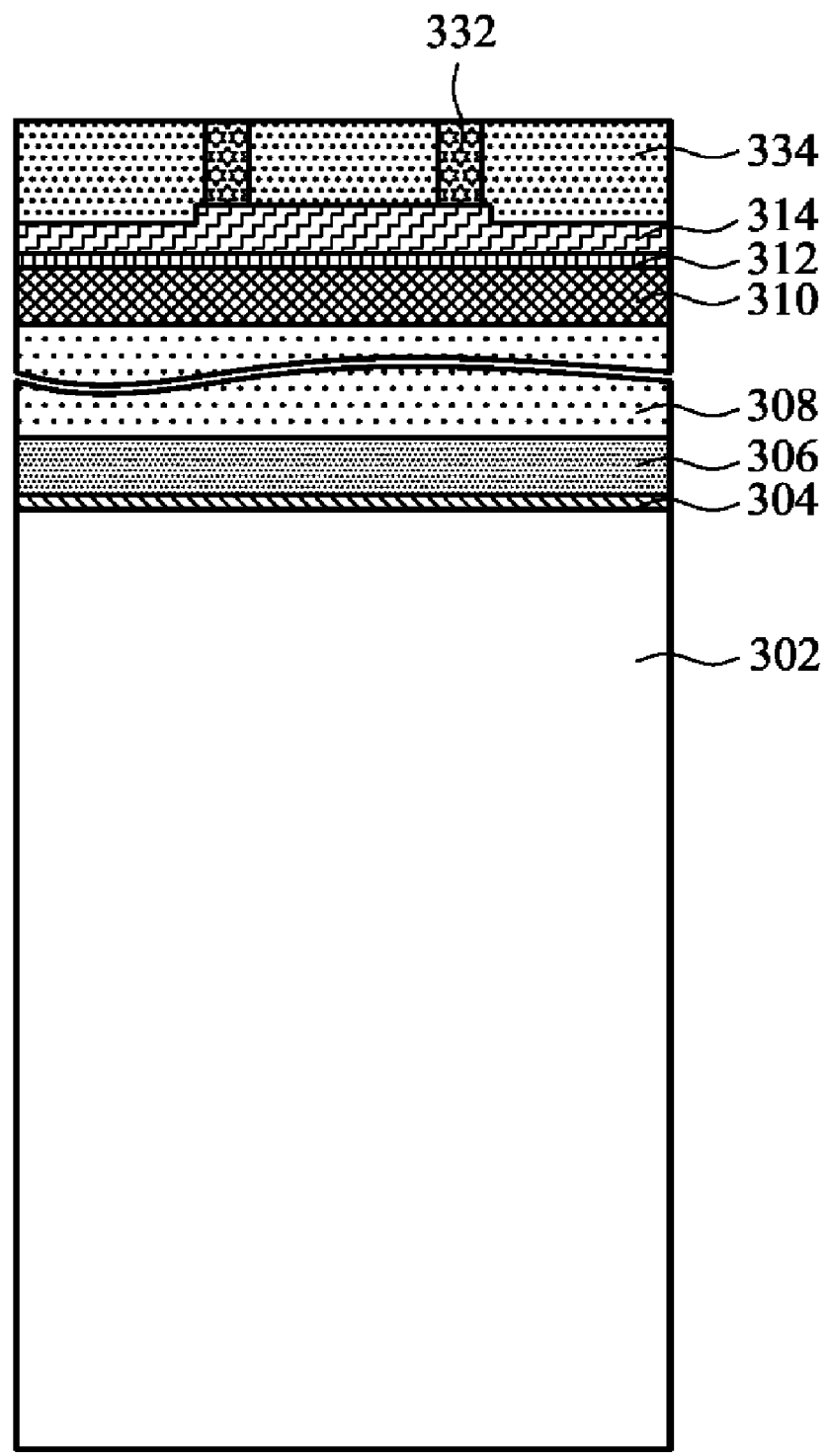
Figure 10A:
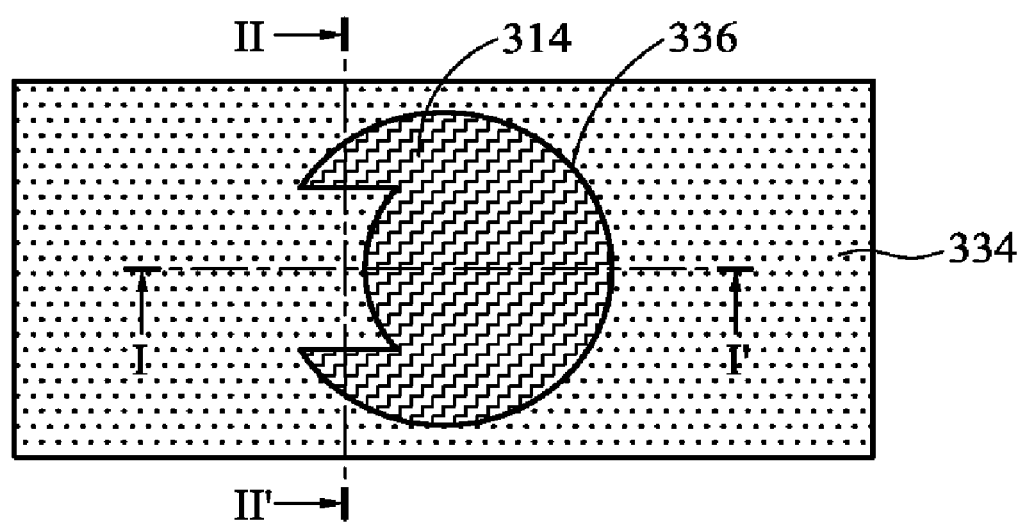
Figure 10B:
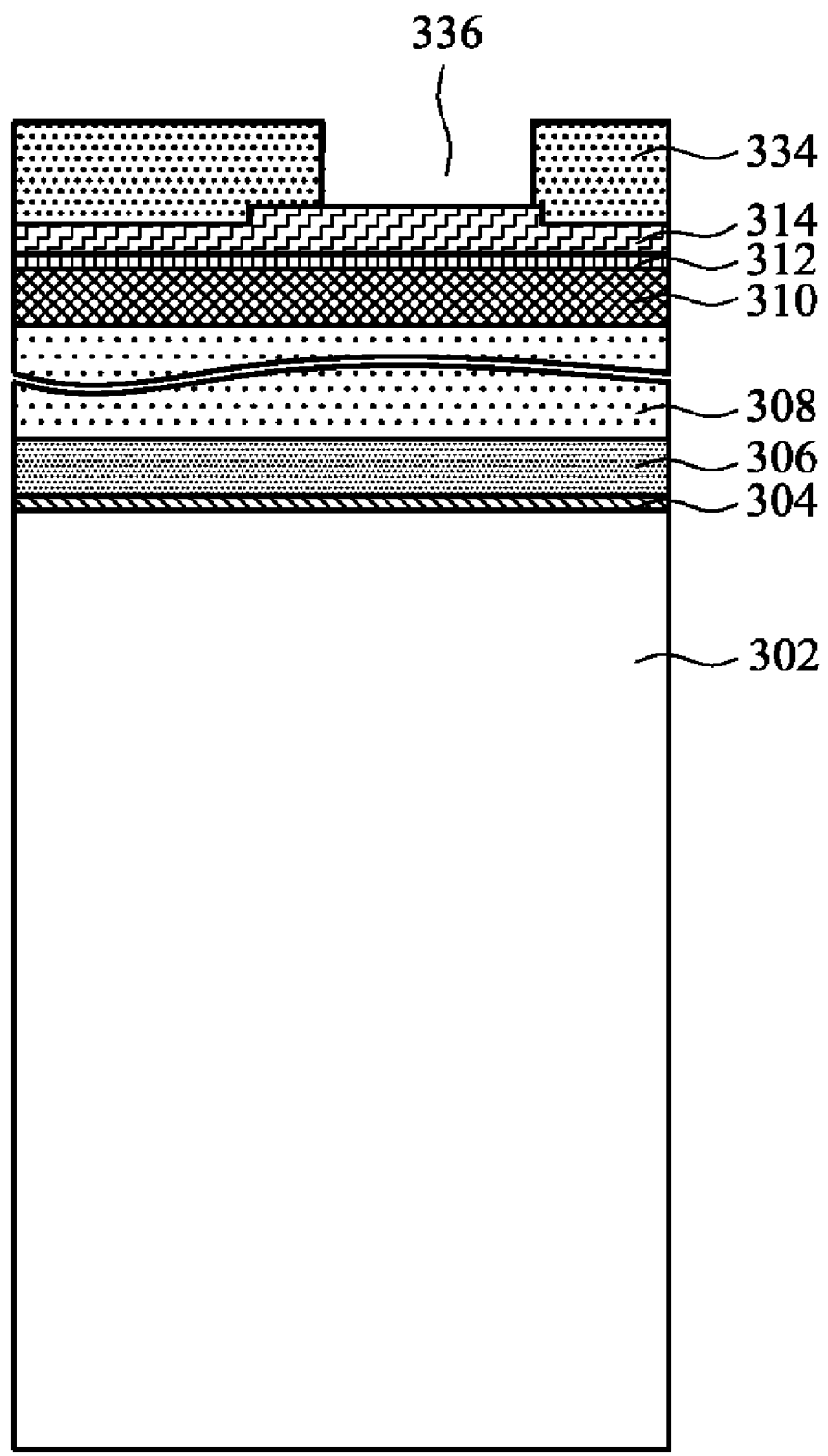
Figure 10C:
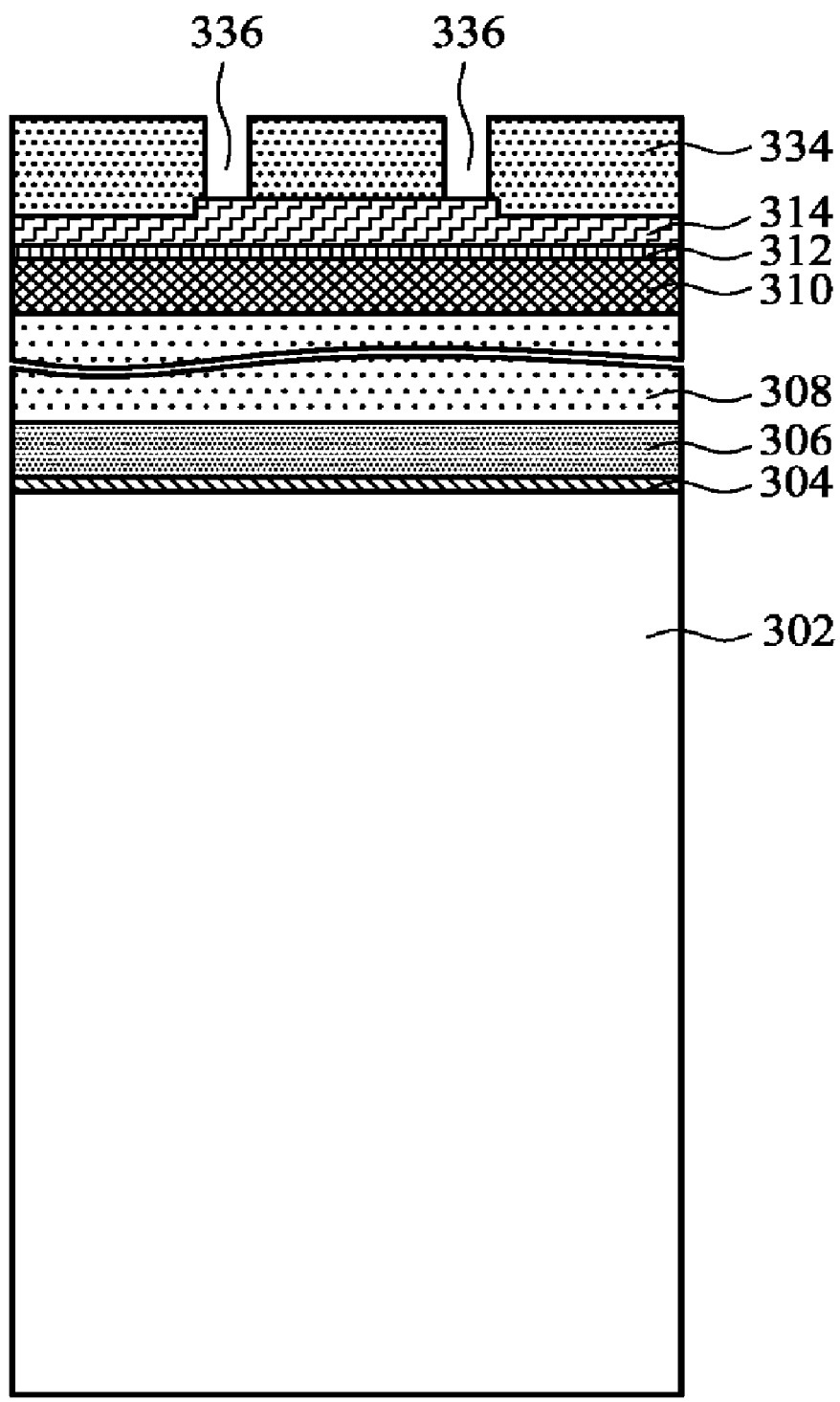

Referring to FIG. 8A, FIG. 8B and FIG. 8C, an etching process using $NH_4OH$ as a primary etchant is performed. It is noted that the step of doping polysilicon with $BF_2$ above decreases the etching rate of $NH_4OH$. Therefore, the etching process can selectively remove the undoped portion 330 of the ring-shaped spacer 324, while leaving the doped C-shaped doped portion 328 to form a C-shaped spacer 332. Referring to FIG. 9A, FIG. 9B and FIG. 9C, a second sacrificial layer 334, such as $SiO_2$, BSG, PSG or BPSG, is blanketly deposited to cover the pillar structure 320 and the C-shaped spacer 332. Next, a chemical mechanical polishing (CMP) process or an etching back process is performed till the C-shaped spacer 332 and the pillar structure 320 are exposed. Referring to FIG. 10A, FIG. 10B and FIG. 10C, the pillar structure 320 and the C-shaped spacers 332 are removed to form an opening 336 in the second sacrificial layer 334, and as shown in FIG. 10A, the opening 336 includes a curved outer edge, a curved inner edge having a positive curvature, and a first line and a second line connecting the curved outer edge with the curved inner edge in the direction parallel to the substrate 302 surface. It is noted that the smaller the resist pattern 318 and/or the thicker the c-shaped spacers 332 is, the closer the positive-curved inner edge is to the central point of the deep trench capacitor, thus affecting fabrication of the active area and the vertical gate region and acceptable overlay process window between the deep trench capacitor and the vertical gate region in subsequent steps.

Figure 11A:
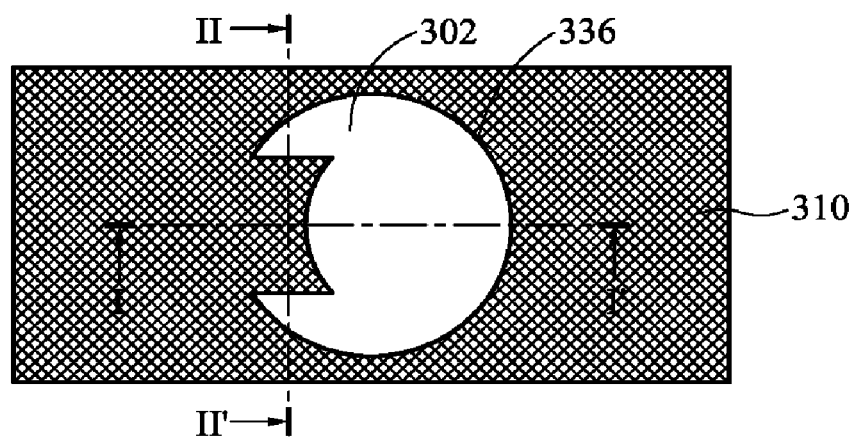
Figure 11B:
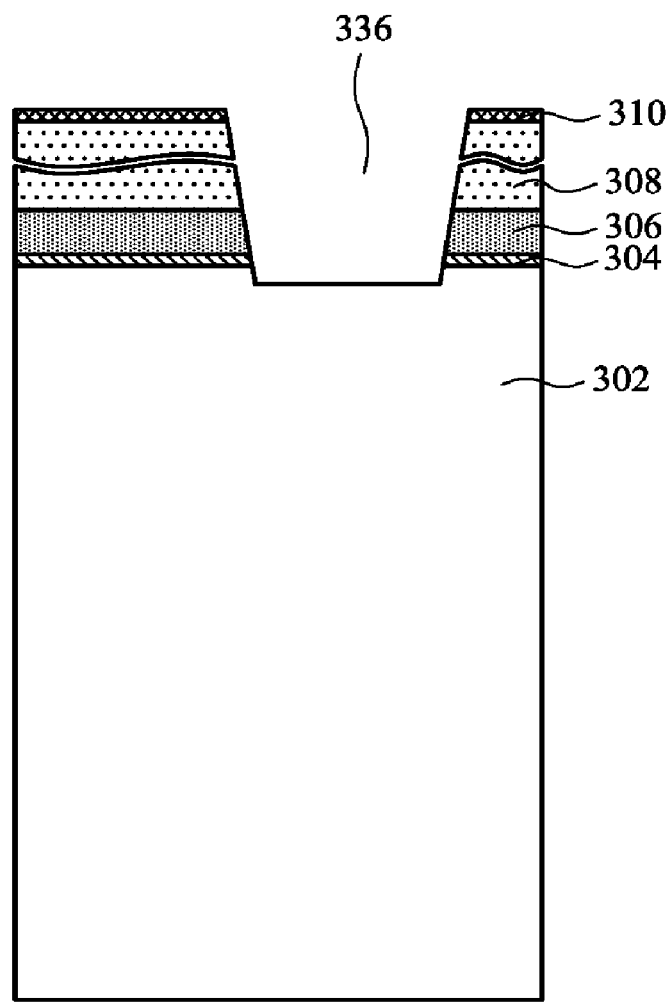
Figure 11C:
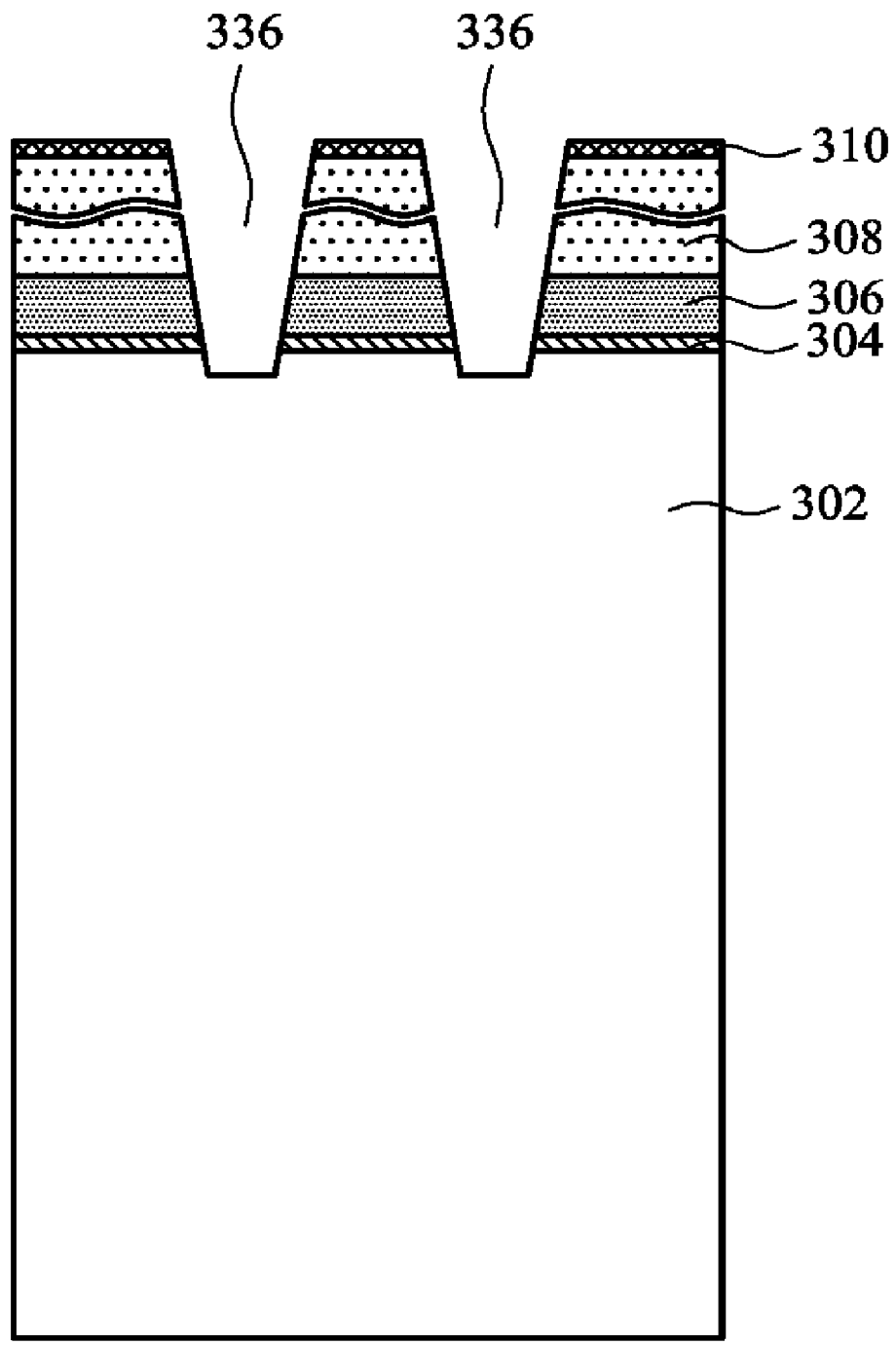

Referring to FIG. 11A, FIG. 11B and FIG. 11C, the carbon hard mask layer 314, the nitride hard mask layer 312, the polysilicon hard mask layer 310, the oxide layer 308, the pad nitride layer 306 and the pad oxide layer 304 are etched using the second sacrificial layer 334 as a mask to transfer the pattern of the opening 336 downward, and as shown in this figure, this process step consumes the second sacrificial layer 334, the carbon hard mask layer 314 and the nitride hard mask layer 312.

Figure 12A:
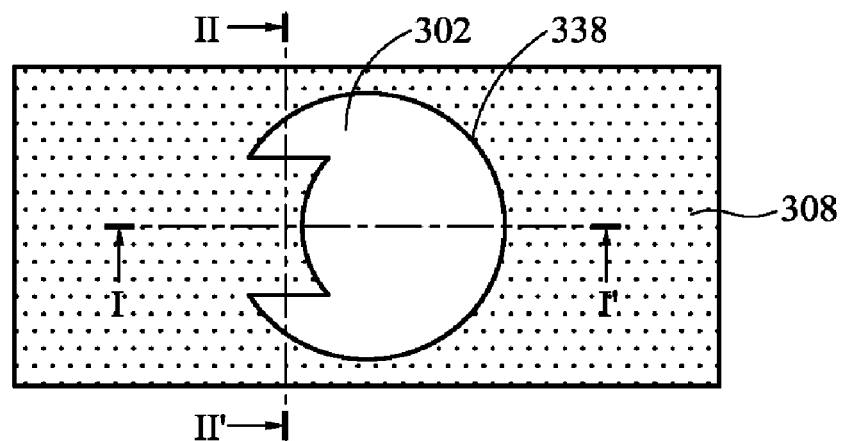
Figure 12B:
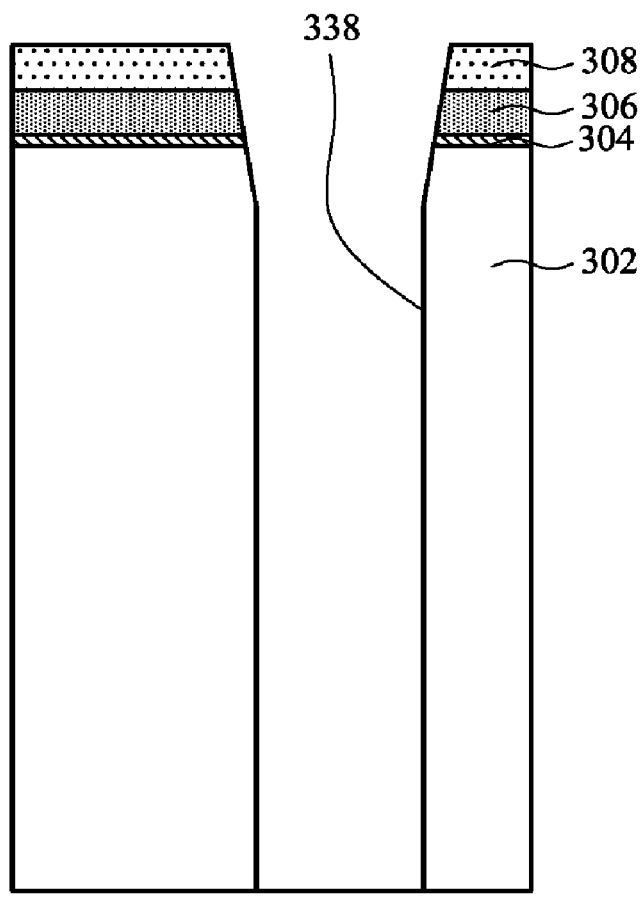
Figure 12C:
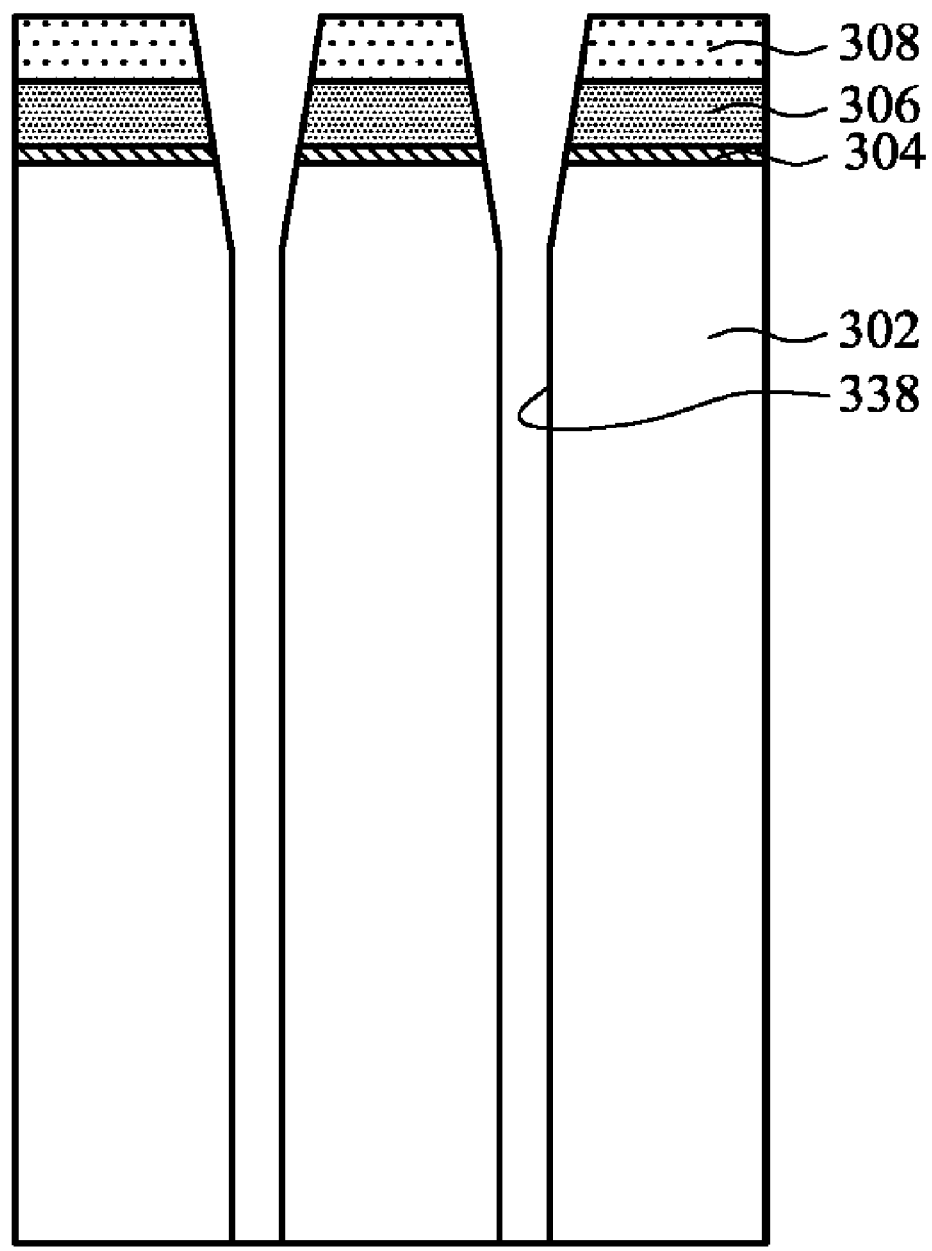
Figure 13A:
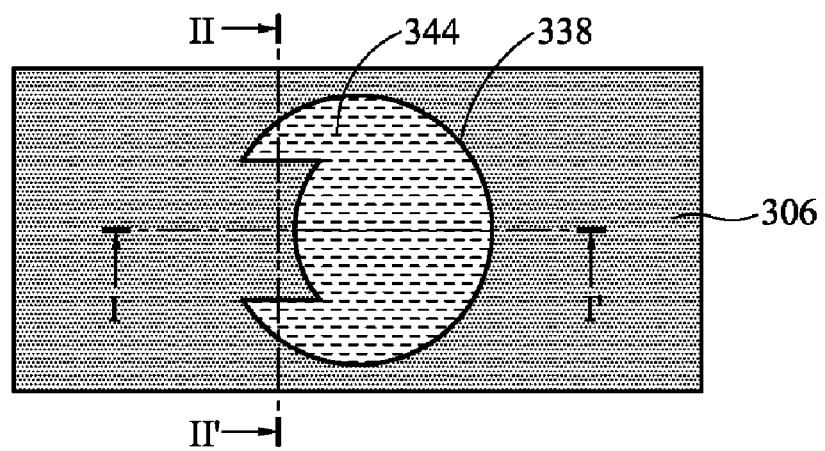
Figure 13B:
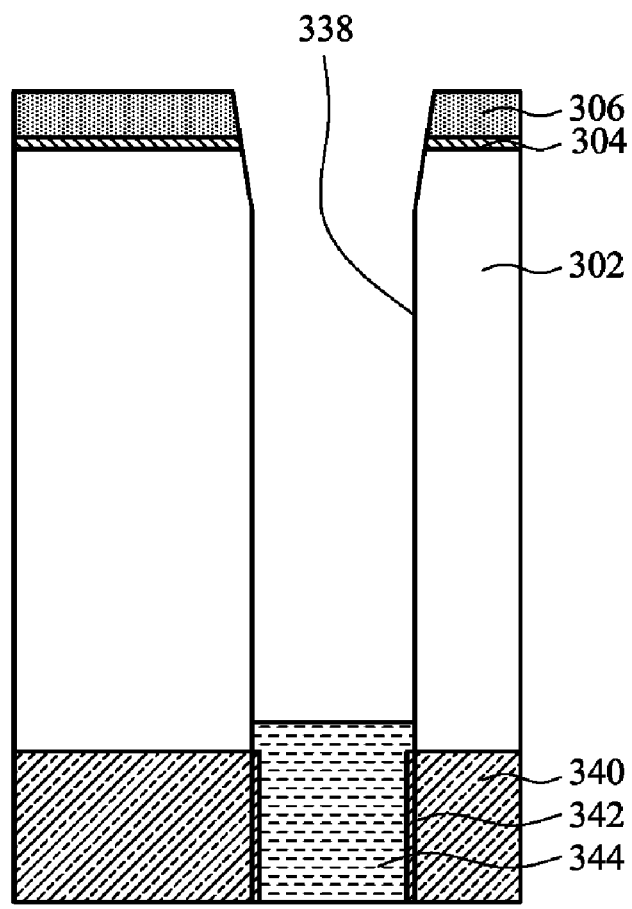
Figure 13C:
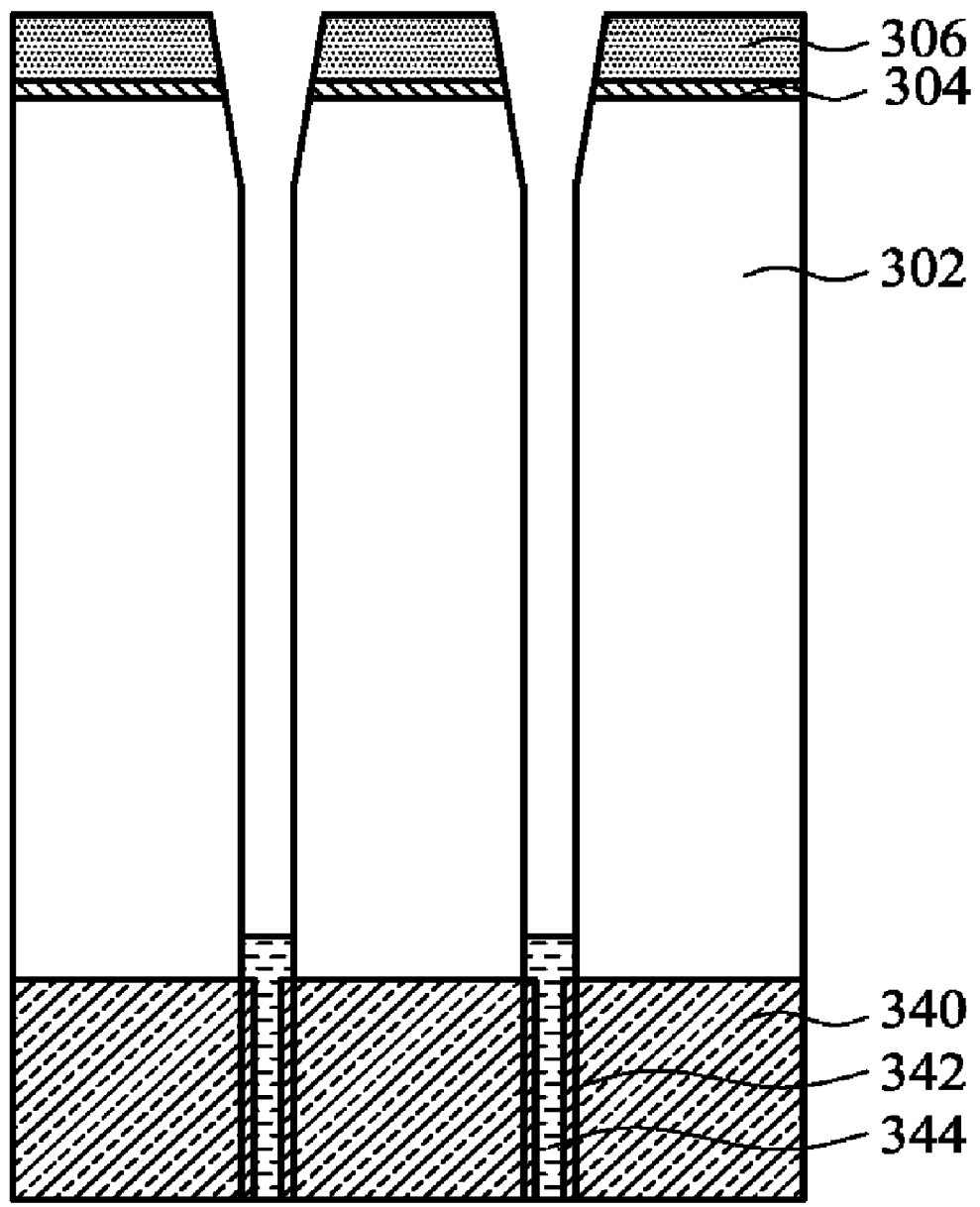

Referring to FIG. 12A, FIG. 12B and FIG. 12C, the substrate 302 is etched to form a deep trench 338 using the oxide layer 308, the pad nitride layer 306 and the pad oxide layer 304 as a hard mask. Referring to FIG. 13A, FIG. 13B and FIG. 13C, the oxide layer 308 is removed, a portion of the substrate 302 is doped to form a doping region 340 as a first electrode of a capacitor 342, and the capacitor 342 is formed on the sidewall of the lower portion of the deep trench 338. A first polysilicon layer 344 is filled into the lower portion of the deep trench 338 to electrically connect to the second electrode of the capacitor 342.

Figure 14A:
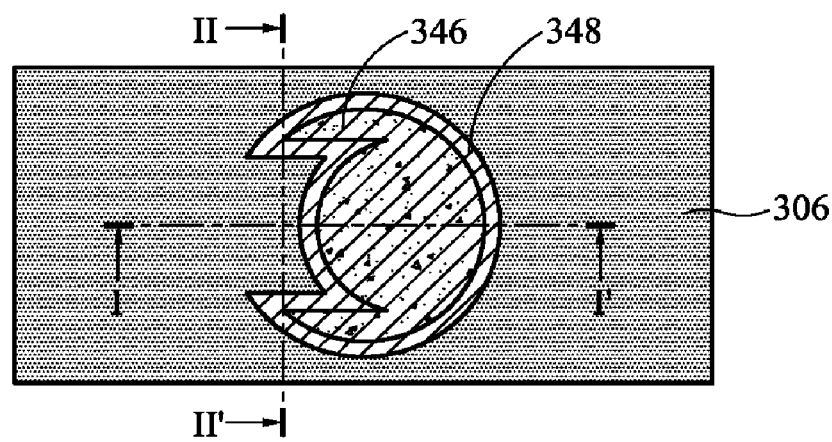
Figure 14B:
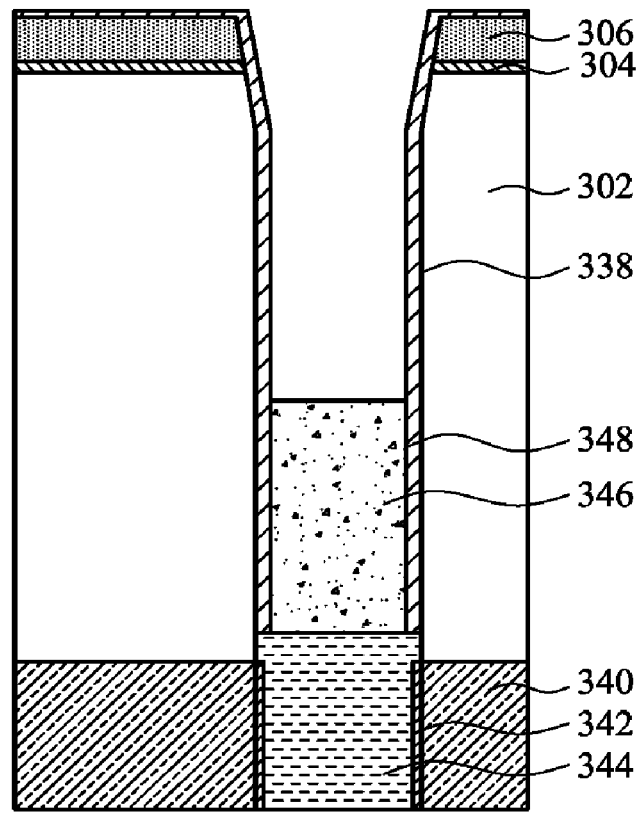
Figure 14C:
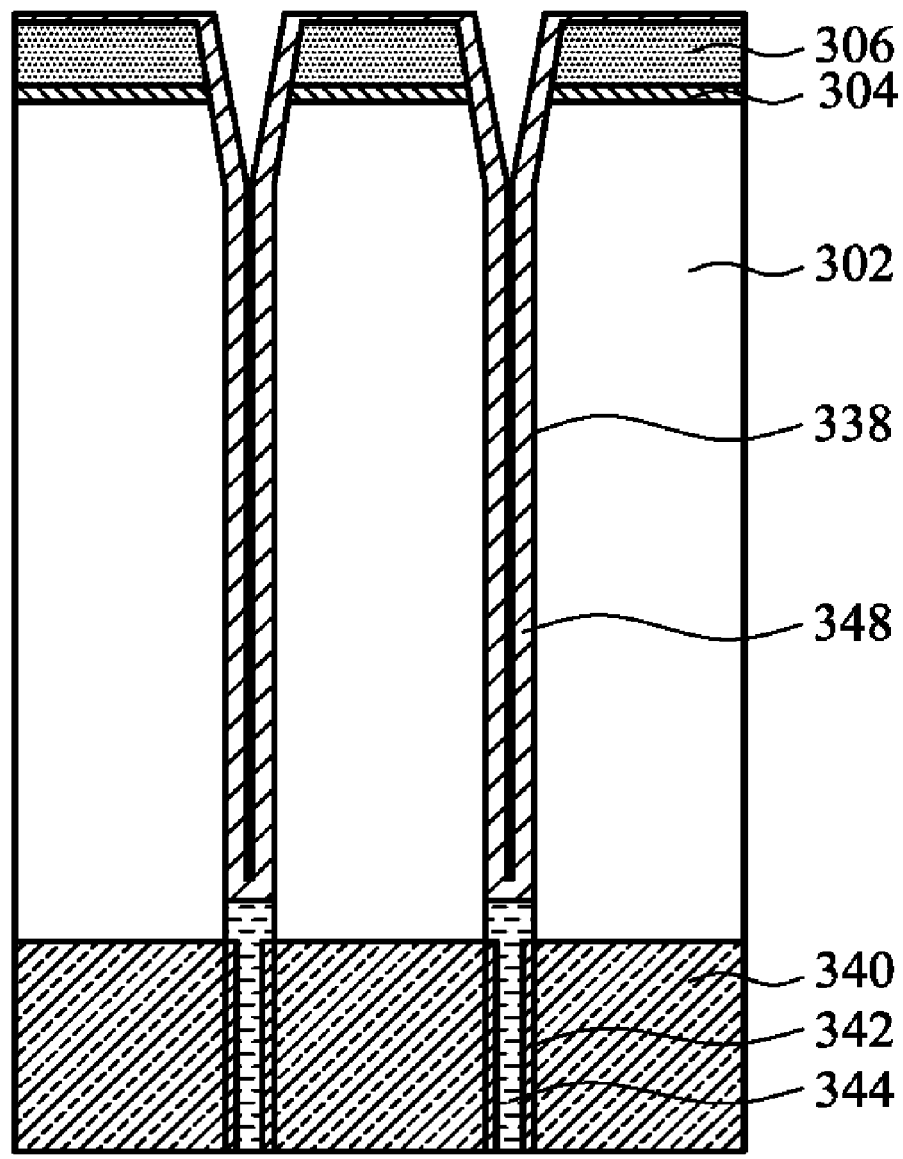
Figure 15A:
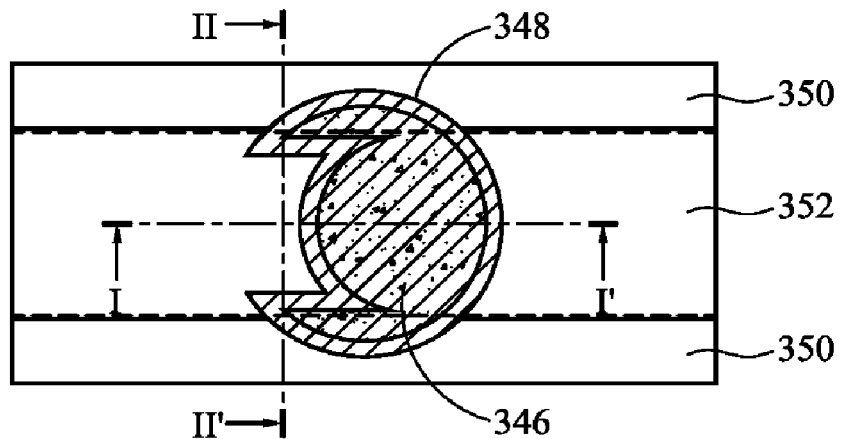
Figure 15B:
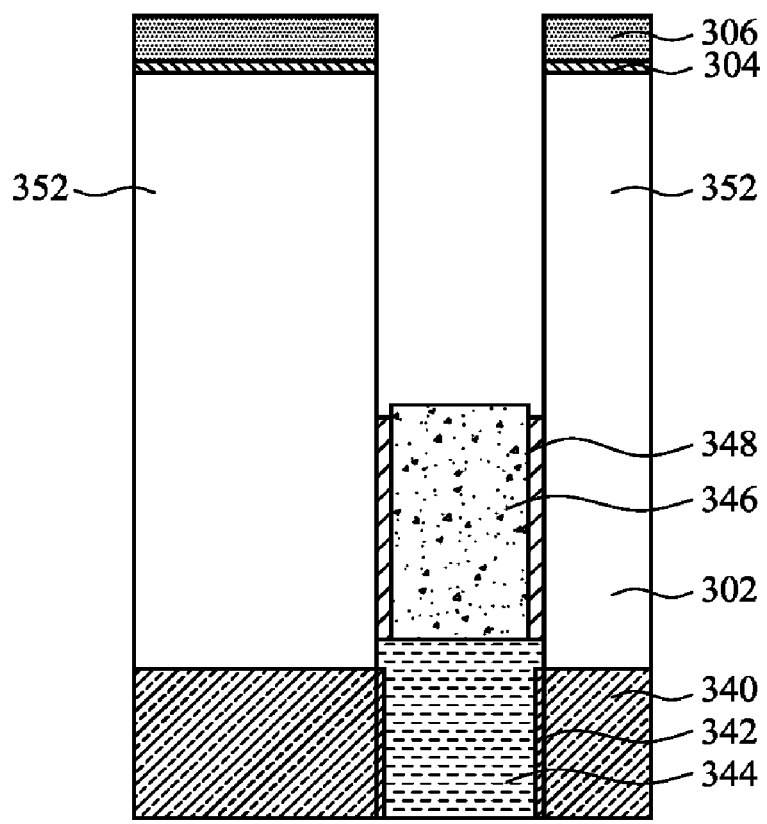
Figure 15C:
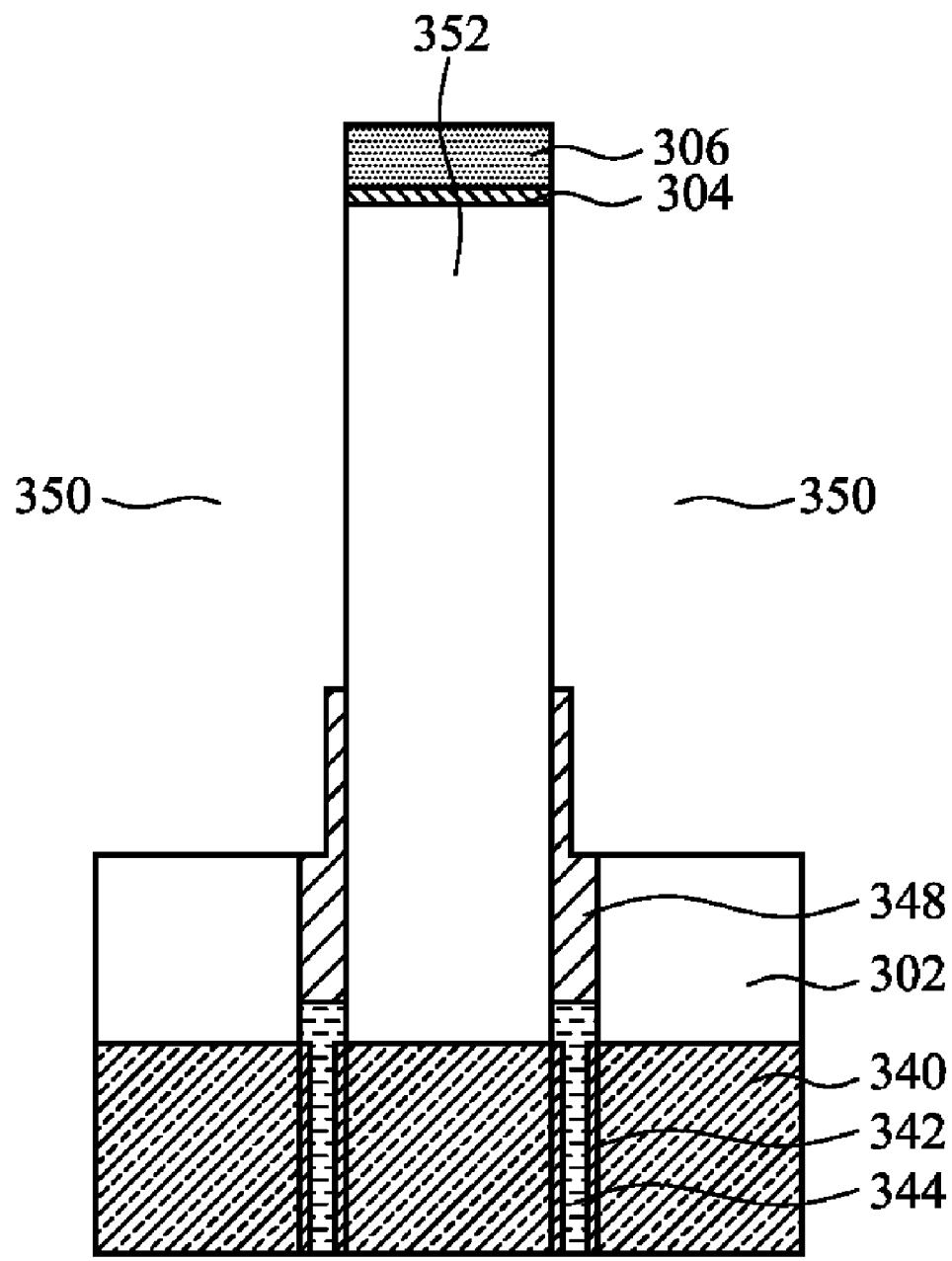
Figure 16A:
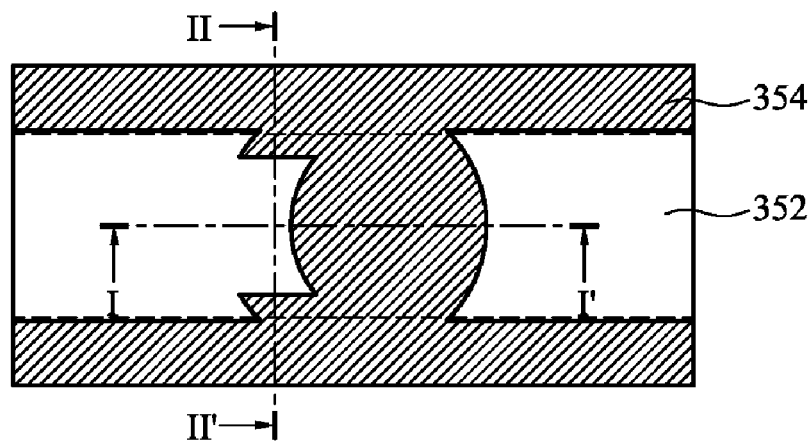
Figure 16B:
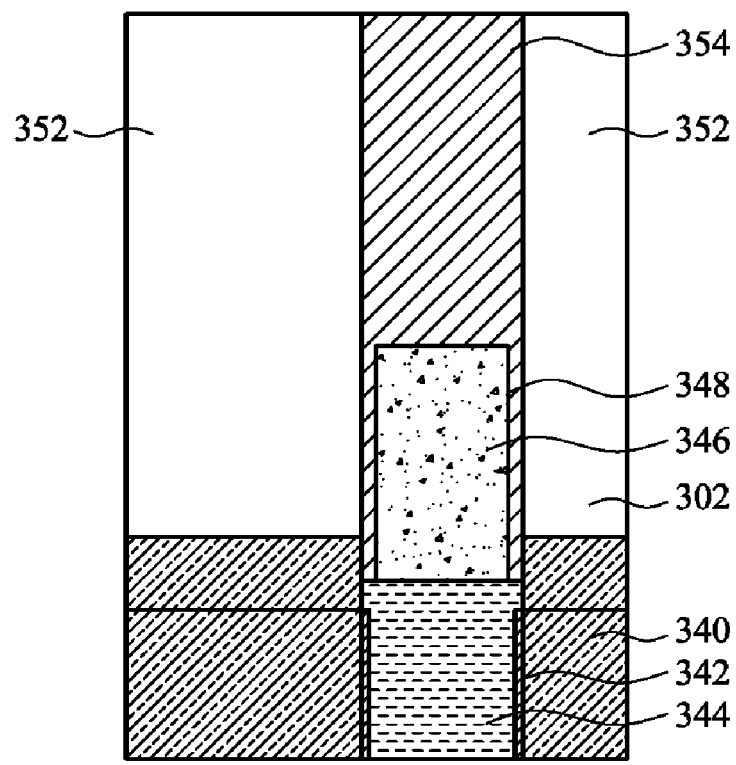
Figure 16C:
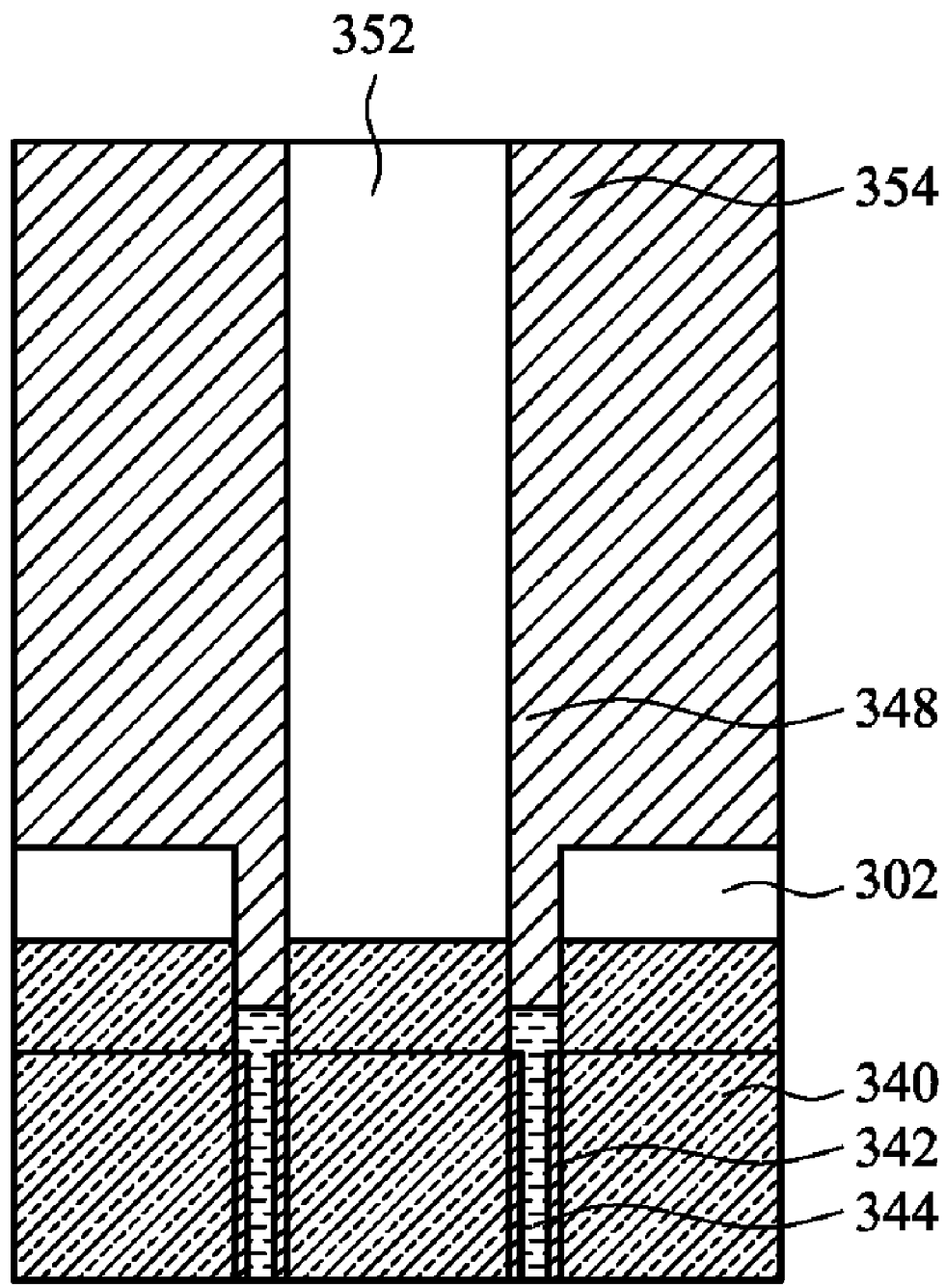

Referring to FIG. 14A, FIG. 14B and FIG. 14C, a collar dielectric layer 348 for example comprising silicon oxide, is formed on the sidewall of the upper portion of the deep trench 338 by an LPCVD and etching back process. Next, a second polysilicon layer 346 is formed in the deep trench 338 by a deposition and etching back process. Referring to FIG. 15A, FIG. 15B and FIG. 15C, a lithography and an etching process are performed to form a shallow trench 350 in the substrate 302 and thus defines an active area 352. Referring to FIG. 16A, FIG. 16B and FIG. 16C, the shallow trench 350 is filled with dielectric material and then chemical mechanical polishing (CMP) process is performed to form a shallow trench isolation region 354 for isolating the deep trench capacitor from other adjacent deep trench capacitors.

Figure 16D:
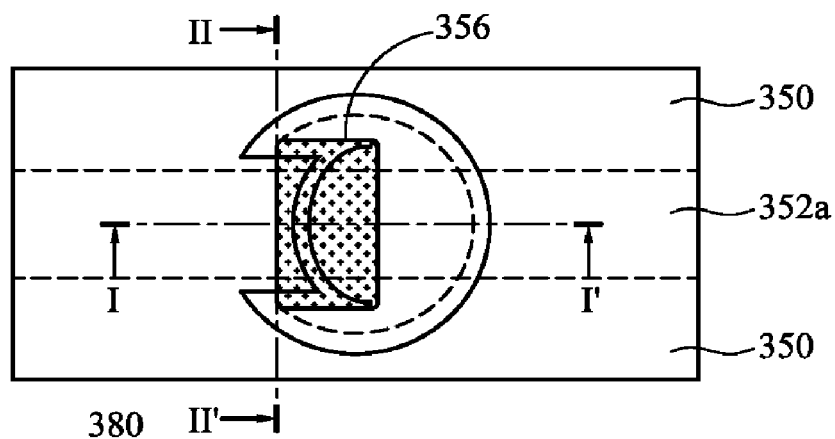
Figure 16E:
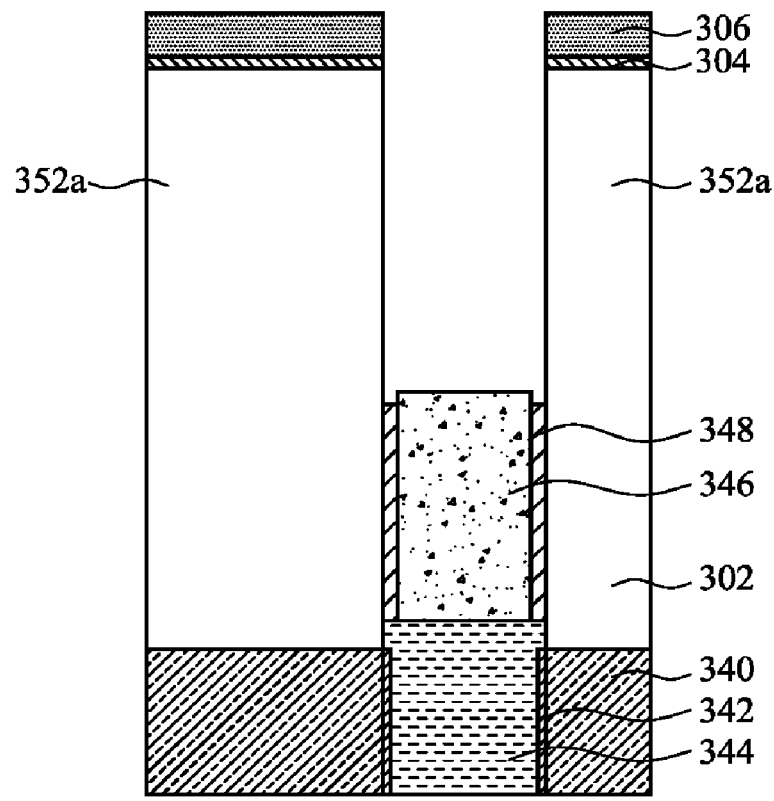
Figure 16F:
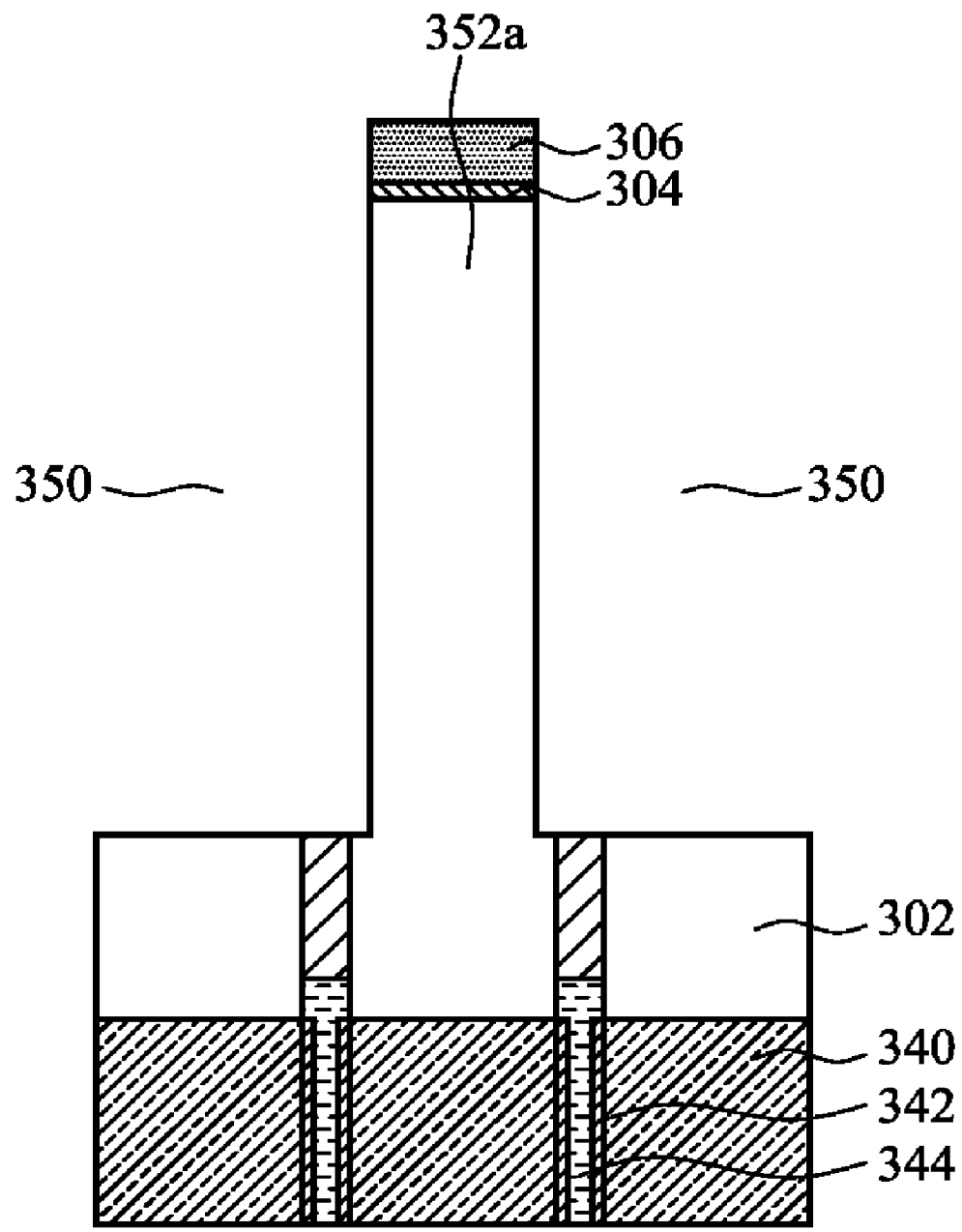
Figure 16G:
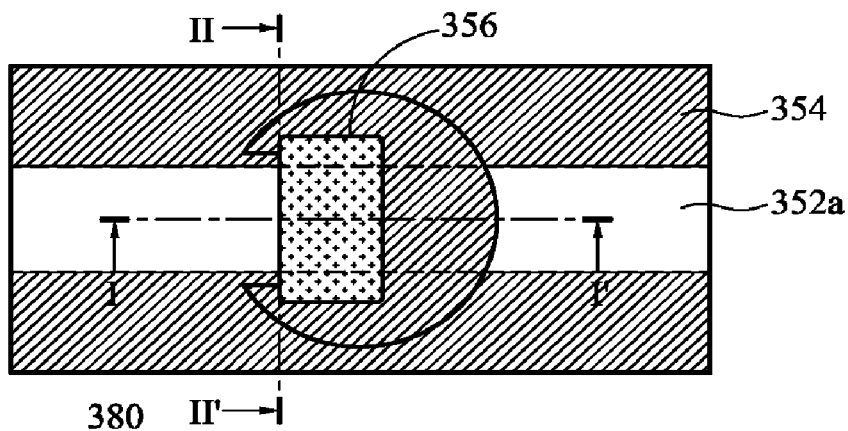
Figure 16H:
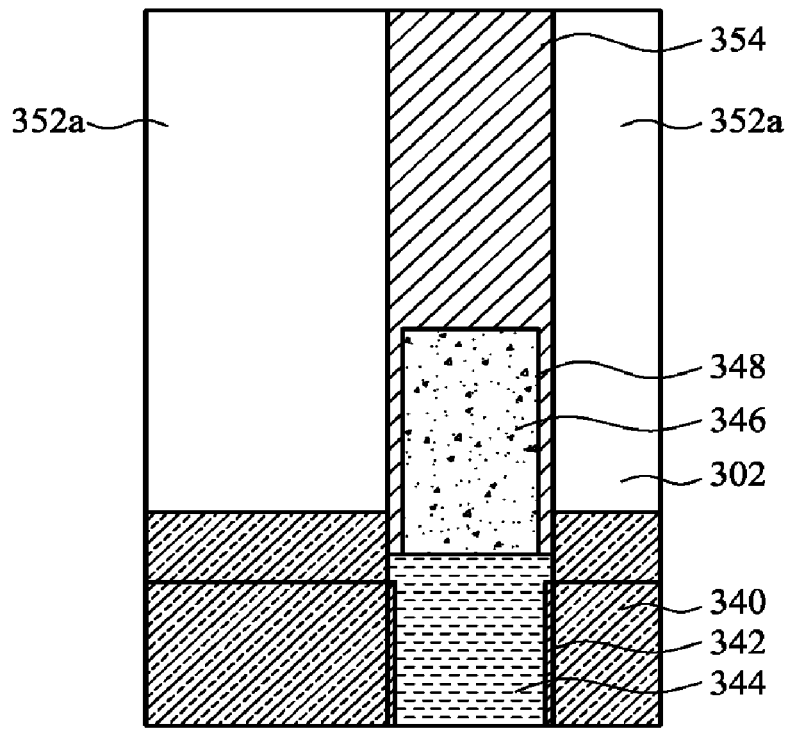
Figure 16I:
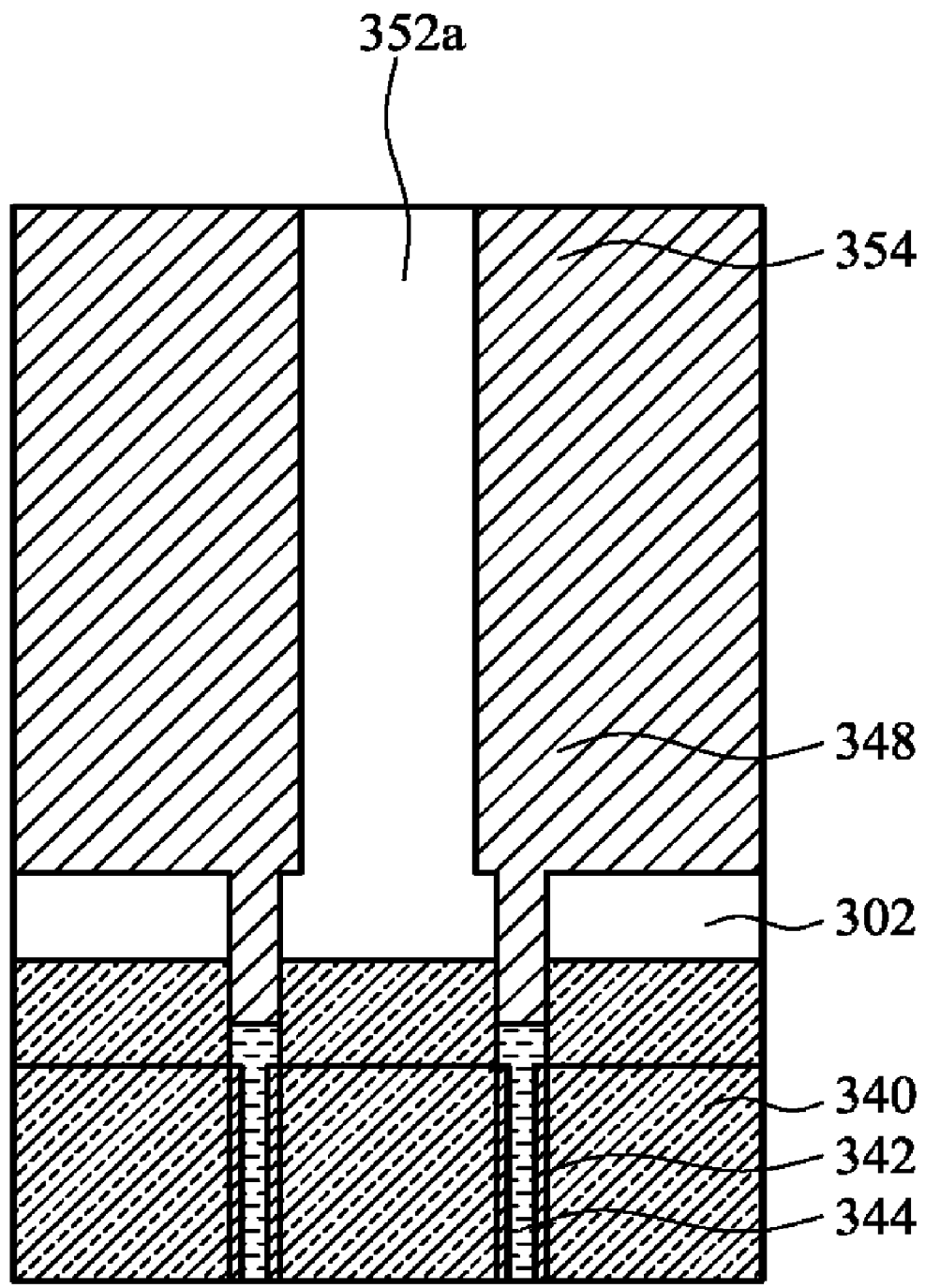

Please refer to FIG. 16D, FIG. 16E and FIG. 16F, FIG. 16G, FIG. 16H and FIG. 16I, wherein FIG. 16D shows the local plan view of the intermediate process step related to FIG. 15A, FIG. 16E shows a cross section along line I-I' of FIG. 16D, and FIG. 16F shows a cross section along line II-II' of FIG. 16D, and FIG. 16G shows the local plan view of the intermediate process step related to FIG. 16A, FIG. 16H shows a cross section along line I-I' of FIG. 16G, and FIG. 16I shows a cross section along line II-II' of FIG. 16G. Unlike the embodiment shown in FIGS. 15A-16C, wherein the width of the active area 352 is greater than a vertical-gate opening 356 formed in subsequent steps, the embodiment in FIGS. 16D–16I illustrates the width of the active area 352a being less than the distance between the first line 206 and the second line 208 of the deep trench capacitor 202. It is noted that the active area 352a with the smaller width will affect the subsequent contacting of the word line process step.

Figure 17A:
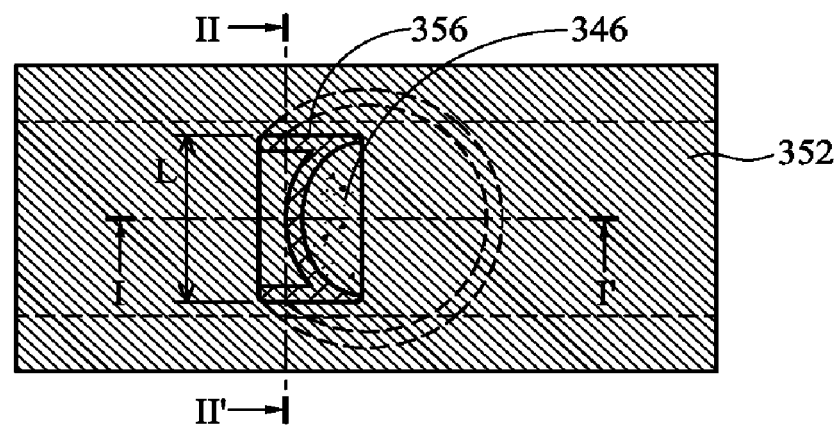
Figure 17B:
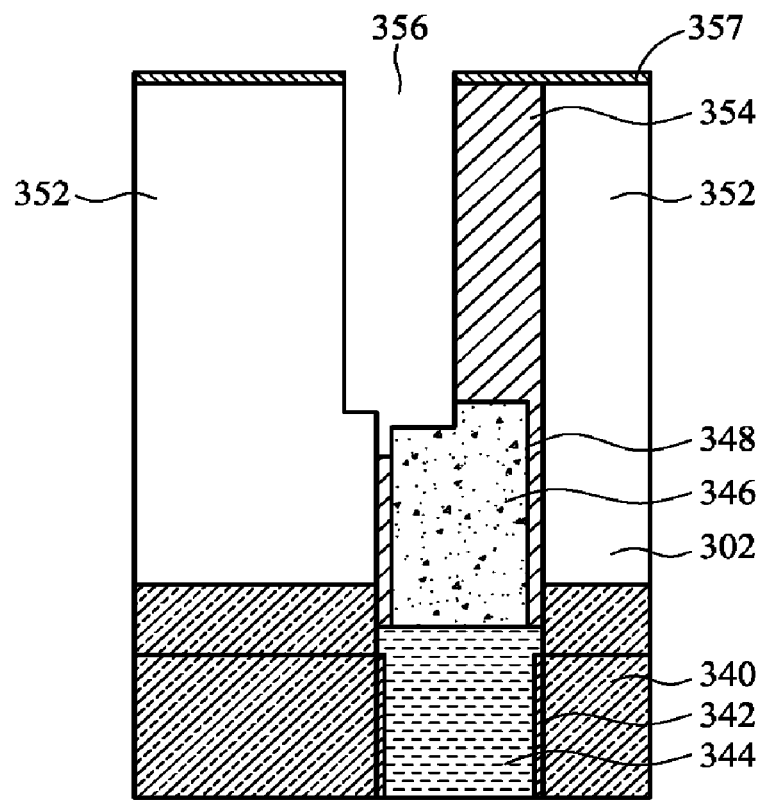
Figure 17C:
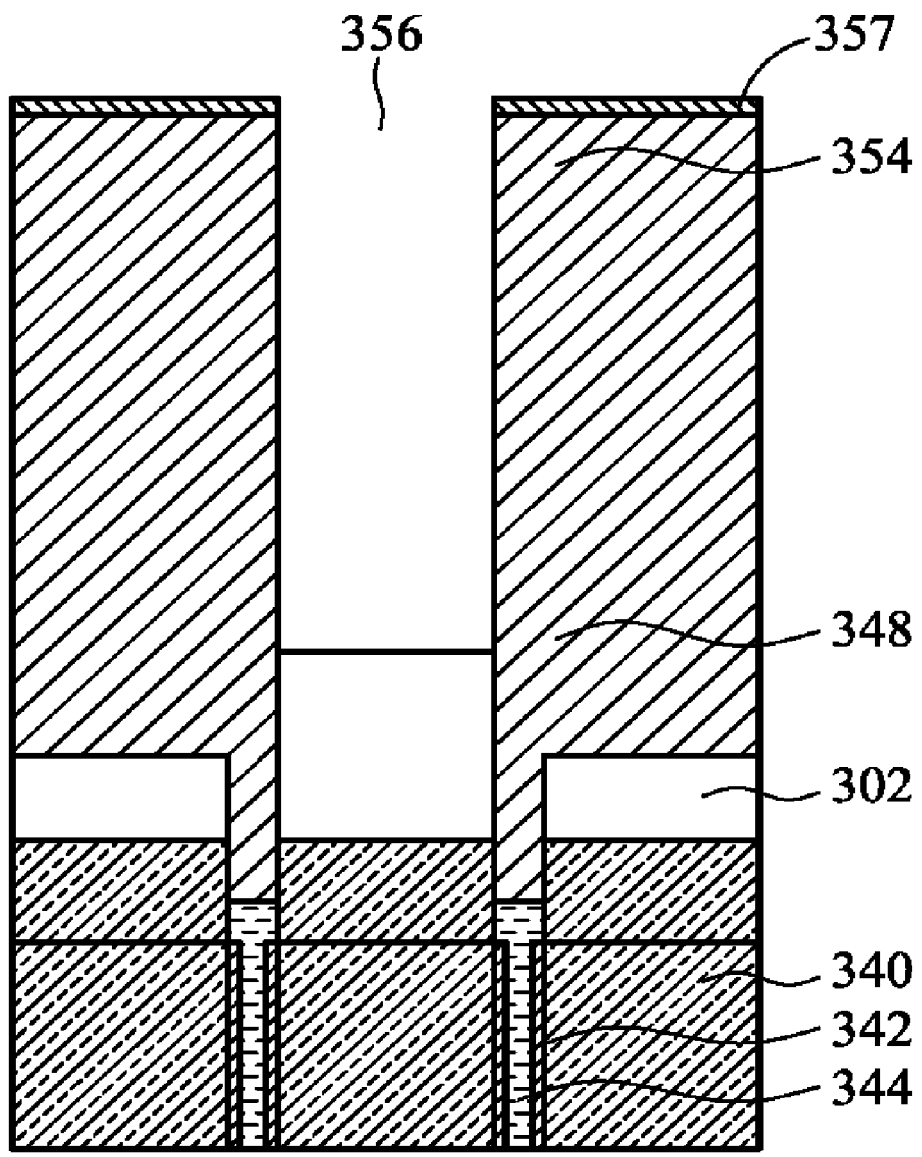

Referring to FIG. 17A, FIG. 17B and FIG. 17C, an oxide dielectric and carbon layer 357 is deposited as a hard mask layer, and a lithography and an etching step is performed thereafter to define a vertical gate opening 356 in the substrate 302 and shallow trench isolation region 354. There are many important features which should be noted herein. First, the depth of the vertical gate opening 356 in FIG. 17B is required to be less than the depth of the shallow trench isolation region 354 in FIG. 17C. Second, the profile of the vertical gate opening 356 is required to be within the deep trench capacitor and cannot connect to other unit cells. Third, the overlapped area of the vertical gate opening 356 and the second polysilicon layer 346 defines the contact resistance of the second polysilicon layer 346 and the third polysilicon layer 358. The greater the overlapped area is, the less the contact resistance. On the contrary, the smaller the overlapped area is, the greater the contact resistance. Fourth, the length of the overlapped area of the vertical gate opening 356 and the active area 352 of the silicon substrate defines the width of an active word line area of a unit cell formed in subsequent steps.

Figure 18A:
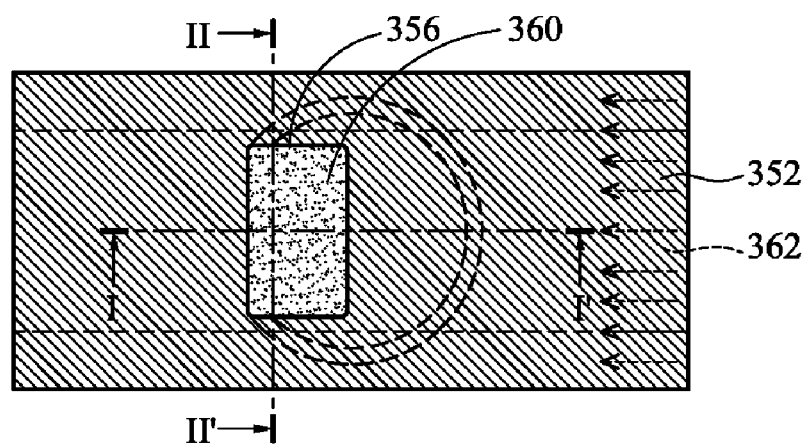
Figure 18B:
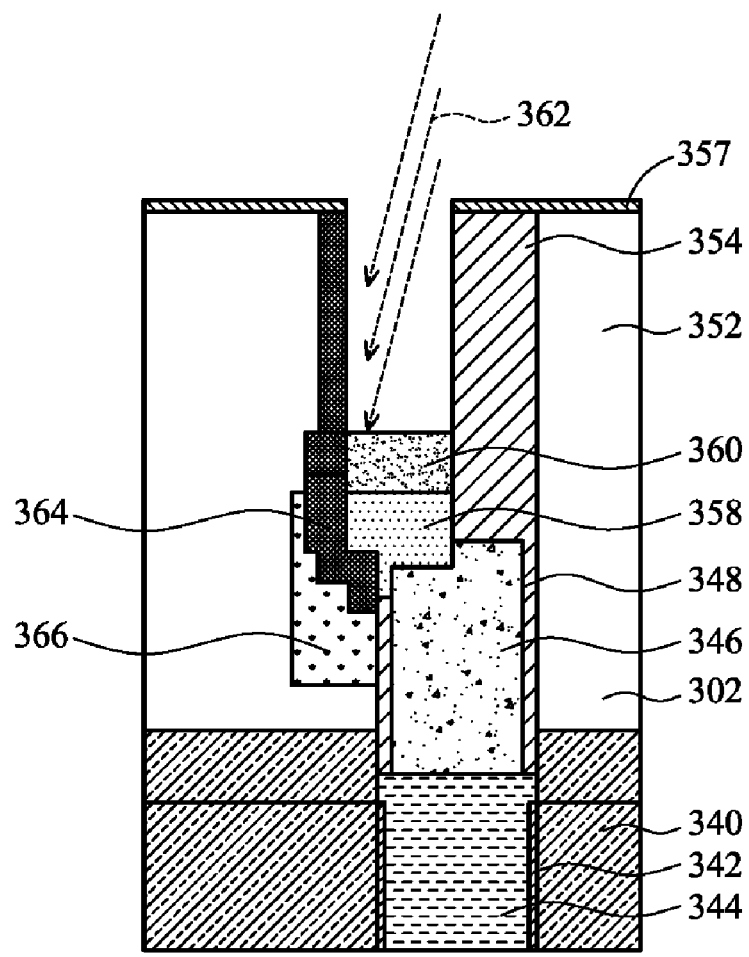
Figure 18C:
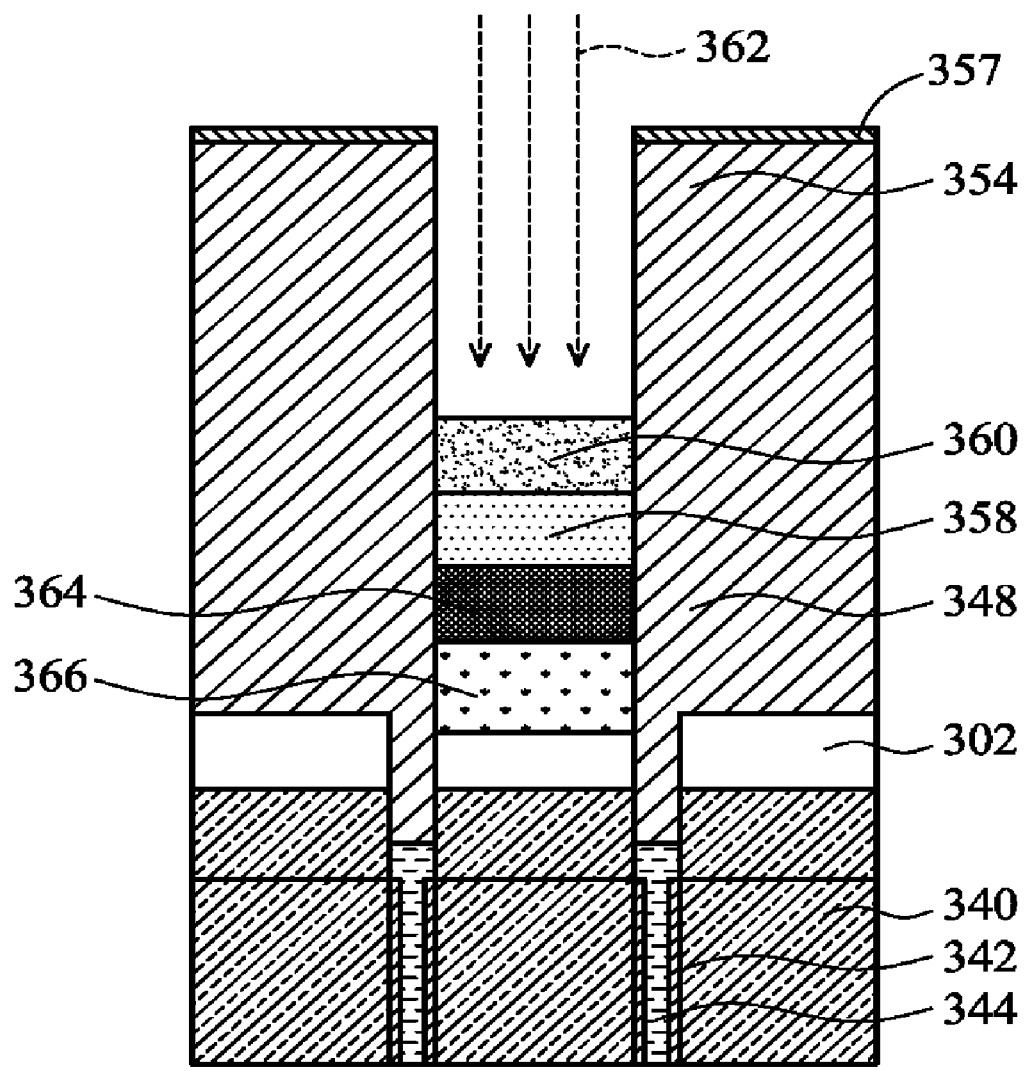

Referring to FIG. 18A, FIG. 18B and FIG. 18C, a second tilt-angle implant 362 process is performed, and a depositing and etching back process is performed thereafter to form a third polysilicon layer 358 on the second polysilicon layer 346 in the vertical gate opening 356. Next, another tilt-angle implant process is performed to adjust electrical characteristics of the vertical gate. A second spacer layer 360, such as silicon nitride or silicon oxide, is formed on the third polysilicon layer 358 in the vertical gate opening 356. A source/drain region 364 is formed on the sidewall of the silicon substrate in the vertical gate opening 356. Referring to FIG. 18B and FIG. 18C, the embodiment can further perform another tile-implantation process before performing the second tile-implanting 362 process to form an isolating doping region 366 in the substrate 302 for isolating the leakage current under the bottom of the shallow trench isolation.

Figure 19A:
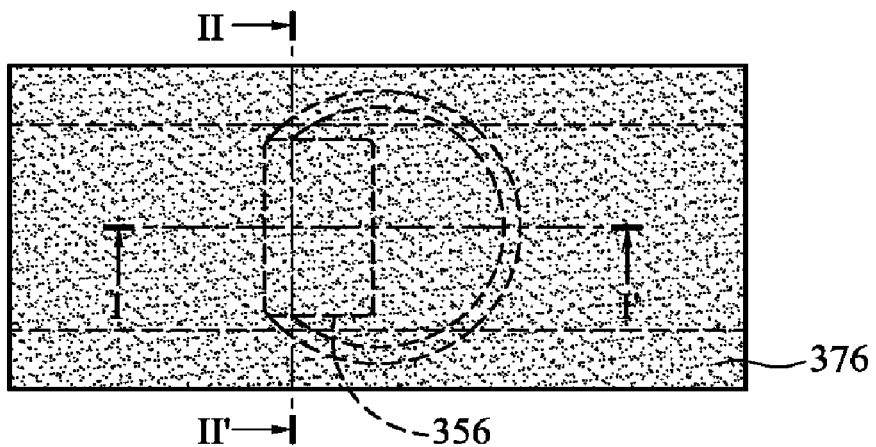
Figure 19B:
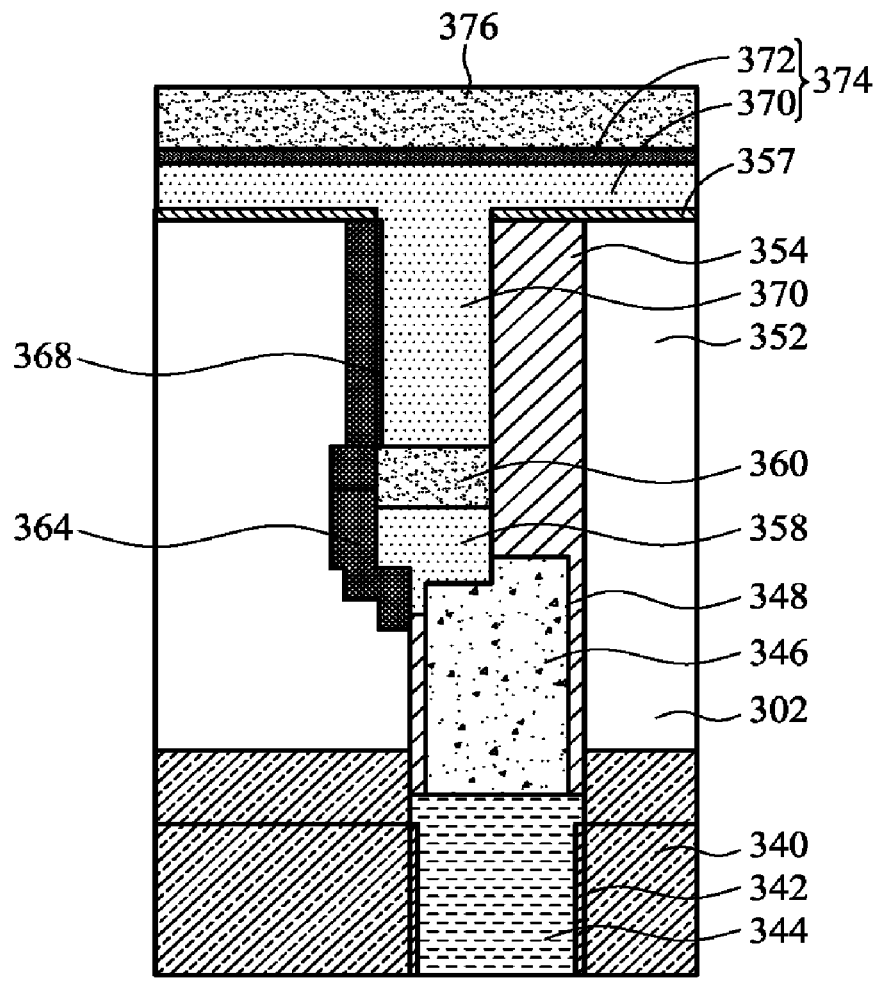
Figure 19C:
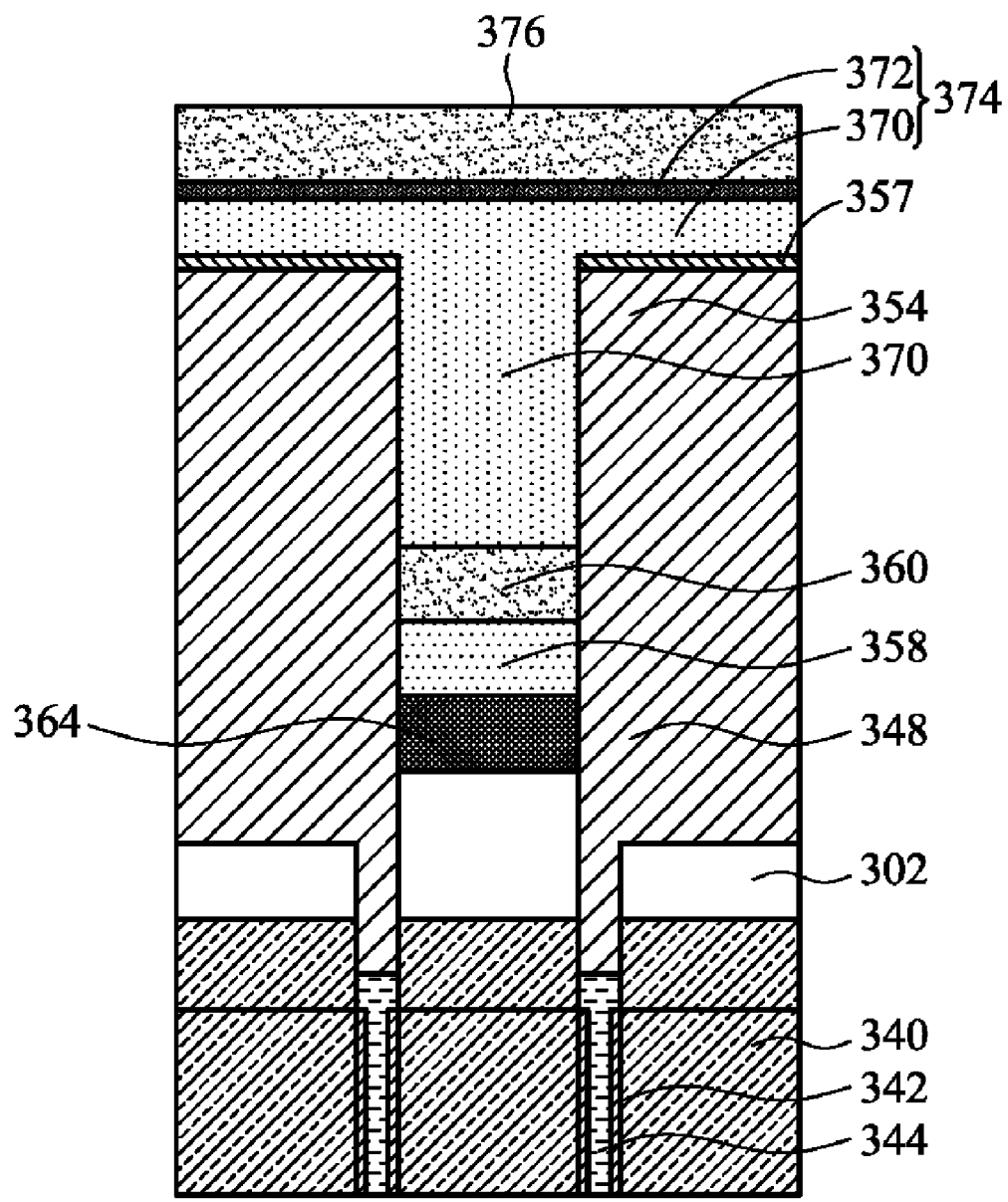
Figure 20A:
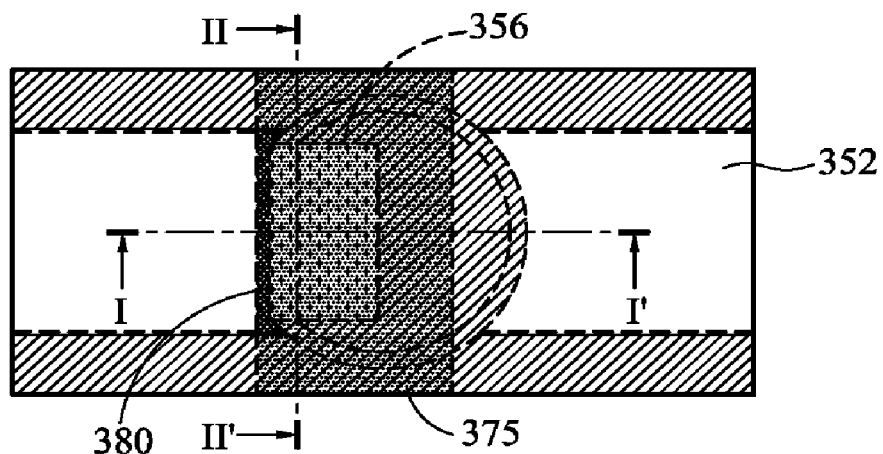
Figure 20B:
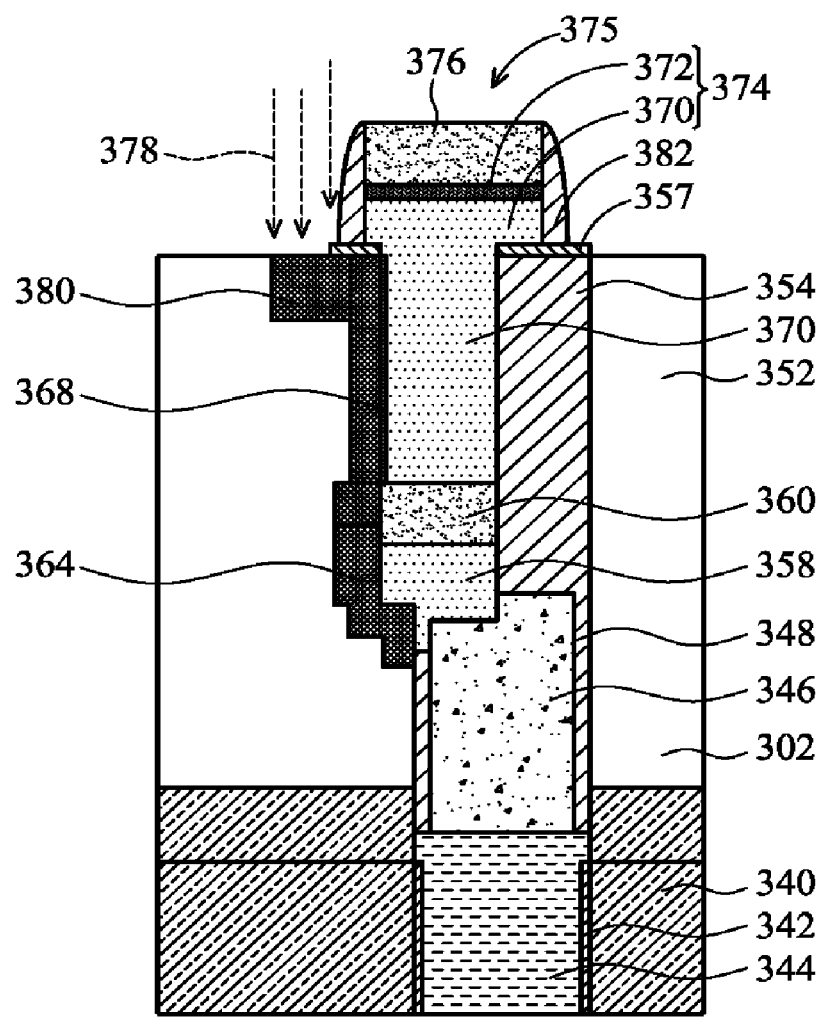
Figure 20C:
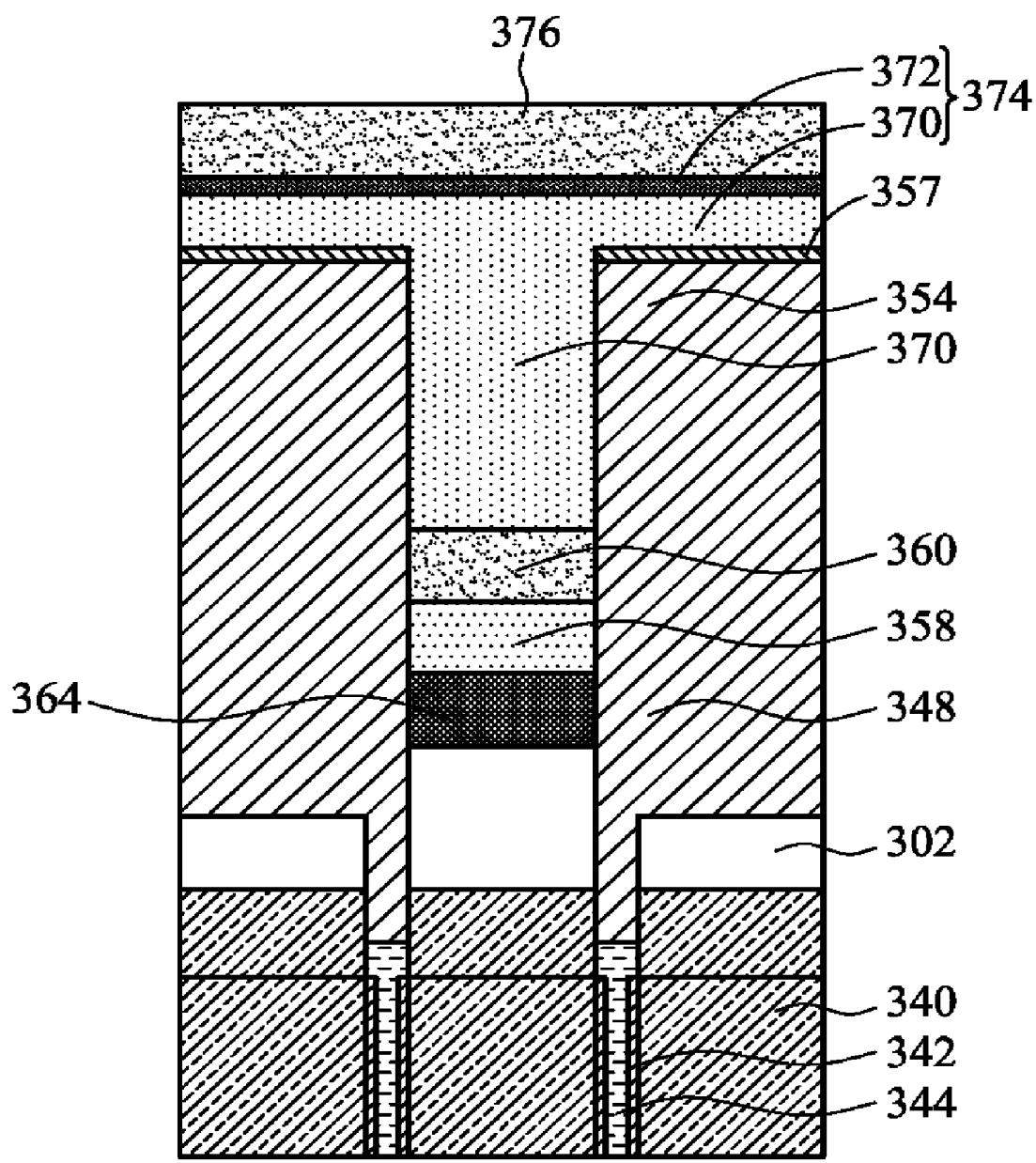
Figure 21A:
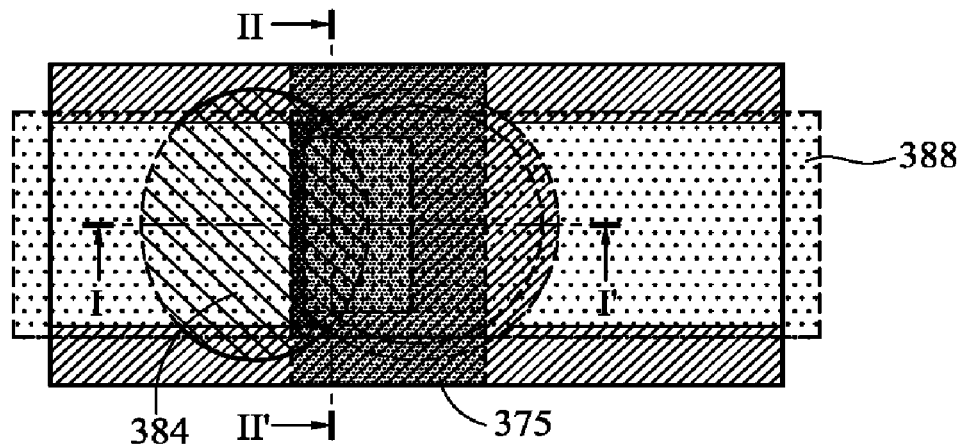
Figure 21B:
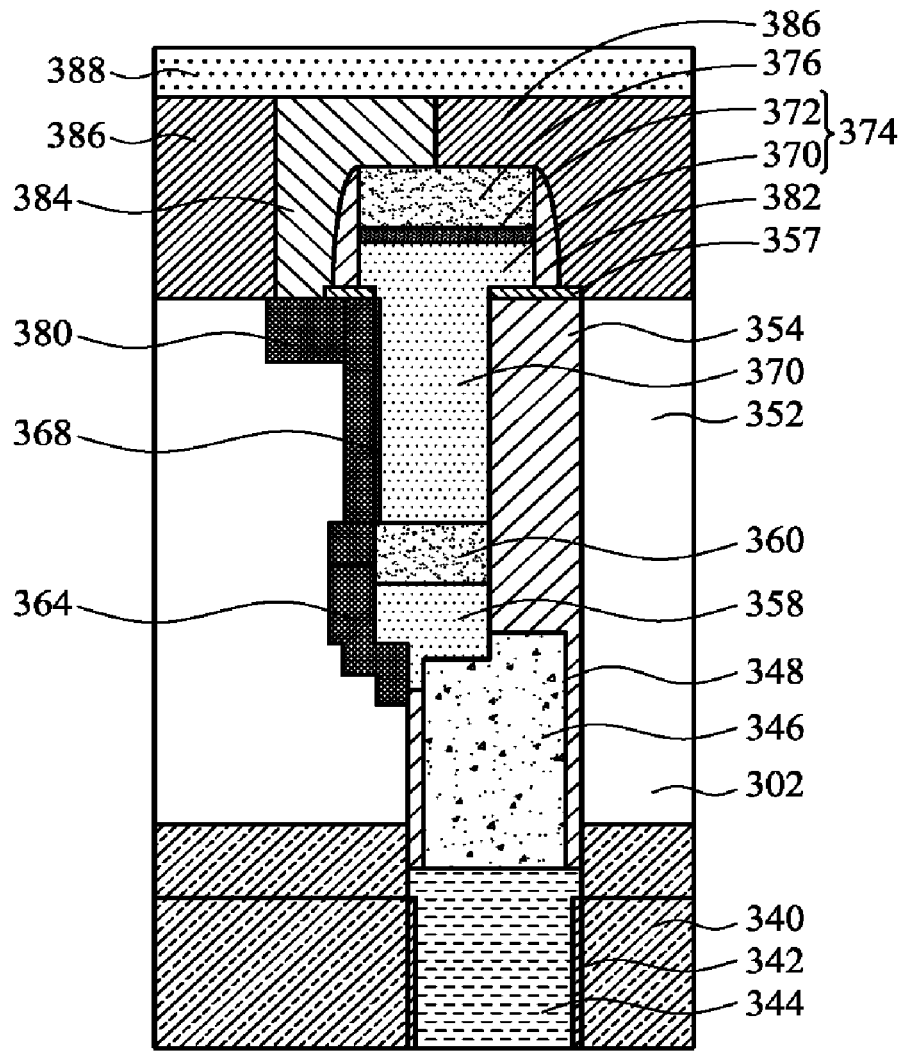
Figure 21C:
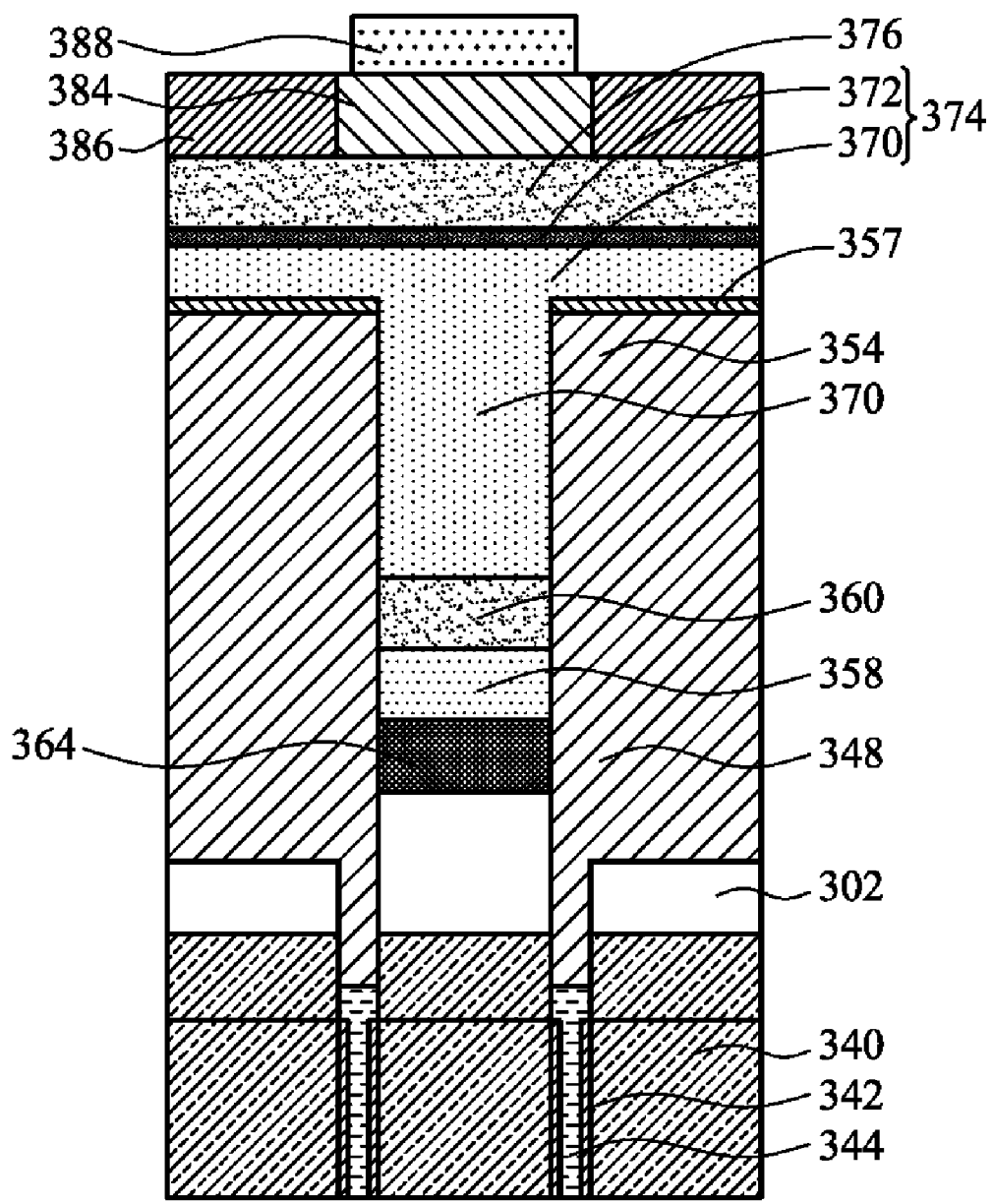

Referring to FIG. 19A, FIG. 19B and FIG. 19C, a gate oxide 368 is formed on the sidewall of the silicon substrate over the second spacer layer 360 in the vertical gate opening 356, and the length of the gate oxide layer 368 is defined as being the same as the length of the active word line area. Next, a gate polysilicon layer 370 and a gate metal layer 372 are sequentially deposited. In the embodiment, the combination of the gate polysilicon layer 370 and the gate metal layer 372 is refereed to as a gate layer 374. Thereafter, a cap layer 376, such as silicon nitride, is deposited on the gate layer 374. Referring to FIG. 20A, FIG. 20B and FIG. 20C, a lithography process and an etching process are performed to pattern the gate layer 374 and the cap layer 376. A spacer 382, such as silicon nitride or silicon oxide spacer, is formed on the sidewall of the patterned gate layer 374 and the cap layer 376. Note that the patterned gate layer 374 and the cap layer 376 and the spacer 382 exceeding the surface of the active area 352 constitute the word line 375 of the embodiment. Next, an implantation process 378 is performed to form another source/drain region 380 of the vertical gate. Referring to FIG. 21A, FIG. 21B and FIG. 21C, an interconnect dielectric layer 386, for example comprising BPSG, is formed on the word line 375 and the substrate 302. Next, the interconnect dielectric layer 386 is patterned to form an opening, and a conductive material is filled into the opening to form a bit line contact 384. Thereafter, a bit line 388 crossing the word line 375 and connecting the bit line contact 384 is formed.

Figure 22A:
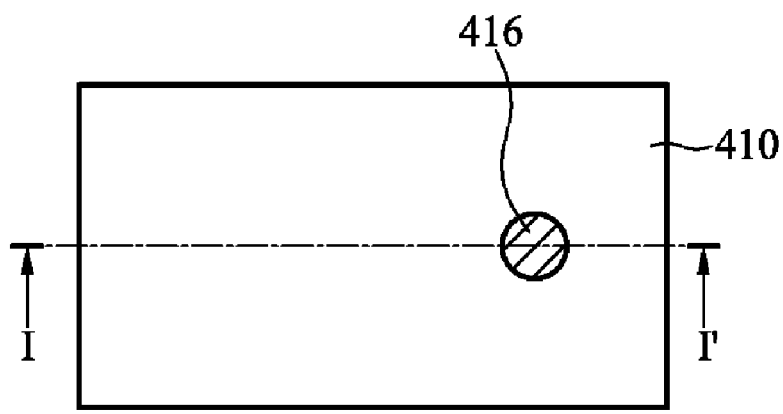
FIG. 22A~FIG. 30B show a method for forming a stacked capacitor memory device of an embodiment of the invention.
Figure 22B:
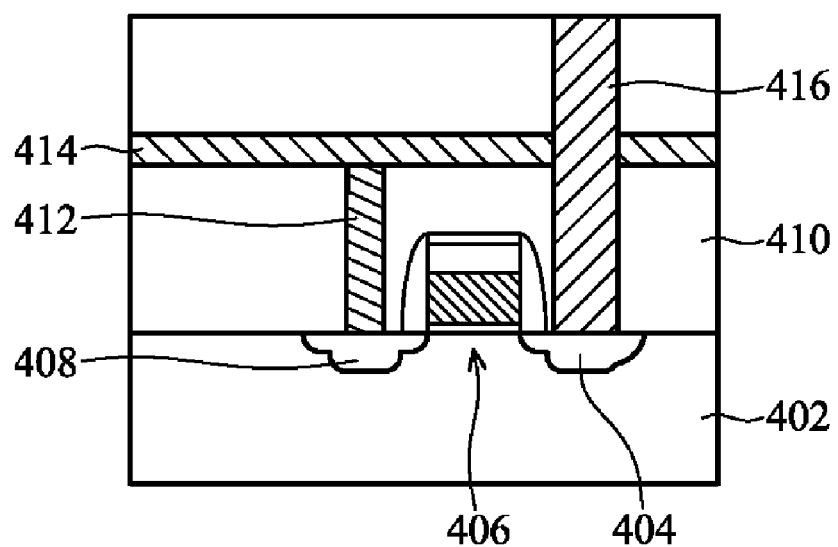

The technology of the invention can be applied not only in a deep trench capacitor memory device, but also a stacked capacitor memory device. A method for forming a stacked capacitor memory device of an embodiment of the invention is illustrated in accordance with FIG. 22A~FIG. 30B. First, referring to FIG. 22A and FIG. 22B, wherein FIG. 22A shows the local plan view of the intermediate process step for forming the stacked capacitor memory device of the embodiment and FIG. 22B shows a cross section along line I-I' of FIG. 22A, a substrate 402 is provided, a word line 406 (gate line) is formed on the substrate 402 and drain/source region 404/408 are formed in the substrate 402. A dielectric layer 410 is formed on the word line 406 and the substrate 402, and a bit line 414 and a bit line contact 412 electrically connecting the bit line 414 and the drain/source region 408 are formed in the dielectric layer 410. The dielectric layer 410 is patterned by a lithography and etching process to form an opening (not shown), and the opening is filled with conductive material thereafter, such as tungsten, to form a conductive contact 416 connecting to the drain/source region 404. Note that the following steps use the technique as illustrated in FIG. 4A~FIG. 11C.

Figure 23A:
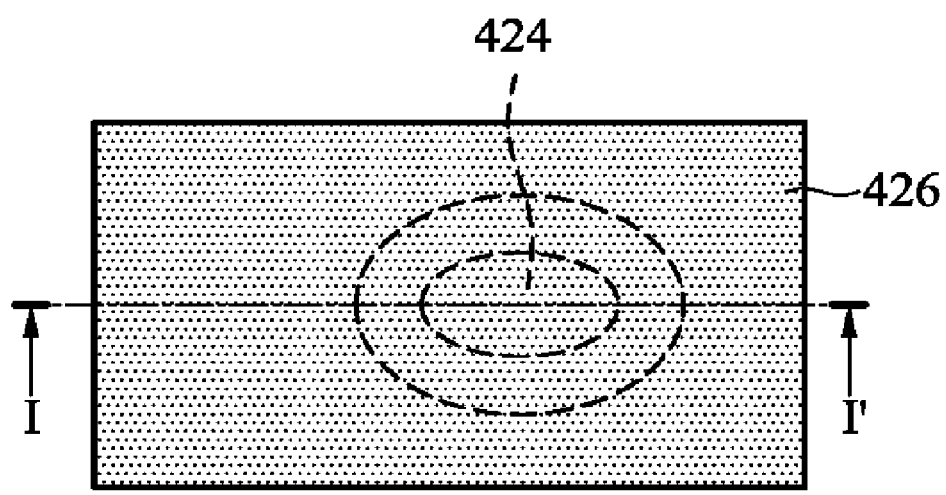
Figure 23B:
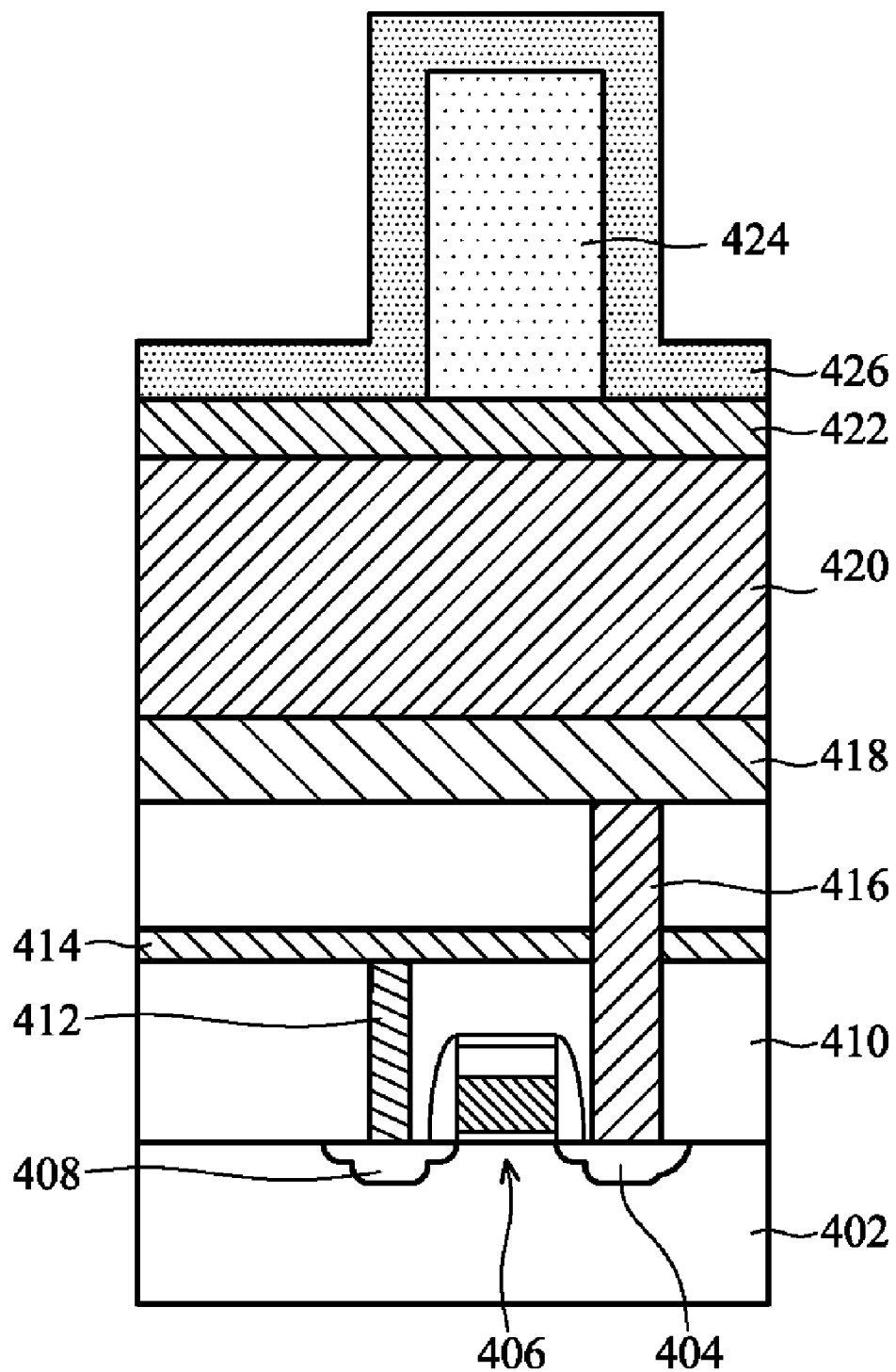

Referring to FIG. 23A and FIG. 23B, a pad layer 418, a oxide layer 420, a carbon layer 422 and a first sacrificial layer (not shown) are sequentially formed on the dielectric layer 410 and the conductive contact 416. In the embodiment, the pad layer 418 can be stack of silicon nitride and silicon oxide, the oxide layer 420 can be $SiO_2$, BSG, PSG or BPSG, and the first sacrificial layer can be silicon nitride. Next, the first sacrificial layer is patterned to form a pillar structure 424, and an undoped polysilicon layer 426 is then conformally deposited on the pillar structure 424 and the carbon layer 422.

Figure 24A:
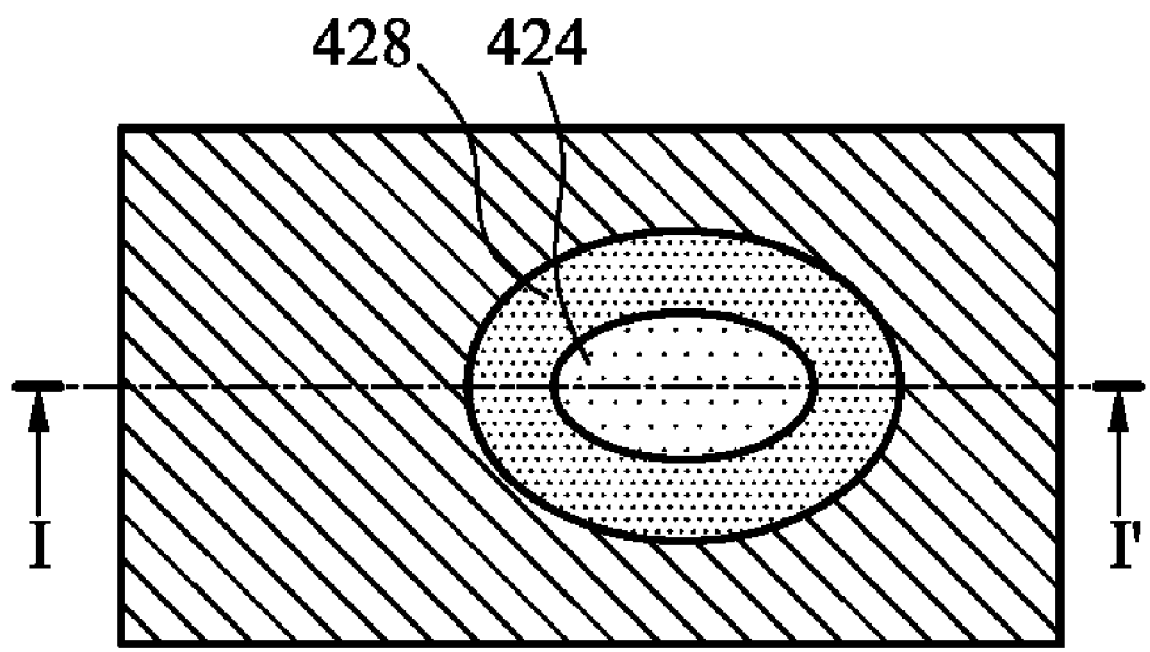
Figure 24B:
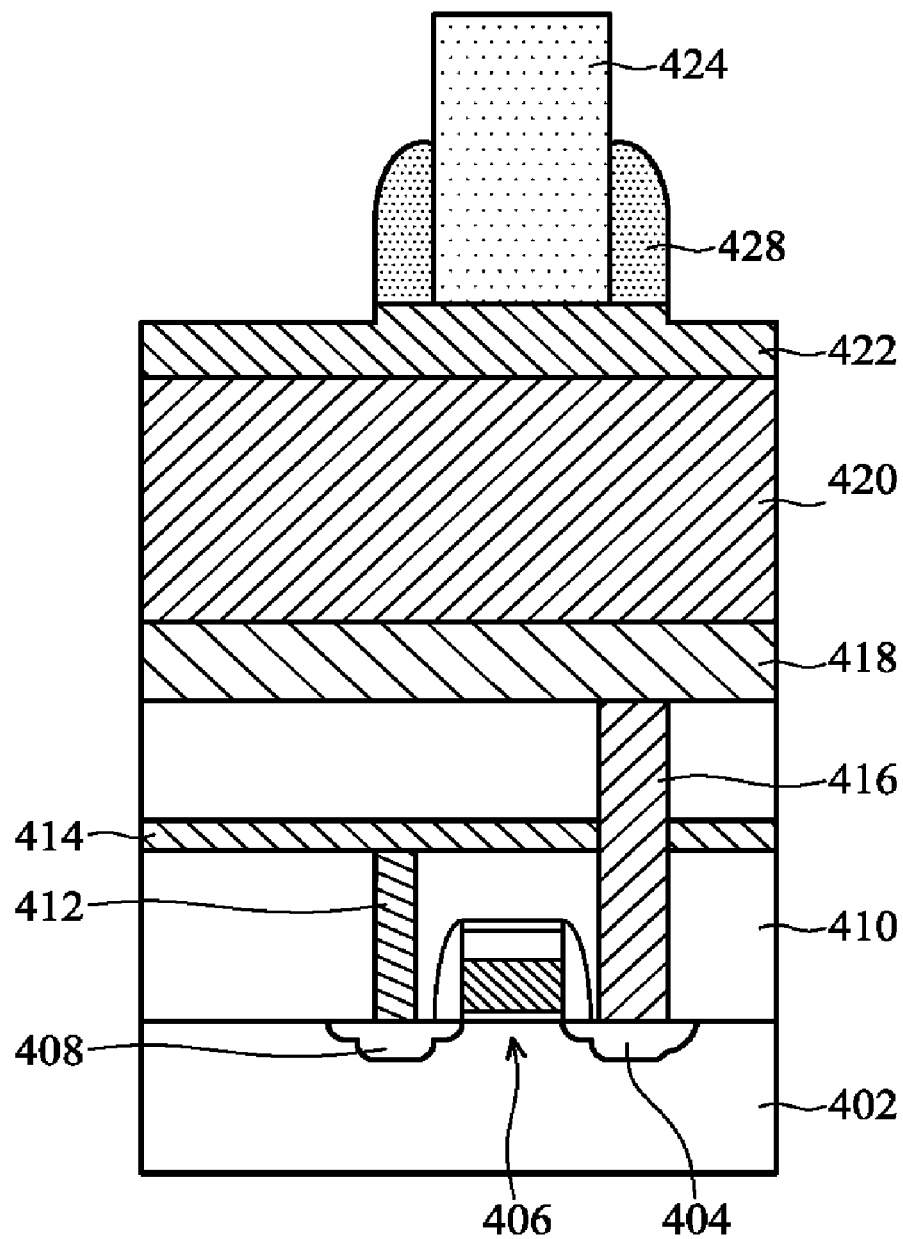
Figure 25A:
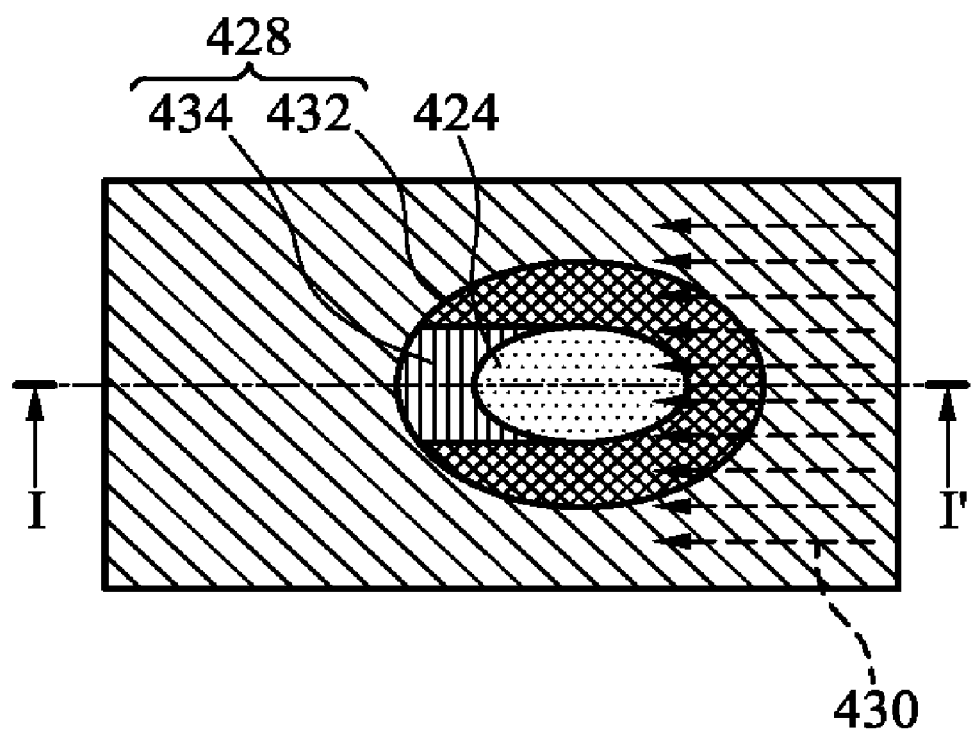
Figure 25B:
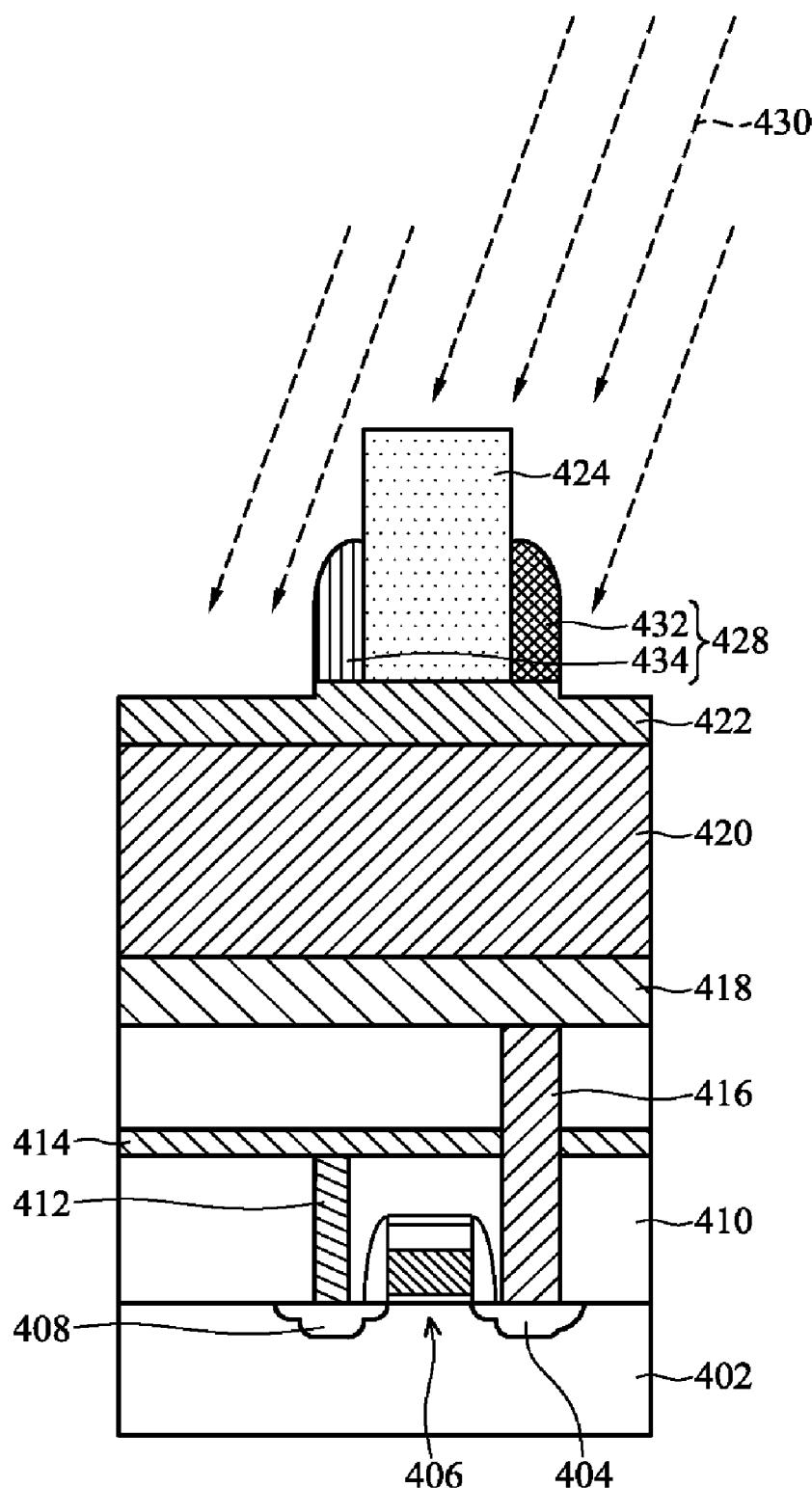

Referring to FIG. 24A and FIG. 24B, the undoped polysilicon layer 426 is anisotropically etched to form a ring-shaped spacer 428 surrounding the pillar structure 424. Referring to FIG. 25A and FIG. 25B, an implant process 430 with a tilt-angle implantation process is performed by doping $BF_2$ into the ring-shaped spacer 428, wherein a portion of the ring-shaped spacer 428 is not doped because some dopants are interrupted by the pillar structure 424. Therefore, as shown in FIG. 25A and FIG. 25B, the ring-shaped spacer 428 comprises a C-shaped doping portion 432 and an undoped portion 434.

Figure 26A:
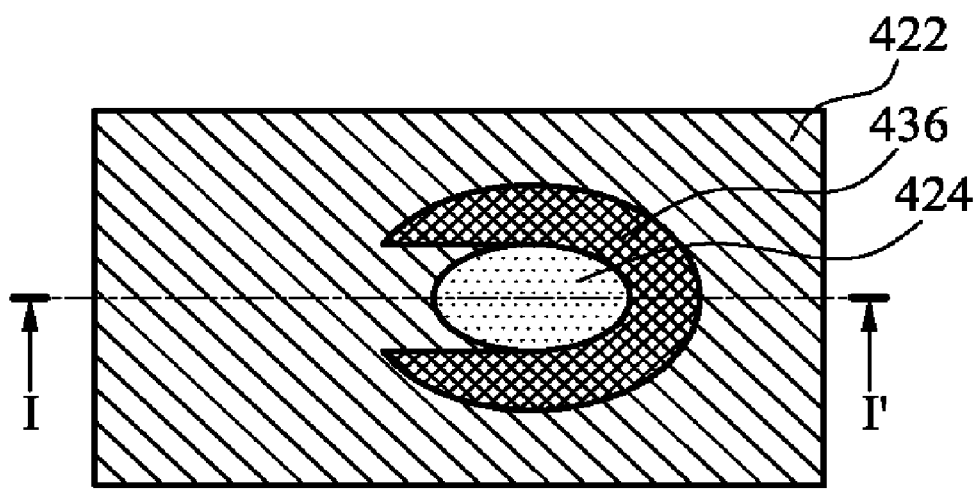
Figure 26B:
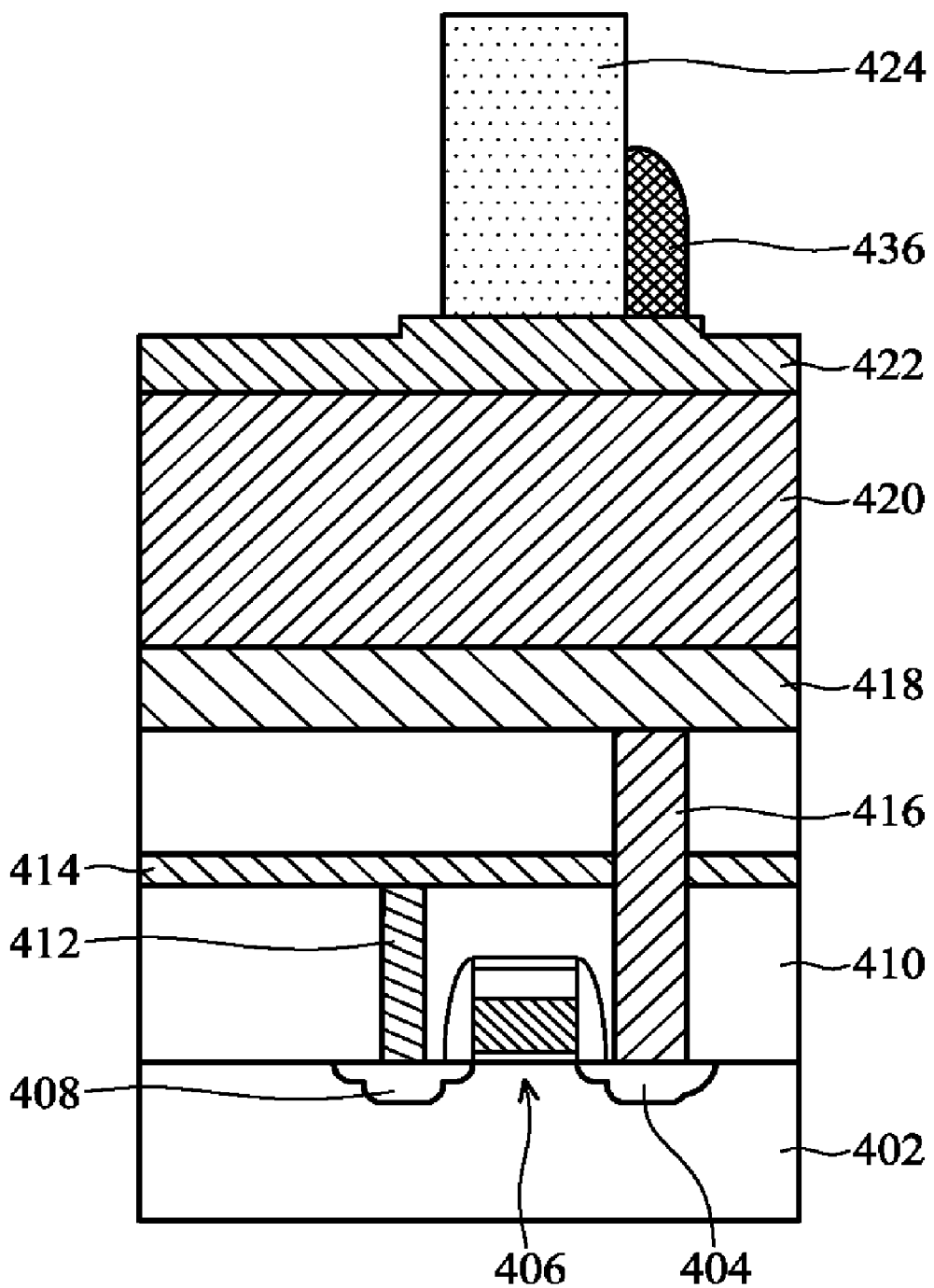
Figure 27A:
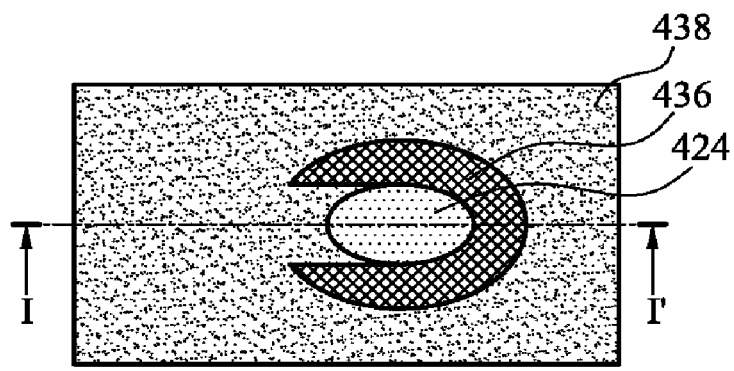
Figure 27B:
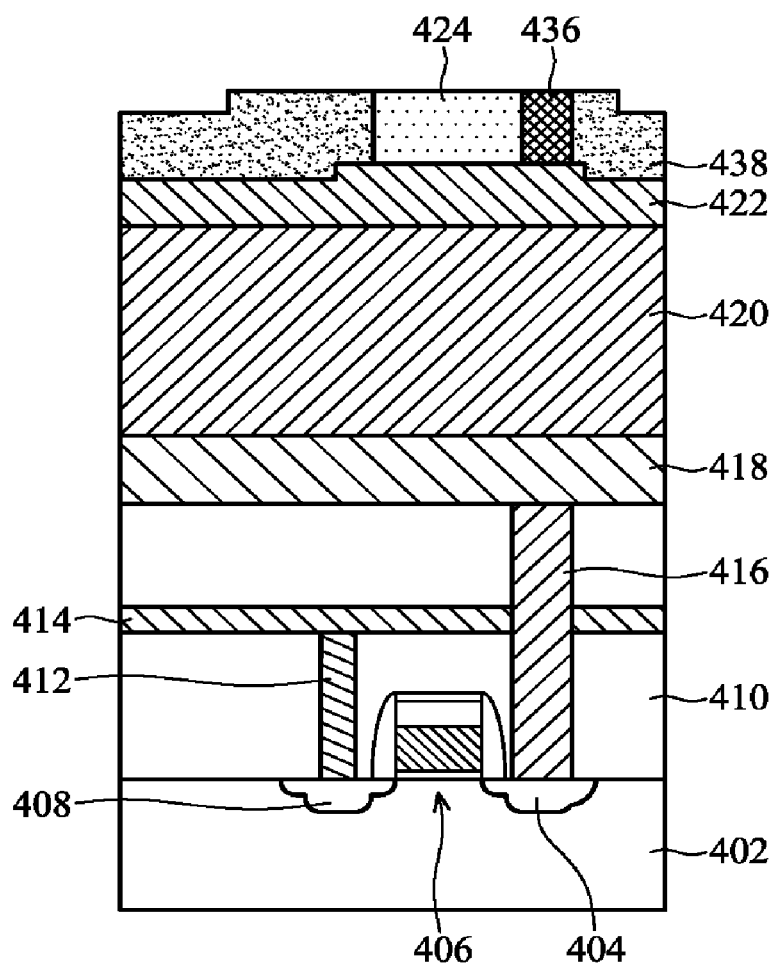
Figure 28A:
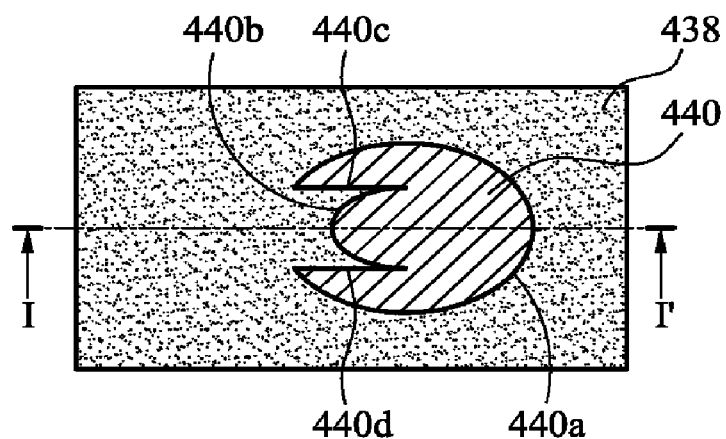
Figure 28B:
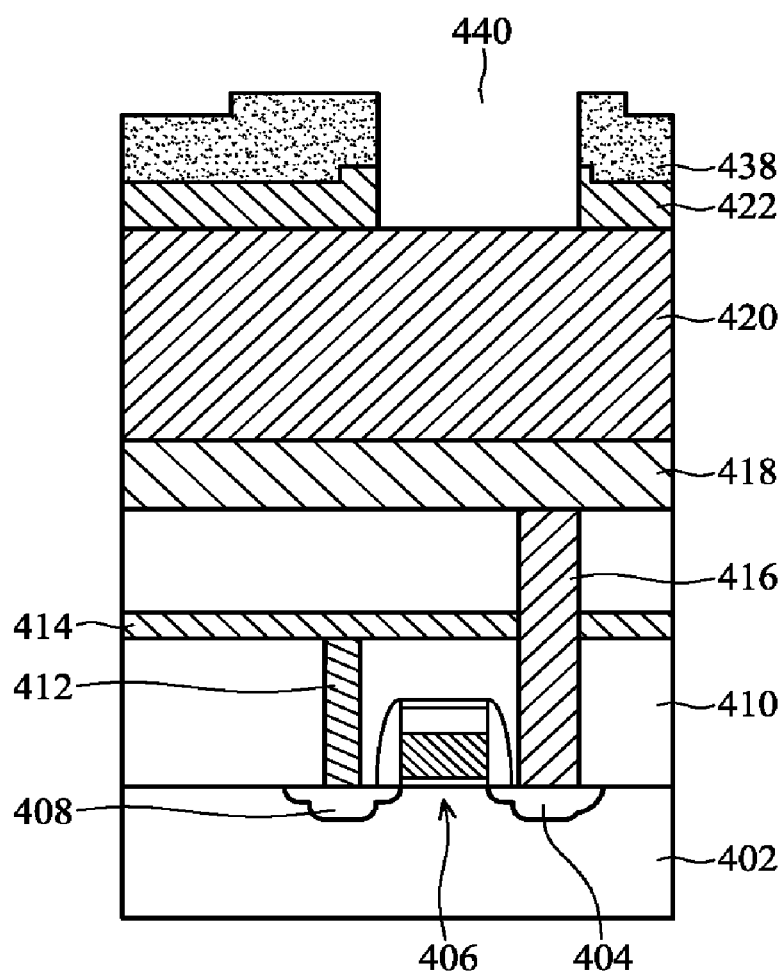
Figure 29A:
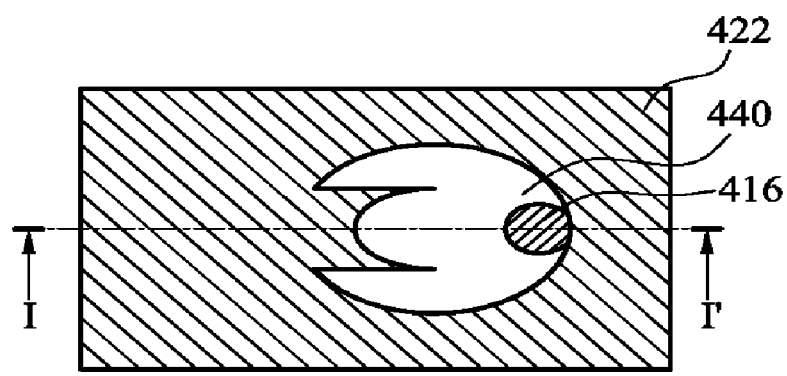
Figure 29B:
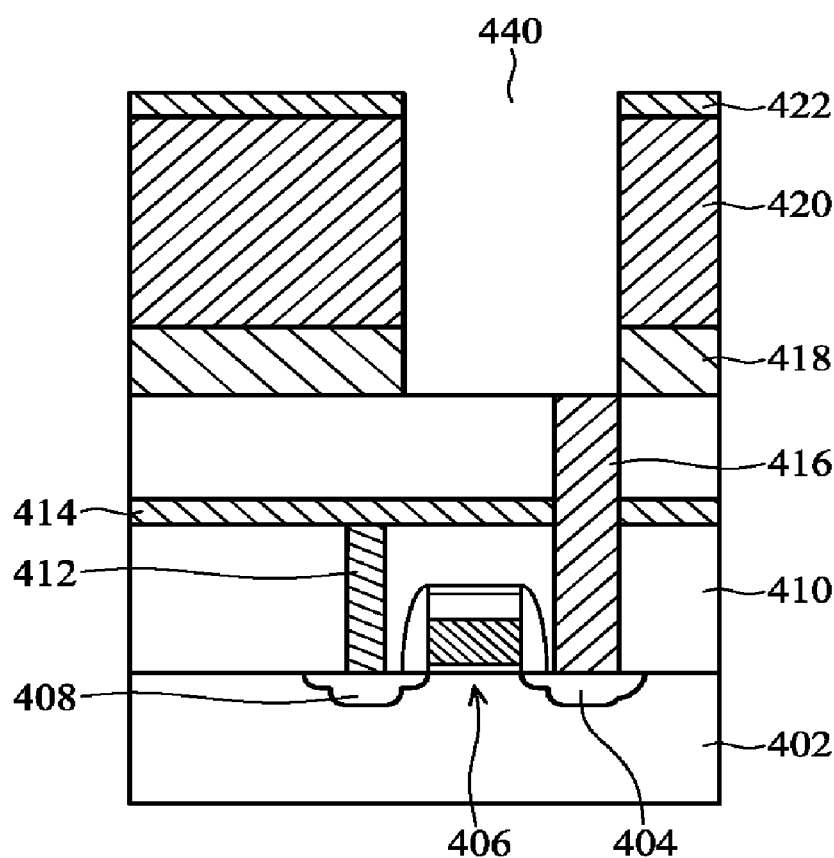
Figure 30A:
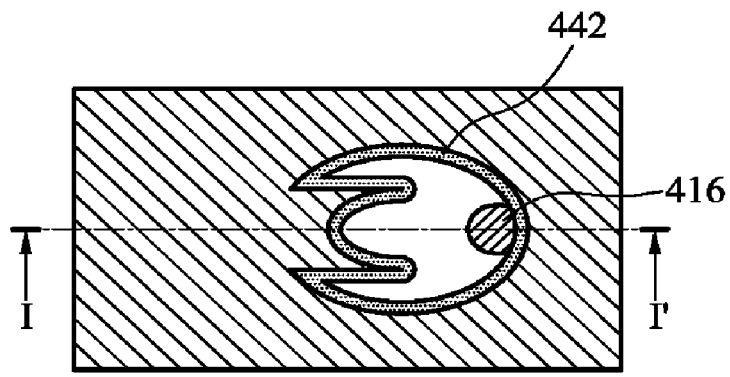
Figure 30B:
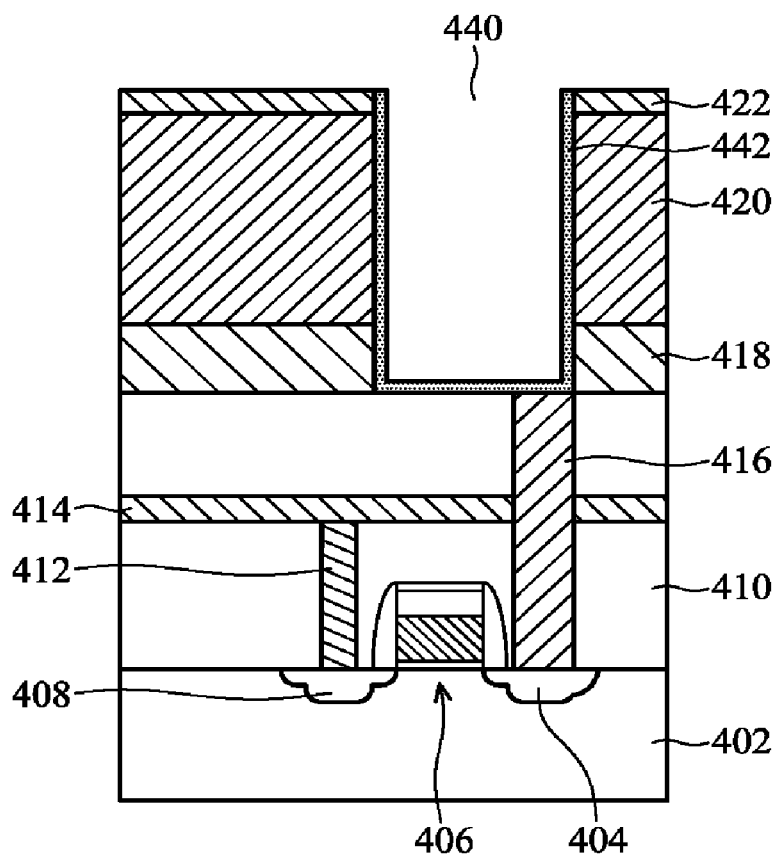

Referring to FIG. 26A and FIG. 26B, an etching process using $NH_4OH$ as a primary etchant is performed and it is noted that the step of doping polysilicon with $BF_2$ decreases the etching rate of $NH_4OH$. Therefore, the etching process can selectively remove the undoped portion 434 of the ring-shaped spacer 428 and leave the doped C-shaped doping portion 432 to form a C-shaped spacer 436. Referring to FIG. 27A and FIG. 27B, a second sacrificial layer 438, such as $SiO_2$, BSG, PSG or BPSG, is blanketly deposited to cover the pillar structure 424 and the C-shaped spacer 436, and a chemical mechanical polishing (CMP) process or an etching process is performed thereafter till the C-shaped spacer 436 and the pillar structure 424 are exposed. Referring to FIG. 28A and FIG. 28B, the pillar structure 424 and the C-shaped spacer 436 formed of polysilicon are removed to form an opening 440 in the second sacrificial layer 438. Note that the opening 440 has a specific pattern, which includes a curved outer edge 440a, a curved inner edge 440b having a positive curvature, and a first line 440c and a second line 440d connecting the curved outer edge 440a with the curved inner edge 440b in a direction parallel to the substrate 402 surface. Next, the carbon layer 422 is etched using the second sacrificial layer 438 as a mask to transfer the pattern of the opening 440 to the carbon layer 422. Referring to FIG. 29A and FIG. 29B, the second sacrificial layer 438 is etched and the oxide layer 420 and the pad layer 418 are then etched using the carbon layer 422 as a mask to transfer the pattern of the opening 440 to the oxide layer 420 and the pad layer 418. Referring to FIG. 30A and FIG. 30B, a capacitor 442 is conformally deposited in the opening 440. It is noted that the invention does not limit the position of the capacitor 442, but requires that the bottom layer of the capacitor 442 electrically connects to the conductive contact 416.

The stacked capacitor of the embodiment has a specific pattern at a cross section parallel to a surface of the substrate. Note that the not only does the outer edge of the pattern of the capacitor provide surface area for providing capacitance, but the two straight lines between the outer edge and the inner edge of the capacitor can also provide surface area for providing capacitance. Therefore, the capacitor of embodiments of the invention can provide sufficient surface area to meet requirements of next generation memory devices.

The memory device and fabrication of the embodiments of the invention described have many advantages. First, not only does the outer edge of the pattern of the capacitor provide surface area for providing capacitance, but the two straight lines between the outer edge and the inner edge of the capacitor can also provide surface area for providing capacitance. Second, lithography apparatus with high resolution is not required in the method for forming the memory device of the embodiments of the invention, thus, eliminating additional high costs related to new lithography apparatuses. Third, the invention provides capacitor with specific shape which adds a substantial circular portion at the central portion. Therefore, the invention can eliminate etching and gap filling issues of U.S. application Ser. No. 12/244,393 from high aspect ratio of the c-shaped deep trench. In addition, vertical gates are used in the deep trench capacitor memory devices of an embodiment of invention and unit cells are arranged to present square-shaped figure. Thus, the invention can achieve higher integrity than conventional memory devices using planar gates.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
    a substrate;
    a capacitor having a specific pattern at a cross section parallel to a surface of the substrate, wherein the specific pattern includes a curved outer edge having a negative curvature, a curved inner edge having a positive curvature, and a first line and a second line connecting the curved outer edge with the curved inner edge; and
    a word line coupling the capacitor, wherein the curved outer edge and the curved inner edge have different curvature radius, and the first line and the second line are uncurved straight lines.

2. The memory device as claimed in claim 1, wherein the capacitor is a deep trench capacitor.

3. The memory device as claimed in claim 2, wherein the word line is electrically connected to the capacitor through a source/drain region of an active word line area under the substrate surface and partially overlapped with the capacitor, and the memory device further comprises a plug electrically connecting another source/drain region of the active word line area to a bit line, wherein the bit line is interlaced with the word line.

4. The memory device as claimed in claim 3, wherein the width of the active word line area is defined by the length of the overlay area of a vertical gate region in the substrate and a portion of the substrate comprising an active area, and the length of the active word line area is defined by the length of a gate oxide layer of the vertical gate region in the substrate.

5. The memory device as claimed in claim 4, wherein the vertical gate region is within the deep trench capacitor, and the depth of the vertical gate region is less than a depth of a shallow trench isolation in the substrate.

6. The memory device as claimed in claim 2, wherein not only does the curved outer edge having a negative curvature of the deep trench capacitor provide a surface area which can be used for capacitance, but the curved inner edge having a positive curvature, the first line and the second line of the deep trench capacitor also provide a surface area used for capacitance.

7. The memory device as claimed in claim 4, wherein the deep trench capacitor comprises a first polysilicon layer, a second polysilicon layer and a third polysilicon layer sequentially formed from a bottom to a top, and the overlapped region of the vertical gate region and the second polysilicon layer define a contact resistance of the second polysilicon layer and third polysilicon layer.

8. The memory device as claimed in claim 2, wherein a unit cell of the memory device is square-shaped.

9. The memory device as claimed in claim 1, wherein the capacitor is a stacked capacitor.

10. The memory device as claimed in claim 9, wherein the stacked capacitor is electrically connected to a source/drain region of an active word line region of the word line through a conductive contact, the conductive contact is formed in a dielectric layer, a stacked layer comprising an opening is disposed on the dielectric layer, the opening includes a curved outer edge, a curved inner edge having a positive curvature, and a first line and a second line connecting the curved outer edge with the curved inner edge, the opening is formed as the stacked capacitor, and the memory device further comprises a plug electrically connecting another source/drain region of the active word line region to a bit line, wherein the bit line is interlaced with the word line.

11. A method for forming a memory device, comprising:
    providing a substrate;
    forming a capacitor in the substrate or over the substrate, wherein the capacitor has a specific pattern at a cross section parallel to a surface of the substrate, which includes a curved outer edge having a negative curvature, a curved inner edge having a positive curvature, and a first line and a second line connecting the curved outer edge with the curved inner edge; and
    forming a word line over the substrate, wherein the curved outer edge and the curved inner edge have different curvature radius, and the first line and the second line are uncurved straight lines.

12. The method for forming a memory device as claimed in claim 11, wherein the capacitor is a deep trench capacitor, and the method of forming the deep trench capacitor comprises:
    patterning the substrate to form a deep trench having the specific pattern; and
    forming the deep trench capacitor in the deep trench,
    wherein the step of patterning the substrate to form the deep trench comprises:
        forming at least one hard mask layer on the substrate;
        forming a pillar structure on the hard mask layer;
        forming a ring-shaped spacer surrounding the pillar structure;
        selectively etching a portion of the ring-shaped spacer to form a C-shaped spacer;
        depositing a sacrificial layer covering the C-shaped spacer, the pillar structure and the hard mask layer;
        etching or polishing the sacrificial layer till the C-shaped spacer and the pillar structure are exposed;
        removing the C-shaped spacer and the pillar structure to transfer the pattern of the opening to the hard mask layer; and
        etching the substrate using the hard mask layer as a mask to form the deep trench with the specific pattern.

13. The method for forming the memory device as claimed in claim 12, wherein the ring-shaped spacer is formed of polysilicon and the step of selectively etching a portion of the ring-shaped spacer to form the C-shaped spacer comprises:
    performing a tilt-angle implantation process to dope a portion of the ring-shaped spacer; and
    performing a selective etching process to remove the undoped portion of the ring-shaped spacer and leave the doped portion of the ring-shaped spacer to constitute the C-shaped spacer.

14. The method for forming a memory device as claimed in claim 13, wherein the tilt-angle implantation process uses BF2 as dopants and the selective etching process uses NH4OH as a primary etchant.

15. The method for forming a memory device as claimed in claim 12, wherein the step of forming the deep trench capacitor in the deep trench comprises: forming a capacitor at a lower portion of the deep trench, wherein the capacitor comprises a first polysilicon layer in the deep trench; forming a collar dielectric layer covering an upper portion of a sidewall of the deep trench; forming a second polysilicon layer on the capacitor in the deep trench; etching a portion of the substrate, the second polysilicon layer and the collar dielectric layer to form a shallow trench; and filling dielectric material into the shallow trench to form a shallow trench isolation.

16. The method for forming a memory device as claimed in claim 15, further comprising forming a vertical gate in the substrate to control the capacitor, which comprises the step of: depositing an oxide dielectric and a carbon layer as a hard mask layer, followed by performing a lithography step to form a vertical gate opening in the substrate, which comprises the step of etching the substrate, the shallow trench isolation, a portion of the second polysilicon layer and the collar dielectric layer to form a vertical gate opening; performing at least one tilt-angle implantation process; forming a third polysilicon layer on the second polysilicon layer in the vertical gate opening; further performing at least one tilt-angle implantation process to adjust electrical parameters of the vertical gate; forming a spacer layer on the third polysilicon layer in the vertical gate opening; forming a gate oxide layer on a sidewall of the substrate over the spacer layer in the vertical gate opening; forming a gate layer on the substrate and in the vertical gate opening; forming a cap layer on the gate layer; and patterning the gate layer and the cap layer.

17. The method for forming a memory device as claimed in claim 16, wherein the depth of the vertical gate opening is less than the depth of the shallow trench isolation region.

18. The method for forming a memory device as claimed in claim 11, wherein the capacitor is a stacked capacitor, and the step of forming the stacked capacitor is subsequent to forming the word line, and the step of forming the stacked capacitor comprises: forming a stacked layer over the word line; patterning the stacked layer to form an opening, wherein the capacitor has the specific pattern; and forming the capacitor in the opening.

19. The method for forming a memory device as claimed in claim 18, wherein the step of patterning the stacked layer to form the opening comprises:
    forming a pillar structure on the stacked layer;
    forming a ring-shaped spacer surrounding the pillar structure;
    selectively etching a portion of the ring-shaped spacer to form a C-shaped spacer;
    depositing a sacrificial layer which covers the C-shaped spacer, the pillar structure and the hard mask layer;
    etching or polishing the sacrificial layer till the C-shaped spacer and pillar structure are exposed; and
    removing the C-shaped spacer and pillar structure to form the opening with the specific pattern in the sacrificial layer.

20. The method for forming a memory device as claimed in claim 19, wherein the ring-shaped spacer is formed of polysilicon, and the step of selectively etching a portion of the ring-shaped spacer to form the C-shaped spacer comprises:
    performing a tilt-implantation process to dope a portion of the ring-shaped spacer; and
    performing an etching process using NH4OH as a primary etchant to remove the undoped portion of the ring-shaped spacer and leave the doped portion of the ring-shaped spacer to constitute the C-shaped spacer.

* * * * *